(12) United States Patent
Kodama et al.

(10) Patent No.: US 7,995,880 B2
(45) Date of Patent: Aug. 9, 2011

(54) OPTICAL PATH CONVERTING MEMBER, MULTILAYER PRINT CIRCUIT BOARD, AND DEVICE FOR OPTICAL COMMUNICATION

(75) Inventors: Hiroaki Kodama, Ibi-gun (JP); Motoo Asai, Ibi-gun (JP); Kazuhito Yamada, Ibi-gun (JP)

(73) Assignee: Ibiden Co., Ltd., Ogaki-shi (JP)

( * ) Notice: Subject to any disclaimer, the term of this patent is extended or adjusted under 35 U.S.C. 154(b) by 0 days.

(21) Appl. No.: 12/855,207

(22) Filed: Aug. 12, 2010

(65) Prior Publication Data

US 2010/0303406 A1 Dec. 2, 2010

Related U.S. Application Data

(60) Continuation of application No. 12/112,026, filed on Apr. 30, 2008, now Pat. No. 7,801,398, which is a division of application No. 11/763,670, filed on Jun. 15, 2007, now Pat. No. 7,764,860.

(51) Int. Cl.
*G02B 6/12* (2006.01)
*G02B 6/42* (2006.01)

(52) U.S. Cl. ......................................... 385/14; 385/88

(58) Field of Classification Search .................... 385/44, 385/88
See application file for complete search history.

(56) References Cited

U.S. PATENT DOCUMENTS

| | | | |
|---|---|---|---|
| 5,805,941 A | 9/1998 | Iyama | |
| 6,348,997 B1 | 2/2002 | Itoh | |
| 6,717,820 B1 | 4/2004 | Loh | |
| 6,741,781 B2 | 5/2004 | Furuyama | |
| 7,070,207 B2 | 7/2006 | Asai | |
| 7,149,376 B2 | 12/2006 | Uchida et al. | |
| 7,437,030 B2 | 10/2008 | Asai et al. | |
| 7,460,747 B2 | 12/2008 | Tanaka et al. | |
| 7,674,987 B2 | 3/2010 | Kodama et al. | |
| 7,693,382 B2 | 4/2010 | Asai | |
| 7,724,989 B2 | 5/2010 | Kodama et al. | |
| 7,729,570 B2 | 6/2010 | Yamada et al. | |
| 7,764,860 B2 | 7/2010 | Kodama et al. | |
| 7,783,141 B2 | 8/2010 | Kodama et al. | |
| 7,801,398 B2 | 9/2010 | Kodama et al. | |
| 2006/0012967 A1* | 1/2006 | Asai et al. | ............... 361/764 |
| 2007/0223935 A1 | 9/2007 | Asai et al. | |
| 2008/0170819 A1 | 7/2008 | Kodama et al. | |
| 2008/0247704 A1 | 10/2008 | Kodama et al. | |
| 2009/0016671 A1 | 1/2009 | Asai et al. | |

(Continued)

FOREIGN PATENT DOCUMENTS

JP 6-273641 9/1994

(Continued)

*Primary Examiner* — Jerry T Rahll
(74) *Attorney, Agent, or Firm* — Oblon, Spivak, McClelland, Maier & Neustadt, L.L.P.

(57) ABSTRACT

A device for optical communication including a conductor circuit and an insulating layer formed and laminated, an optical circuit and an optical path for transmitting an optical signal, and an optical element or a package substrate on which an optical element is mounted. An optical path converting member is disposed at the optical path for transmitting an optical signal so as to transmit an optical signal between the optical element and the optical circuit. The optical path converting member comprises a lens and an optical path conversion mirror having an entrance surface, an exit surface and a reflection surface. The lens is provided at either the entrance surface or the exit surface on the side facing the optical circuit.

21 Claims, 21 Drawing Sheets

U.S. PATENT DOCUMENTS

2010/0135611 A1  6/2010  Asai et al.
2010/0195954 A1  8/2010  Asai et al.

FOREIGN PATENT DOCUMENTS

| JP | 7-159658 | 6/1995 |
|---|---|---|
| JP | 2001-166167 | 6/2001 |
| JP | 2001-166197 | 6/2001 |
| JP | 2002-289911 | 10/2002 |
| JP | 2002-329891 | 11/2002 |
| JP | 2003-14987 | 1/2003 |
| JP | 2004-4427 | 1/2004 |
| JP | 2004-054003 | 2/2004 |
| JP | 2006-178001 | 7/2006 |

* cited by examiner

Fig. 3F-1
Fig. 3F-2
Fig. 3G-1
Fig. 3G-2
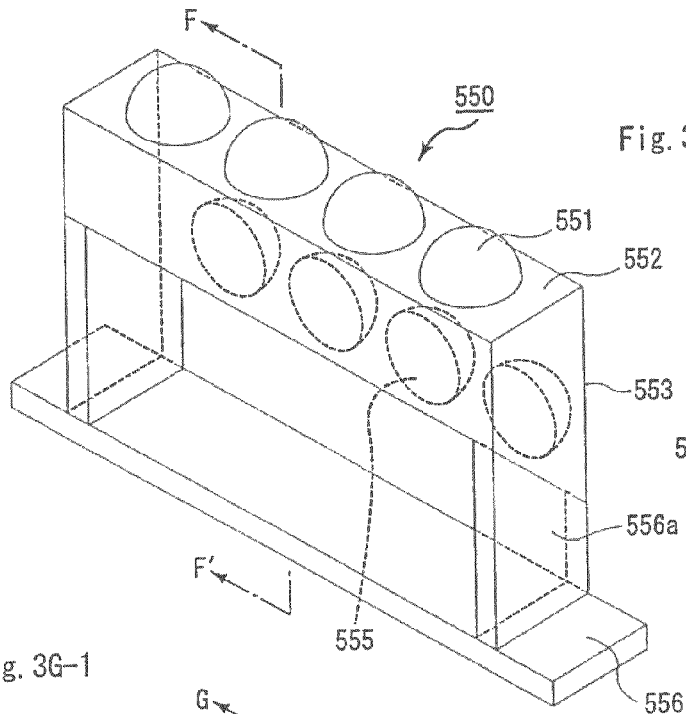
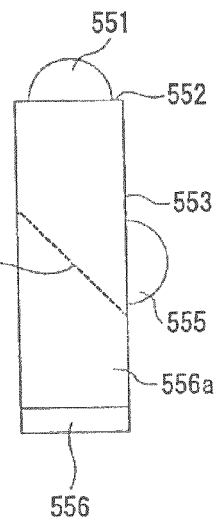
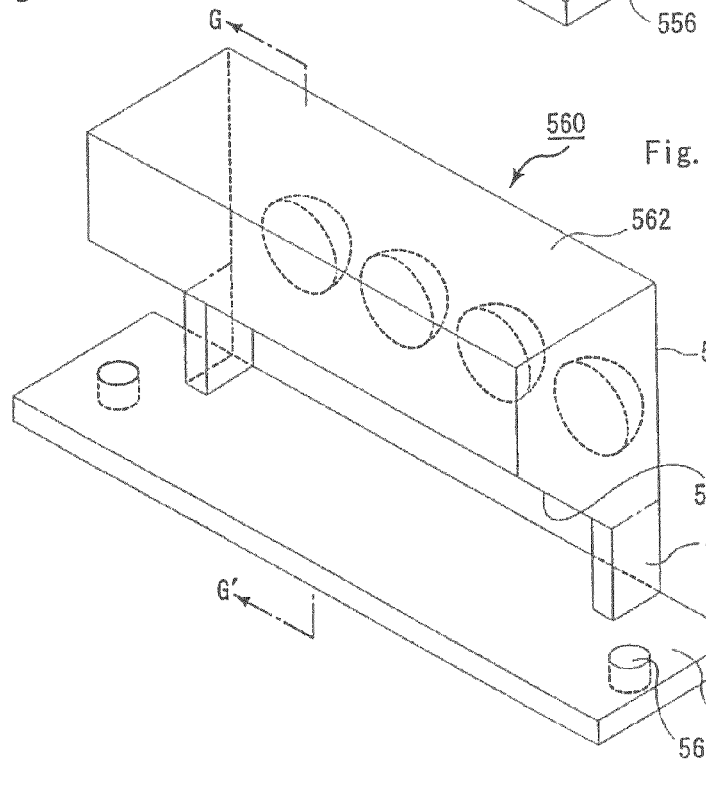
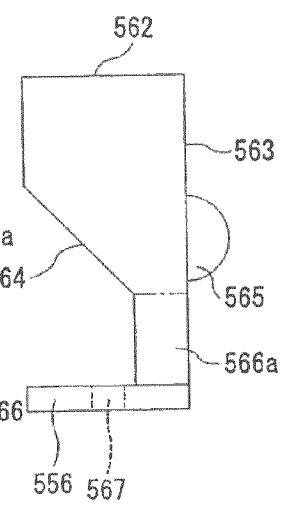

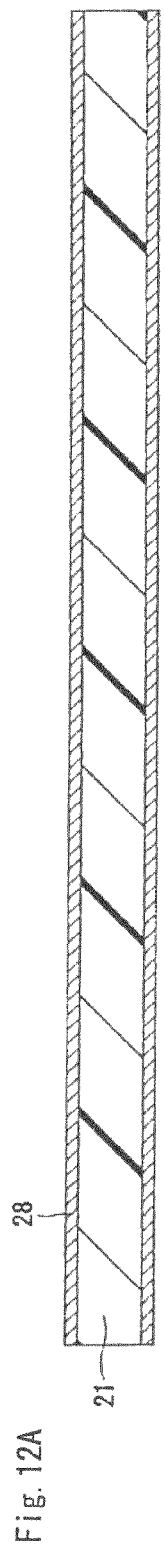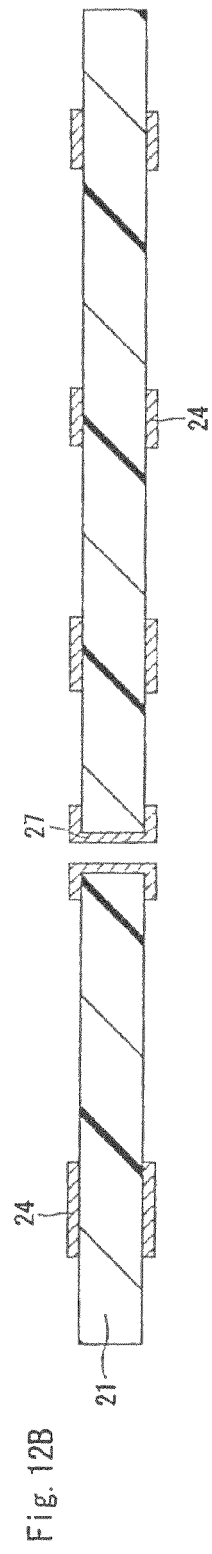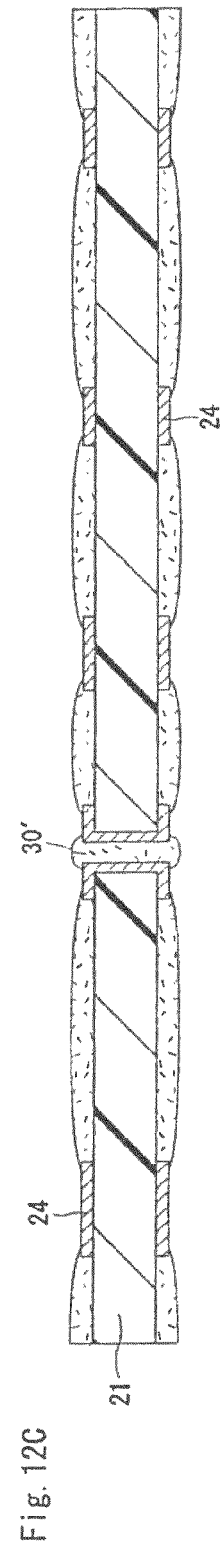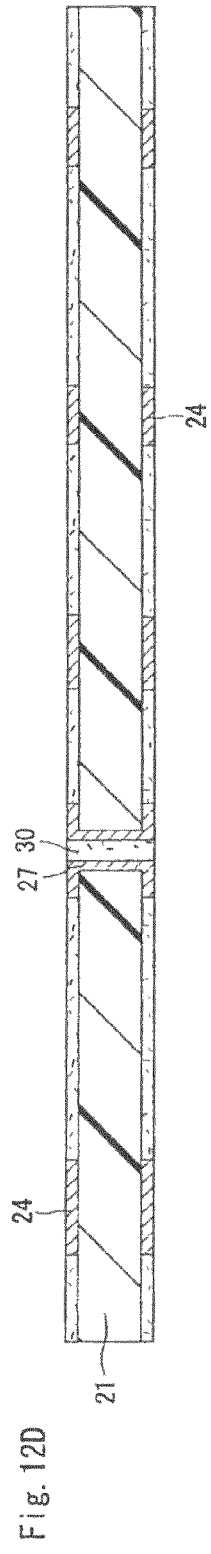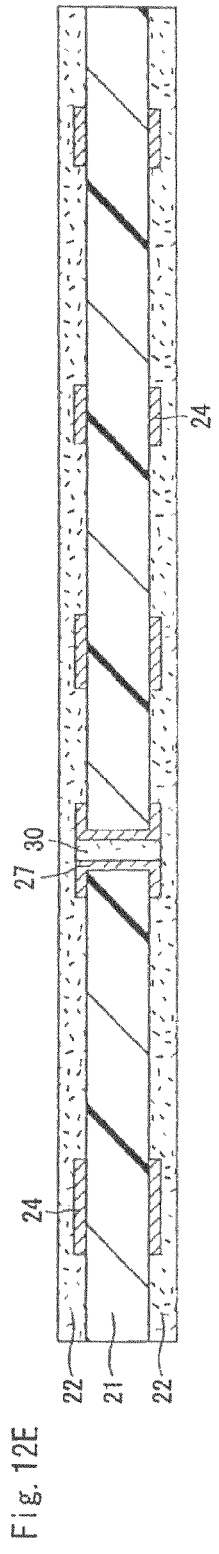

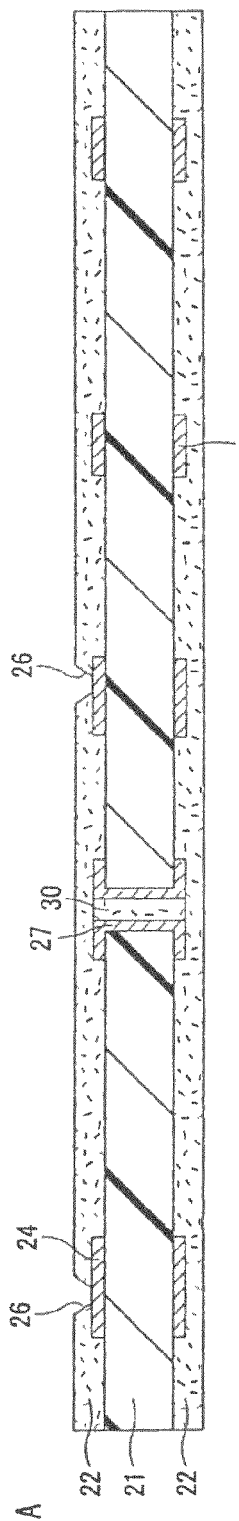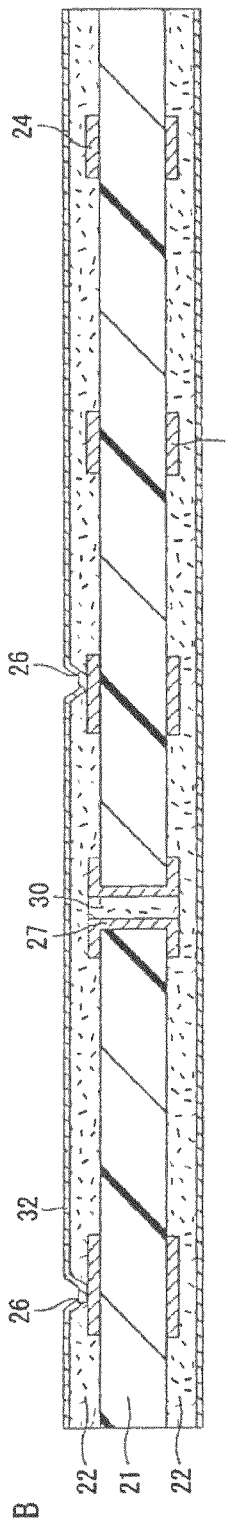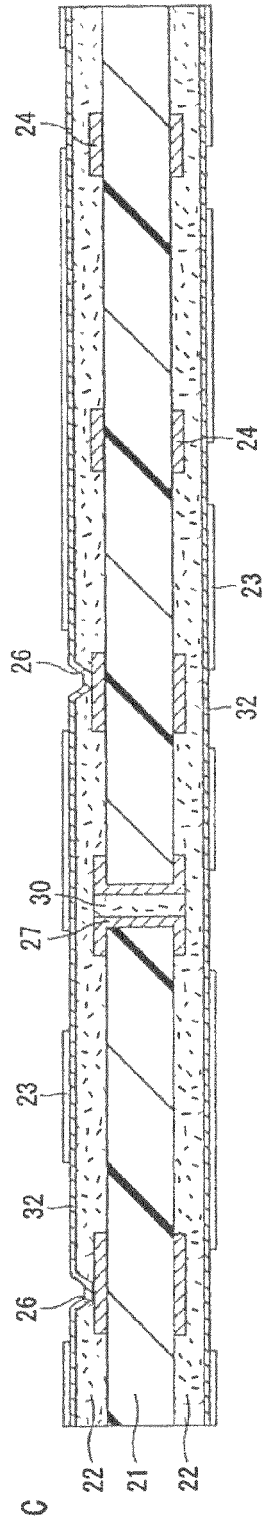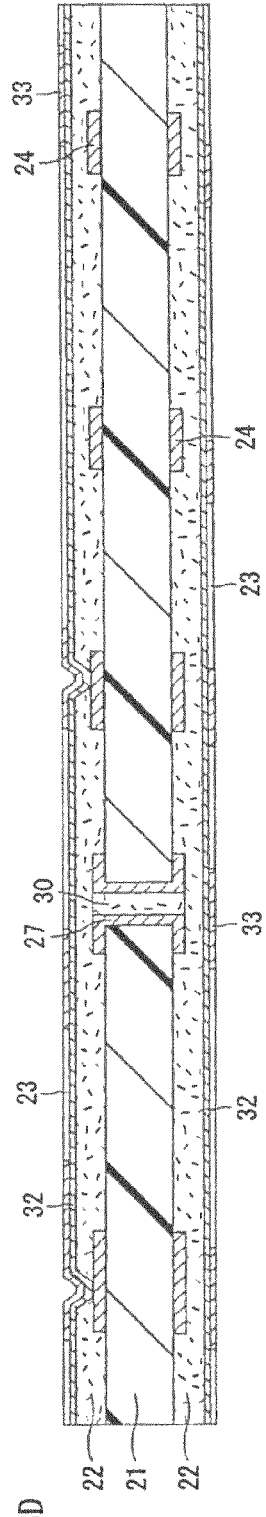

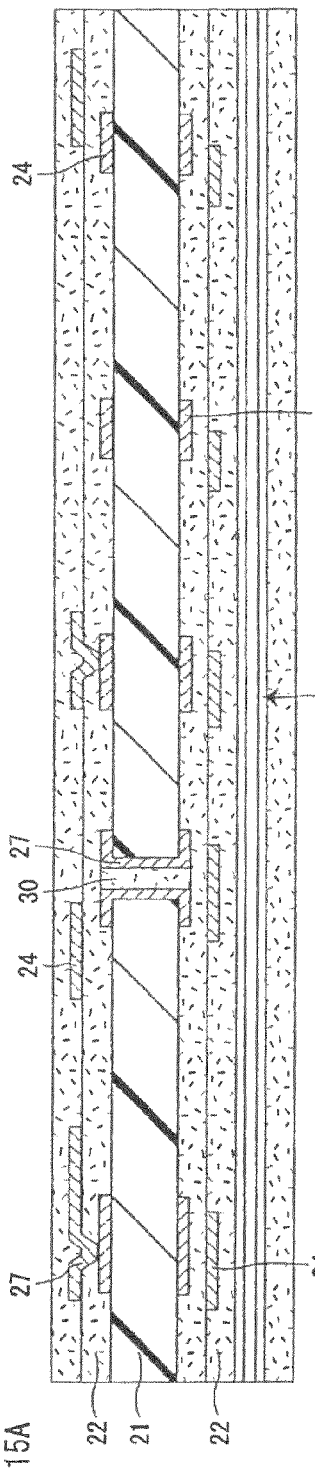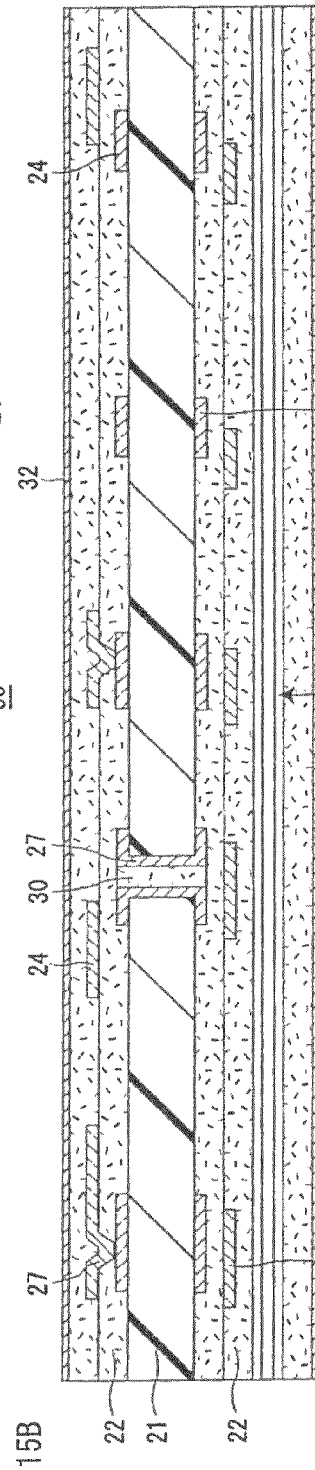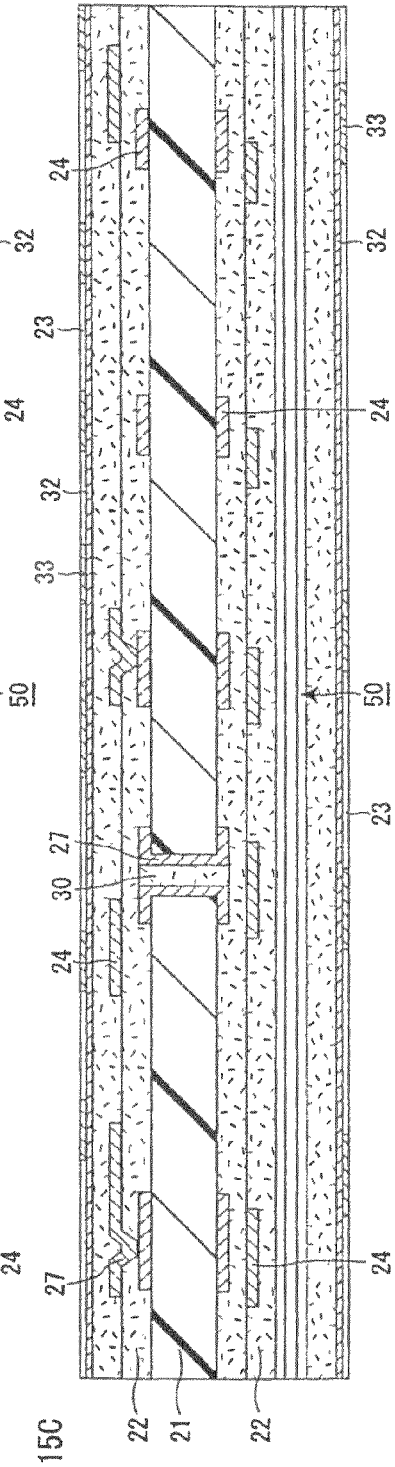

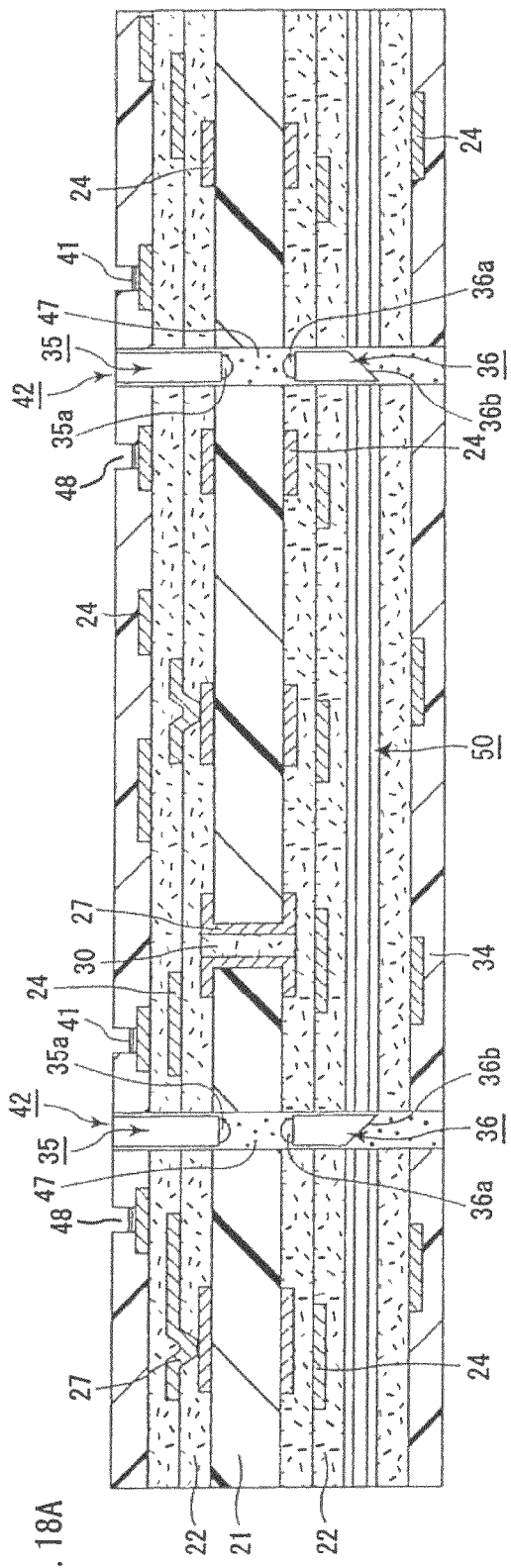
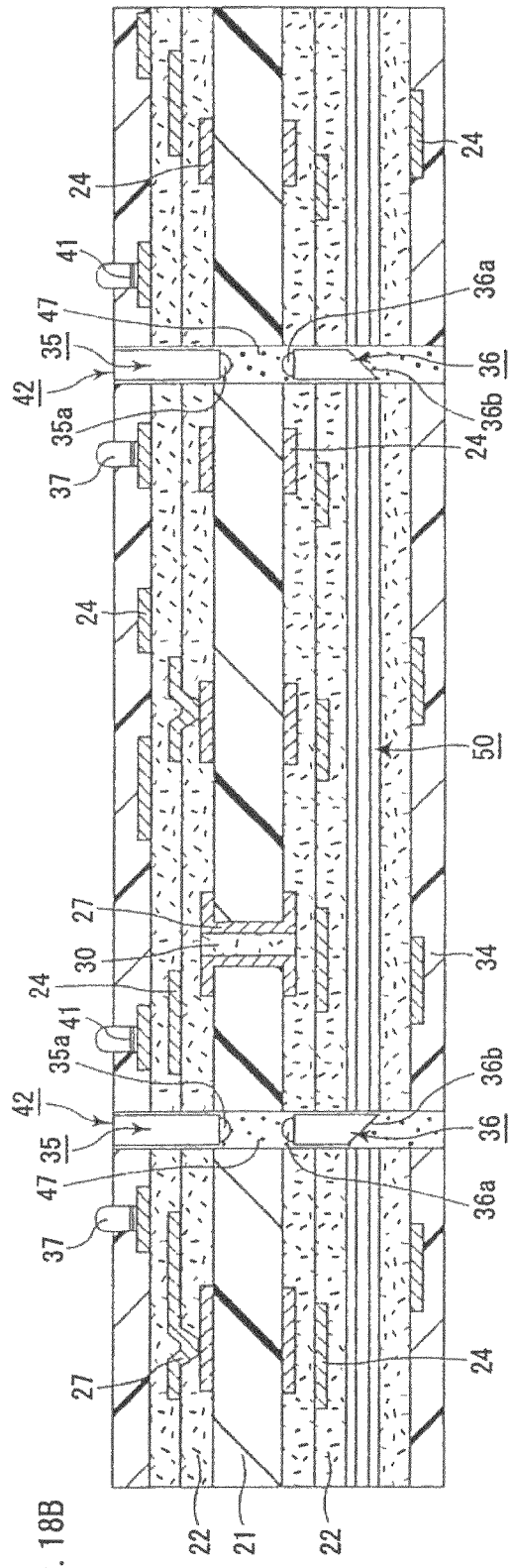
Fig. 18A
Fig. 18B

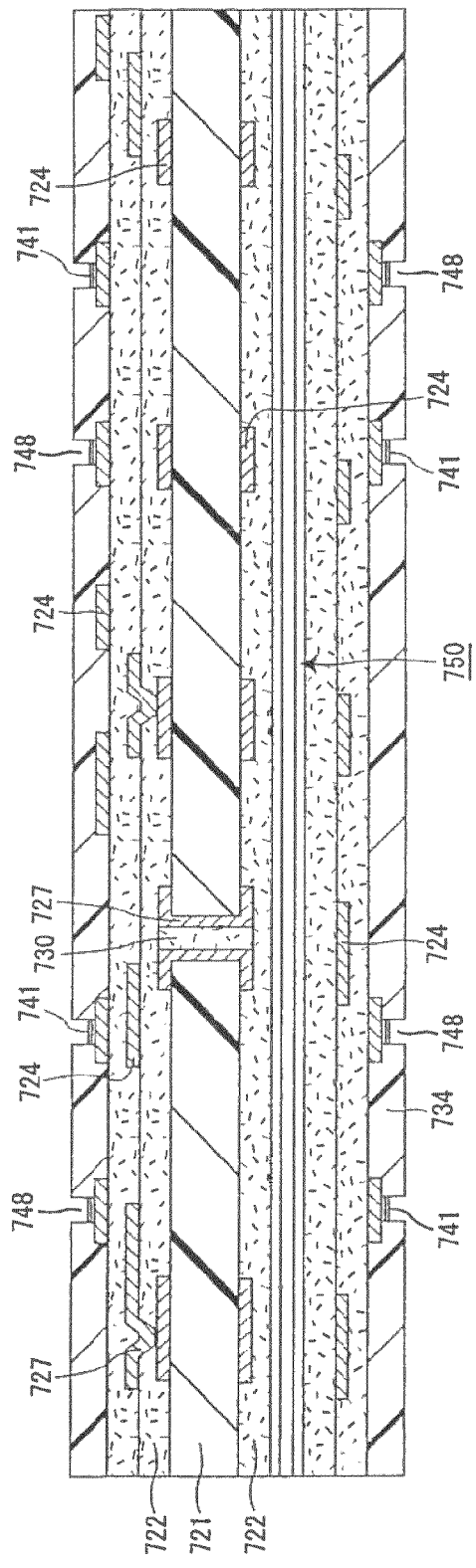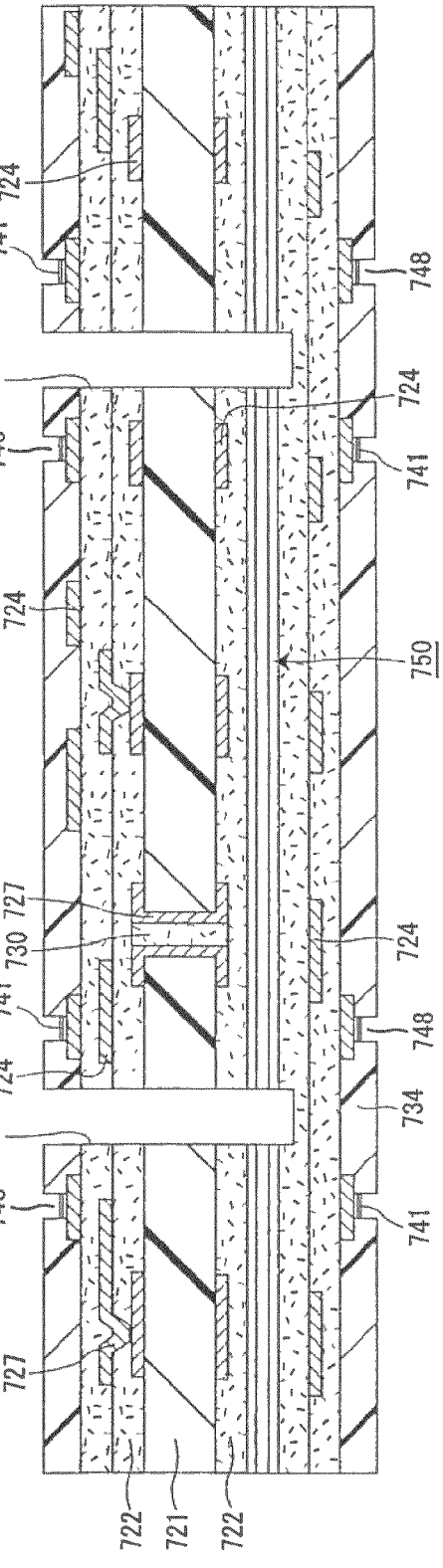

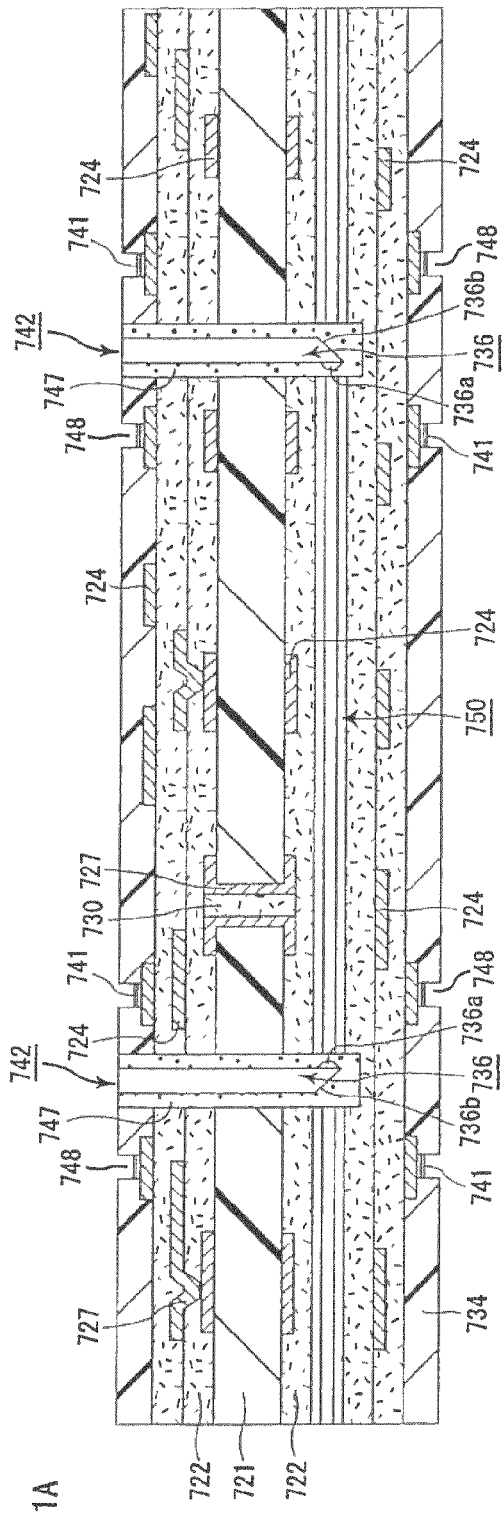
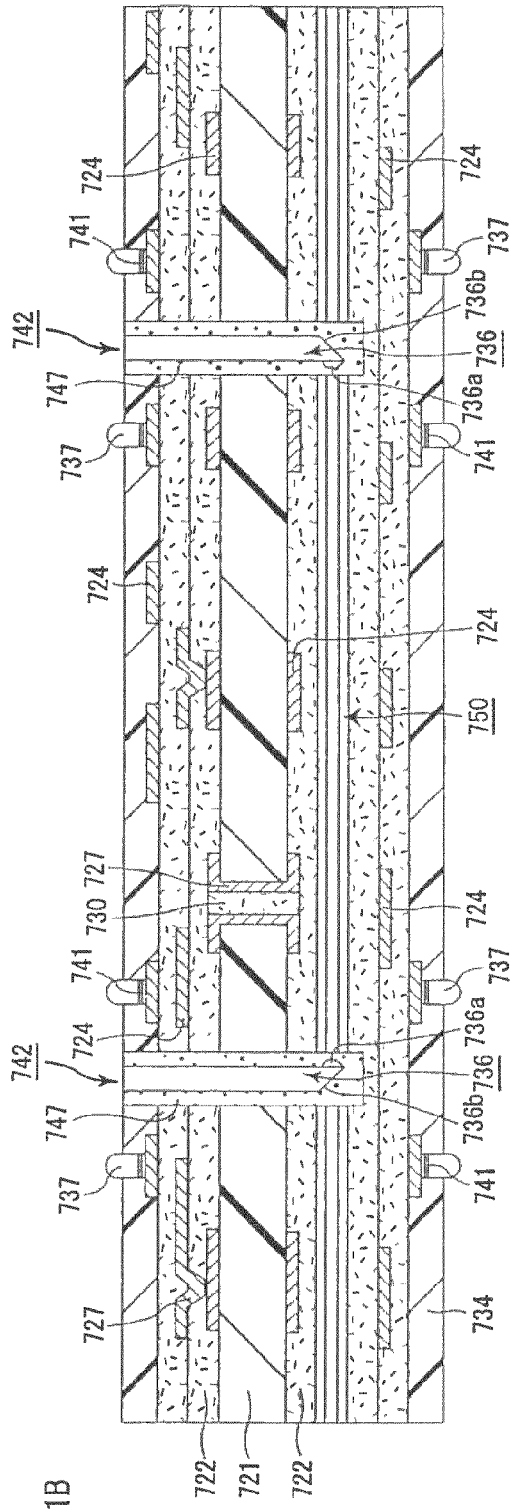
Fig. 21A
Fig. 21B

OPTICAL PATH CONVERTING MEMBER, MULTILAYER PRINT CIRCUIT BOARD, AND DEVICE FOR OPTICAL COMMUNICATION

CROSS-REFERENCE TO RELATED APPLICATIONS

This application is a continuation of and claims the benefit of priority under 35 U.S.C. §120 from U.S. Ser. No. 12/112, 026, filed Apr. 30, 2008, which is a divisional of U.S. Ser. No. 11/763,670, filed Jun. 15, 2007, now U.S. Pat. No. 7,764,860, issued Jul. 27, 2010, and is related to Japanese application 2004-368280, filed Dec. 20, 2004, published as JP 2006-178001 on Jul. 6, 2006. The contents of each of which are incorporated herein by reference in their entirety.

BACKGROUND OF THE PRESENT INVENTION

1. Field of the Present Invention

The present invention relates to an optical path converting member, a multilayer print circuit board, and a device for optical communication.

2. Discussion of the Background

Recently, optical fibers are widely noticed especially in the field of communications. In particular, in the field of IT (information technology), communication technology using optical fibers is indispensable for building a high-speed network of the Internet.

In network communications such as the Internet, it is proposed to apply optical communication using optical fibers not only in communications of backbone networks, but also in communications between backbone network and terminal devices (personal computer, mobile unit, gaming machine, and the like), or communications between terminal devices.

As devices for optical communication usable in this kind of terminal devices of optical transmitting and receiving systems, the present inventors previously proposed a device for optical communication comprising a package substrate in which an optical path for transmitting an optical signal is formed, and an optical element is mounted on one side, and a substrate for a mother board provided at least with an optical waveguide (see, for example, JP-A 2004-004427).

On the other hand, when a light emitting element and a light receiving element are mounted on a circuit board in which an optical waveguide is formed to perform optical transmissions between the light emitting element and the emitting element, light from the light emitting element is irradiated to one end of the optical waveguide, and then emit from the other end of the optical waveguide to the light receiving element, and for this purpose, there has been proposed a method for reflecting the light by burying a optical path converting member at such as a prism at a predetermined position (see, for example, JP-A H07-159658).

Furthermore, there has been disclosed a photoelectric circuit board in which an optical waveguide film preliminarily provided with a mirror and a lens for optical path conversion is adhered to a substrate (see, for example, JP-A 2001-166167).

The contents of JP-A 2004-004427, JP-A H07-159658, and JP-A 2001-166167 are incorporated herein by reference in their entirety.

SUMMARY OF THE INVENTION

An optical path converting member according to a first aspect of the present invention comprises: a lens; and an optical path conversion mirror having an entrance surface, an exit surface and a reflection surface, wherein the lens is provided at least one position selected from the entrance surface, the exit surface, and inside of the optical path conversion mirror.

In the above-mentioned optical path converting member, desirably, the lens and the optical path converting member are formed integrally, and also desirably, a metal deposition layer is formed on the reflection surface.

Moreover, desirably, a flange member is disposed at the optical path converting member.

In the above-mentioned optical path converting member, desirably, a material for the lens is an optical glass or a resin for optical lens, and the transmittance for light having a communication wavelength of the lens and the optical path conversion mirror is desirably about 60%/mm or more.

In the above-mentioned optical path converting member, desirably, particles are mixed in the lens and the optical path conversion mirror, and the diameter of the particles is desirably shorter than a communication wavelength, or at least about 0.01 μm and at most about 0.8 μm, and also the content of the particles is desirably at least about 5% by weight and at most about 60% by weight.

In the above-mentioned optical path converting member, desirably, a refractive index of the lens and a refractive index of the optical path conversion mirror are almost the same.

An optical path converting member according to a second aspect of the present invention comprises: a lens; and an optical path conversion mirror having an entrance surface, an exit surface and a reflection surface, wherein the lens is provided at least one position selected from the entrance surface, the exit surface, and inside of the optical path conversion mirror, and the lens has one concave surface or one convex surface.

In the above-mentioned optical path converting member, desirably, the optical path conversion mirror has a rectangular pillar shape comprising a top surface and a bottom surface each having a trapezoidal shape, a side surface functioning as an entrance surface, a side surface functioning as an exit surface, and a side surface functioning as a reflection surface, the lens desirably has a convex surface and is directly provided at either the entrance surface or the exit surface, and the respective exit surface or the entrance surface where the lens is not provided has a flat surface, and the angle formed by the entrance surface and the reflection surface, or the exit surface and the reflection surface is desirably about 45 degrees, and furthermore, the optical path converting member is desirably supported by a plate-like flange member.

In the above-mentioned optical path converting member, desirably, the lens has a convex surface and is directly provided at both the entrance surface and the exit surface, and the optical path converting member is desirably supported by a plate-like flange member.

In the above-mentioned optical path converting member, desirably, the optical path conversion mirror has a pillar shape comprising a top surface and a bottom surface each having a shape formed by combining three straight lines and one curved line, a flat side surface functioning as an entrance surface, a flat side surface functioning as an exit surface, and a convex curved side surface functioning as a reflection surface, and desirably, the lens has a convex surface and is directly provided at either the entrance surface or the exit surface.

In the above-mentioned optical path converting member, desirably, the optical path conversion mirror has a heptagonal pillar shape with the top surface and the bottom surface having a heptagonal shape, formed by attaching two rectangular pillars to a right triangular pillar so as to share the two side surfaces forming a right angle of the right triangular pillar, aside surface of each of the two rectangular pillars facing the surface attached to the triangular pillar functions as an entrance surface or an exit surface, and the side surface of the triangular pillar not shared with the rectangular pillars functions as a reflection surface, and the angle formed by the entrance surface and the reflection surface, or said exit surface and the reflection surface is about 45 degrees.

In the above-mentioned optical path converting member, desirably, the optical path conversion mirror has a triangular pillar shape comprising a side surface functioning as an entrance surface, a side surface functioning as an exit surface, and a side surface functioning as a reflection surface, and the lens has a shape formed by combining a pillar body and a convex body, and is directly provided at the entrance surface or the exit surface.

In the above-mentioned optical path converting member, desirably, the optical path conversion mirror has a triangular pillar shape comprising a side surface functioning as an entrance surface, a side surface functioning as an exit surface, and a side surface functioning as a reflection surface, and the lens has one flat surface and the other concave surface, and is directly provided at the entrance surface or the exit surface.

In the above-mentioned optical path converting member, desirably, the optical path conversion mirror comprises a first optical path member and a second optical path member, the first optical path member has a rectangular pillar shape comprising a top surface and a bottom surface having a trapezoidal shape, a side surface functioning as an entrance surface, a side surface functioning as an exit surface, and a side surface functioning as a reflection surface, the lens has a convex surface and is directly disposed at either the entrance surface or the exit surface, and the respective exit surface or the entrance surface where the lens is not provided has a flat surface, the angle formed by the entrance surface and the reflection surface, or the exit surface and the reflection surface is about 45 degrees, the second optical path member has a form in which a convex lens is provided at one surface of the rectangular pillar body, and the first optical path member and the second optical path member are integrated by interposing an adhesive layer in a manner that the lenses face to one another.

A multilayer print circuit board according to the present invention comprises: at least a conductor circuit and an insulating layer which are formed and laminated; an optical circuit and an optical path for transmitting an optical signal; and an optical path converting member disposed at the optical path for transmitting an optical signal, wherein the optical path converting member comprises a lens and an optical path conversion mirror having an entrance surface, an exit surface and a reflection surface, and the lens is provided at least one position selected from the entrance surface, the exit surface, and inside of the optical path conversion mirror.

In the above-mentioned multilayer print circuit board, desirably, the lens and the optical path conversion mirror are formed integrally, and a metal deposition layer is desirably formed on the reflection surface, and a flange member is desirably disposed at the optical path converting member.

In the above-mentioned multilayer print circuit board, desirably, the optical path converting member comprises a glass material, and a ratio of a refractive index of the optical path converting member and a refractive index of the adhesive is at least about 1.10 and at most about 1.35, or desirably, the optical path converting member comprises a resin material, and a ratio of a refractive index of the optical path converting member and a refractive index of the adhesive is at least about 1.10 and at most about 1.18.

In the above-mentioned multilayer print circuit board, the transmittance for light having a communication wavelength of the lens and the optical path conversion mirror is desirably about 60%/mm or more, and particles are desirably mixed in the lens and the optical path conversion mirror.

In the above-mentioned multilayer print circuit board, the diameter of the particles is desirably shorter than a communication wavelength, or at least about 0.01 μm and at most about 0.8 μm, and the content of the particles is desirably at least about 5% by weight and at most about 60% by weight, and a refractive index of the lens and a refractive index of the optical path conversion mirror are desirably almost the same.

In the above-mentioned multilayer print circuit board, the optical path converting member is desirably fixed to the optical path for transmitting an optical signal with an adhesive, and the adhesive desirably contains a resin having a thermosetting property and a photosensitivity as a resin composition, and particles are desirably mixed in the adhesive.

In the above-mentioned multilayer print circuit board, a particle diameter of the particles is desirably shorter than a communication wavelength, or at least about 0.2 μm and at most about 50 μm, and the content of the particles is desirably at least about 10% by weight and at most about 50% by weight, and also desirably a coupling agent is applied or a plasma treatment is performed on the surface of the optical path converting member.

In the above-mentioned multilayer print circuit board, in the optical path converting member, desirably, the lens is provided at either the entrance surface or the exit surface, on the side opposite to the side facing the optical circuit, and an optical path member having another lens provided so as to face the lens is provided, and also desirably, in the optical path converting member, the lens is provided at either the entrance surface or the exit surface, on the side facing the optical circuit.

In the above-mentioned multilayer print circuit board, the optical path for transmitting an optical signal may be formed so as to penetrate through the whole multilayer print circuit board, or may be formed so as not to penetrate the multilayer print circuit board.

In the above-mentioned multilayer print circuit board, the optical path for transmitting an optical signal desirably has a collective through hole structure or an individual through hole structure, and the optical circuit is desirably an optical waveguide or an optical fiber sheet.

A device for optical communication according to the present invention comprises: a multilayer print circuit board in which at least a conductor circuit and an insulating layer are formed and laminated, and further an optical circuit and an optical path for transmitting an optical signal are formed; and a package substrate having an optical element or an insulating layer, which is mounted on the multilayer print circuit board, wherein an optical path converting member is disposed at the optical path for transmitting an optical signal so as to transmit an optical signal between the optical element and the optical circuit, the optical path converting member comprises a lens and an optical path conversion mirror having an entrance surface, an exit surface and a reflection surface, and the lens is provided at least one position selected from the entrance surface, the exit surface, and inside of the optical path conversion mirror.

In the above-mentioned device for optical communication, the lens and the optical path conversion mirror are desirably formed integrally, and a metal deposition layer is desirably formed on the reflection surface, and a flange member is desirably disposed at the optical path converting member.

In the above-mentioned device for optical communication, desirably, the optical path converting member comprises a glass material, and a ratio of a refractive index of the optical path converting member and a refractive index of the adhesive is at least about 1.10 and at most about 1.35, or desirably, the optical path converting member comprises a resin material, and a ratio of a refractive index of the optical path converting member and a refractive index of the adhesive is at least about 1.10 and at most about 1.18.

In the above-mentioned device for optical communication, the transmittance for light having a communication wavelength of the lens and the optical path conversion mirror is desirably about 60%/mm or more, and particles are desirably mixed in the lens and the optical path conversion mirror.

In the above-mentioned device for optical communication, the diameter of the particles is desirably shorter than a communication wavelength, or at least about 0.01 μm and at most about 0.8 μm, and the content of the particles is desirably at least about 5% by weight and at most about 60% by weight, and a refractive index of the lens and a refractive index of the optical path conversion mirror are desirably almost the same.

In the above-mentioned device for optical communication, the optical path converting member is desirably fixed to the optical path for transmitting an optical signal with an adhesive, and the adhesive desirably contains a resin having a thermosetting property and a photosensitivity as a resin composition.

In the above-mentioned device for optical communication, particles are desirably mixed in the adhesive, and a particle diameter of the particles is desirably shorter than a communication wavelength, or at least about 0.2 μm and at most about 50 μm, and the content of the particles is desirably at least about 10% by weight and at most about 50% by weight.

In the above-mentioned device for optical communication, desirably, a coupling agent is applied or a plasma treatment is performed on the surface of the optical path converting member, and in the optical path converting member, desirably, the lens is provided at either the entrance surface or the exit surface, on a side different from the side facing the optical circuit, and an optical path member having another lens disposed so as to face the lens is provided.

In the above-mentioned device for optical communication, desirably, in the optical path converting member, the lens is provided at either the entrance surface or the exit surface, on the side facing the optical circuit.

In the above-mentioned device for optical communication, the optical path for transmitting an optical signal may be formed so as to penetrate through the whole multilayer print circuit board, or may be formed so as not to penetrate the multilayer print circuit board.

In the above-mentioned device for optical communication, the optical path for transmitting an optical signal desirably has a collective through hole structure or an individual through hole structure, and the optical circuit is desirably an optical waveguide or an optical fiber sheet.

In the above-mentioned device for optical communication, desirably, the optical path converting member is fixed to the optical element, a sub-mount substrate mounting the optical element, or a package substrate mounting the optical element.

In the above-mentioned device for optical communication, desirably, the optical path member is fixed to the optical element, a sub-mount substrate mounting the optical element, or a package substrate mounting the optical element.

BRIEF DESCRIPTION OF THE DRAWINGS

FIG. 1A-2 is a cross-sectional view of the optical path converting member shown in FIG. 1A-1.

FIG. 1B-1 is a perspective view schematically showing an optical path converting member according to one embodiment of the present invention, and FIG. 1B-2 is a cross-sectional view of the optical path converting member shown in FIG. 1B-1.

FIG. 1C-1 is a perspective view schematically showing an optical path converting member according to one embodiment of the present invention, and FIG. 1C-2 is a cross-sectional view of the optical path converting member shown in FIG. 1C-1.

FIG. 2D-1 is a perspective view schematically showing an optical path converting member according to one embodiment of the present invention, and FIG. 2D-2 is a cross-sectional view of the optical path converting member shown in FIG. 2D-1.

FIG. 2E-1 is a perspective view schematically showing an optical path converting member according to one embodiment of the present invention, and FIG. 2E-2 is a cross-sectional view of the optical path converting member shown in FIG. 2E-1.

FIG. 3F-1 is a perspective view schematically showing an optical path converting member according to one embodiment of the present invention, and FIG. 3F-2 is a cross-sectional view of the optical path converting member shown in FIG. 3F-1.

FIG. 3G-1 is a perspective view schematically showing an optical path converting member according to one embodiment of the present invention, and FIG. 3G-2 is a cross-sectional view of the optical path converting member shown in FIG. 3G-1.

FIG. 4H-1 is a perspective view schematically showing an optical path converting member according to one embodiment of the present invention, and FIG. 4H-2 is a cross-sectional view of the optical path converting member shown in FIG. 4H-1.

FIG. 4I-1 is a perspective view schematically showing an optical path converting member according to one embodiment of the present invention, and FIG. 4I-2 is a cross-sectional view of the optical path converting member shown in FIG. 4I-1.

FIG. 5J-1 is a perspective view schematically showing an optical path converting member according to one embodiment of the present invention, and FIG. 5J-2 is a cross-sectional view of the optical path converting member shown in FIG. 5J-1.

FIG. 6A-1 is a perspective view schematically showing an optical path member according to one embodiment of the present invention, and FIG. 6A-2 is a cross-sectional view of the optical path member shown in FIG. 6A-1.

FIG. 6B-1 is a perspective view schematically showing an optical path member according to one embodiment of the present invention, and FIG. 6B-2 is a cross-sectional view of the optical path member shown in FIG. 6B-1.

FIGS. 12A to 12E are cross sectional views schematically showing a part of a method for manufacturing a multilayer print circuit board according to one embodiment of the present invention.

FIGS. 13A to 13D are cross sectional views schematically showing a part of the method for manufacturing a multilayer print circuit board according to one embodiment of the present invention.

FIGS. 15A to 15C are cross-sectional views schematically showing a part of the method for manufacturing a multilayer print circuit board according to one embodiment of the present invention.

FIGS. 18A and 18B are cross-sectional views schematically showing a part of the method for manufacturing a multilayer print circuit board according to one embodiment of the present invention.

FIGS. 20A and 20B are cross-sectional views schematically showing a part of the method for manufacturing a multilayer print circuit board according to one embodiment of the present invention.

FIGS. 21A and 21B are cross-sectional views schematically showing a part of the method for manufacturing a multilayer print circuit board according to one embodiment of the present invention.

DESCRIPTION OF THE EMBODIMENTS

Figures 1, 1A:
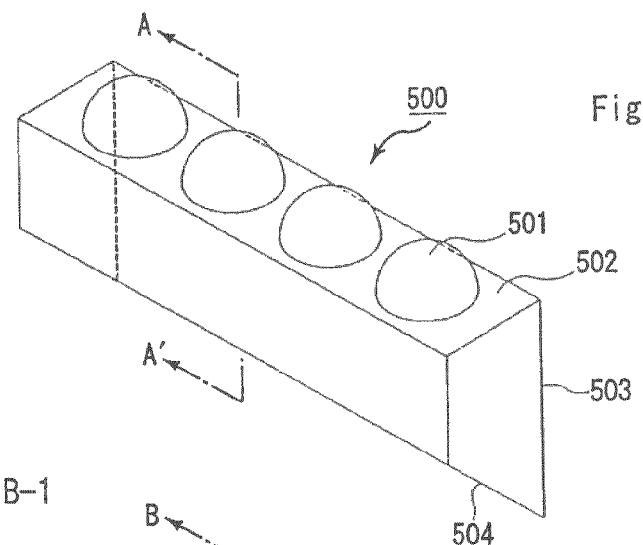
FIG. 1A-1 is a perspective view schematically showing an optical path converting member according to one embodiment of the present invention.

An optical path converting member according to embodiments of a first aspect of the present invention comprises: a lens; and an optical path conversion mirror having an entrance surface, an exit surface and a reflection surface, wherein the lens is provided at least one position selected from the entrance surface, the exit surface, and inside of the optical path conversion mirror.

An optical path converting member according to embodiments of a second aspect of the present invention comprises: a lens; and an optical path conversion mirror having an entrance surface, an exit surface and a reflection surface, wherein the lens is provided at least one position selected from the entrance surface, the exit surface, and inside of the optical path conversion mirror, and the lens has one concave surface or one convex surface.

The above-mentioned optical path converting member according to the embodiments of the second aspect of the present invention belongs to a narrower concept of the optical path converting member according to the embodiments of the first aspect of the present invention, and therefore, in the following descriptions, the optical path converting members of the first and the second aspects of the present invention will not be differentiated, and both members will be described as the embodiments of the optical path converting member of the present invention.

The optical path converting member according to the embodiment of the present invention comprises: a lens; and an optical path conversion mirror having an entrance surface, an exit surface and a reflection surface, wherein the lens is provided at at least one position selected from the entrance surface, the exit surface, and inside of the optical path conversion mirror.

The lens may be provided at the optical path conversion mirror by interposing an adhesive or the like, but more desirably the lens is provided in such a manner that the lens and the mirror are formed integrally.

When the lens and the optical path conversion mirror are formed integrally, the relative positional precision of the lens and the mirror is enhanced, and when the optical path converting member according to the embodiment of the present invention is used in the device for optical communication, the connection loss of the lens and the optical path conversion mirror may be extremely lowered more easily, and the optical signal transmission loss in the entire device for optical communication may be more easily decreased.

The multilayer print circuit board according to the embodiment of the present invention comprises: at least a conductor circuit and an insulating layer which are formed and laminated; an optical circuit and an optical path for transmitting an optical signal; and an optical path converting member disposed at the optical path for transmitting an optical signal, wherein the optical path converting member comprises a lens and an optical path conversion mirror having an entrance surface, an exit surface and a reflection surface, and the lens is provided at least one position selected from the entrance surface, the exit surface, and inside of the optical path conversion mirror.

In the present invention, since the optical path converting member according to the embodiment of the present invention is disposed in the optical path for transmitting an optical signal which forms the multilayer print circuit board, an optical signal may be more easily concentrated by a lens formed in the optical path converting member, and therefore the optical signal can be more easily transmitted securely by way of the optical path for transmitting an optical signal.

The device for optical communication according to the embodiments of the present invention comprises: a multilayer print circuit board in which at least a conductor circuit and an insulating layer are formed and laminated, and further an optical circuit and an optical path for transmitting an optical signal are formed; and a package substrate having an optical element or an insulating layer, which is mounted on the multilayer print circuit board, wherein an optical path converting member is disposed at the optical path for transmitting an optical signal so as to transmit an optical signal between the optical element and the optical circuit, the optical path converting member comprises a lens and an optical path conversion mirror having an entrance surface, an exit surface and a reflection surface, and the lens is provided at least one position selected from the entrance surface, the exit surface, and inside of the optical path conversion mirror.

That is, in the device for optical communication according to the embodiments of the present invention, an optical element or a package substrate mounting an optical element (hereinafter also referred to as optical element mounting package substrate and the like) is mounted on the above-mentioned multilayer print circuit board according to the embodiment of the present invention.

In the device for optical communication according to the embodiments of the present invention, since the optical path converting member according to the embodiment of the present invention is disposed in the optical path for transmitting an optical signal which forms the multilayer print circuit board according to the embodiments, the optical signal tends to be transmitted securely between optical elements through the optical path for transmitting an optical signal.

Moreover, since the optical path converting member according to the embodiment of the present invention is provided, transmission loss between the optical element and the optical waveguide may be more easily reduced, and the decrement portion of transmission loss can be consumed by the portion of transmission loss of other members forming the device for optical communication, thus freedom of design is improved. Therefore, for example, it becomes possible to shorten the total length of the optical waveguide, to extend the service life of the light emitting device by lowering the output of the light emitting device, and to use a light receiving device with low sensitivity more easily.

The feature is briefly described in the following.

In the device for optical communication according to the embodiments, in the case where the device for optical communication has a structure in which an optical element mounting package substrate or the like is mounted on the surface of a substrate; an optical circuit is provided; and an optical signal is transmitted between the two members by way of an optical path for transmitting an optical signal, usually, a mirror for about 90-degree optical path conversion needs to be formed at an end of the optical circuit. Moreover, when an optical waveguide having a core of about 50 μm square is used as the optical circuit, in order to irradiate the optical signal into the core at a low loss, usually, the optical signal needs to be entered through a lens.

Here, a transmission loss in the device for optical communication is examined. If the lens and the optical circuit are formed separately in the manufacturing process of the device for optical communication, a deviation of tens of microns from the designed distance between the lens and the optical waveguide could not be avid could not be avoided between the lens and the optical waveguide.

Specifically, when forming an optical waveguide having a core of at least about 50 μm and at most about 75 μm square, and a lens, an average deviation from the design of about 15 μm could not be avoided, and hence the transmission loss increases by about 4 dB from the design value.

On the other hand, in 2.5 Gbps transmittance from the light emitting device to the light receiving device in the device for optical communication, in order to realize a bit error rate (BER) of $1 \times 10^{-12}$, that is, error free by an error correcting code technique, it is generally said that the transmission loss in the entire device for optical communication is required to be 18 dB or less.

In a backplane board or the like, when transmitting an optical signal in a relatively long distance of about 50 cm to about 1 m, the transmission loss in the lens or the optical path conversion mirror needs to be further reduced, and also in optical signal transmission in a shorter distance, a smaller transmission loss is more desirable from the viewpoint of assuring a sufficient reliability margin.

Therefore, in the device for optical communication, deviation between the lens and the optical waveguide from the design has a serious effect on the loss of the entire device for optical communication. It is hence important to reduce the deviation between the lens and the optical waveguide from the design, and in the device for optical communication of the present invention mentioned above, the problem may be more easily solved by decreasing the deviation between the lens and the optical waveguide, and the above-mentioned effects may be more easily enjoyed.

First, an optical path converting member according to embodiments of the present invention is described.

In the optical path converting member according to the embodiment of the present invention, a lens is provided at least one position of the entrance surface, the exit surface and inside of the optical path conversion mirror, and therefore, displacement between the lens and the optical path conversion mirror tends not to occur, and upon transmitting an optical signal via the optical path conversion member, transmission loss in the optical path converting member may be more easily reduced.

A material of the lens is not particularly limited, and examples thereof include optical glass, resin for optical lens, and the like. Specific examples of the resin for optical lens include a material similar to a polymer material explained later as a resin composition to be filled in the optical path for transmitting an optical signal in the multilayer print circuit board according to the embodiment of the present invention, such as acrylic resin and epoxy resin.

The adhesive is not particularly limited, and an adhesive such as an epoxy resin, an acrylic resin, a silicone resin and the like may be used.

Examples of the shape of the lens include, for example, a convex lens having a convex surface on one side only. The shape of the lens is not limited to the convex lens, and includes any shape capable of condensing the optical signal in any desired direction.

Other examples of the lens include a spherical lens, a diffraction grating lens, flat lenses such as a refractive index distribution lens, a Fresnel lens, a concave lens, and the like.

In particular, when the diffraction grating lens or Fresnel lens is used, the thickness of the lens may be more easily reduced.

Shapes of the lens in a plan view are divided into a shape with no corners such as a round shape and an elliptical shape, and a shape with a corner such as a triangular shape and a rectangular shape. Here, a shape with no corners in which a segment corresponding to a corner portion is formed by a curved line (so called a shape with a chamfered corner) should be included in the shape with a corner, if most part thereof is very similar to the shape with a corner.

In the lens and the optical path conversion mirror, the transmittance for light having a communication wavelength is desirably about 60%/mm or more.

If the transmittance for light having a communication wavelength is about 60%/mm or more, loss of an optical signal tends not to be too large, and transmission property of the optical signal tends not to be lowered, and more desirably the transmittance is about 90%/mm or more.

In the present specification, a transmittance for light having a communication wavelength is defined as transmittance for light having a communication wavelength per a length of 1 mm. Specifically, the transmittance is the value calculated in the following formula (I) when, for example, light of intensity $I_1$ enters the lens, exits the lens after passing through 1 mm with the intensity of the exit light of $I_2$, and the transmittance is calculated in the following formula (I).

$$\text{Transmittance (\%/mm)} = (I_2/I_1) \times 100 \quad (1)$$

Here, the transmittance is measured at a temperature of 25° C.

The lens may contain particles such as resin particles, inorganic particles, and metal particles.

By containing particles, the strength of the lens is improved, and the shape tends to be maintained more securely. As mentioned below, when the optical path converting member according to the embodiment of the present invention is disposed in the multilayer print circuit board or the device for optical communication, a coefficient of thermal expansion between the substrate and the insulating layer may be more easily matched, and occurrence of cracks or the like due to difference in the coefficient of thermal expansion may be more easily reduced.

In the case where the above-described lens includes particles, desirably the refractive index of the resin component of the lens and the refractive index of the above-described particles are almost the same. Therefore, it is desirable for the particles included in the lens to be a mixture of particles of two or more kinds having different indexes of refraction so that the refractive index of the particles becomes almost the same as the refractive index of the resin component.

Specifically, in the case where the resin component is an epoxy resin having an refractive index of 1.53, for example, it is desirable for the particles included in the lens to be particles which are obtained by mixing and melting silica particles having an refractive index of 1.46 and titania particles having an refractive index of 2.65.

Here, as for the method for mixing particles, a method for kneading particles and a method for melting and mixing two or more kinds of particles and after that, converting the mixture into particle form, and the like can be cited.

Here, the same kinds of particles as those mixed in the optical path for transmitting an optical signal can be cited as concrete examples of the above-described particles.

Concrete examples of the particles include inorganic particles, resin particles, metal particles and the like.

As for the inorganic particles, particles comprising aluminum compounds such as alumina and aluminum hydroxide, calcium compounds such as calcium carbonate and calcium hydroxide, potassium compounds such as potassium carbonate, magnesium compounds such as magnesia, dolomite, basic magnesium carbonate and talc, silicon compounds such as silica and zeolite, titanium compounds such as titania and the like can be cited as examples. In addition, particles having a mixed component where at least two kinds of inorganic materials are mixed and melted together may be used.

Examples of the resin particles include particles made of, for example, a thermosetting resin, a thermoplastic resin, and the like, and concrete examples thereof include particles made of an amino resin (such as a melamine resin, a urea resin and a guanamine resin), an epoxy resin, a phenolic resin, a phenoxy resin, a polyimide resin, a polyphenylene resin, a polyolefin resin, a fluorine resin, a bismaleimide-triazine resin and the like.

Examples of the metal particles include gold, silver, copper, tin, zinc, a stainless steel, aluminum, nickel, iron, lead and the like. It is desirable for the surface layer of the metal particles to be coated with a resin or the like in order to secure insulating properties.

In addition, these particles may be solely used or two or more kinds may be used together.

The particle size of the particles is not particularly limited, but the desirable upper limit is about 0.8 μm, and the desirable lower limit is about 0.01 μm.

This is because, within this range, the particle size is usually shorter than a commonly used multi-mode optical waveguide (850 nm), and thus transmission of an optical signal tends not to be impeded.

More desirably, the lower limit of the particle size is about 0.1 μm.

The lower limit of the content of particles contained in the lens is desirably about 5% by weight, or more desirably about 10% by weight. On the other hand, the upper limit of content of particles is desirably about 60% by weight, or more desirably about 50% by weight. If the content of particles is about 5% by weight or more, the effect of blending particles is more easily obtained, and if the content of particles is 60% by weight or less, transmission of an optical signal is less likely to be impeded.

The refractive index of the lens is not particularly limited, and is desirably almost the same as the refractive index of the optical path conversion mirror, and is usually at least about 1.4 and at most about 1.6 may be used.

When the refractive index of the lens and the refractive index of the optical path conversion mirror are almost the same, transmission loss due to reflection tends not to occur at the interface of the lens and the optical path conversion mirror.

The optical path conversion mirror is not particularly limited as long as it includes the entrance surface, the exit surface and the reflection surface, and the angle of the light converted at this optical path conversion mirror is not particularly limited. Therefore, the angle formed by the entrance surface and the reflection surface, and the angle formed by the exit surface and the reflection surface may be any angle.

The reflection surface may be either a flat surface or a curved surface.

With regard to a material of the optical path conversion mirror, for example, those which are the same as the materials of the lens may be exemplified. Besides, particles may also be contained in the optical path conversion mirror.

Moreover, it is desirable that the material of the lens and the material of the optical path conversion mirror be the same.

When the materials of the lens and the optical path conversion mirror are the same, since both of the members have the same refractive index, the transmission loss may be more easily suppressed as mentioned above, and furthermore, since the coefficients of thermal expansion are the same, deformation and the like may be less likely to occur.

In the optical path conversion mirror, the reflection surface may be coated with a metal deposition film, or may contact with air.

Desirably, the optical path conversion mirror is provided with a flange member. In the case where a flange member is provided, upon installing the optical path conversion member in the device for optical communication, the installation may be carried out more easily, and also positional deviation after the installation becomes less likely to occur.

The shape of the flange member will be described later.

The shape of the optical path converting member of the present invention is described below with reference to the drawings.

In FIGS. 1A-1, 13-1, 1C-1, 2D-1, 2E-1, 3F-1, 3G-1, 4H-1, 4I-1 and 5J-1 are perspective views and sectional views each schematically showing one example of the optical path converting member according to one embodiment of the present invention, and FIGS. 1A-2, 1b-2, 1C-2, 2D-2, 2E-2, 3F-2, 3G-2, 4H-2, 4I-2 and 5J-2 are cross-sectional views each schematically showing one example of the optical path converting member according to one embodiment of the present invention.

Figures 1, 1A, 2:
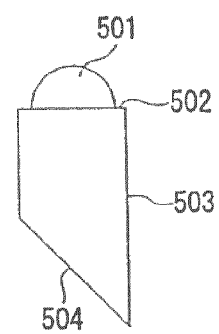

An optical path converting member 500 shown in FIGS. 1A-1 and 1A-2 comprises an optical path conversion mirror having a rectangular pillar shape with a top surface and a bottom surface each having a trapezoidal shape, a side face functioning as an entrance surface 502, a side face functioning as an exit surface 503 and a side face functioning as a reflection surface 504; and a lens 501 having a flat surface on one side and a convex surface on the other side, and in the optical path converting member 500, four pieces of the lens 501 are directly provided on the reflection surface 504. Moreover, the angle formed by the entrance surface 502 and the reflection surface 504, and the angle formed by the exit surface 503 and the reflection surface 504 are both about 45 degrees.

Here, FIG. 1A-2 is a cross sectional view of the optical path converting member along the line A-A' shown in FIG. 1A-1.

Figures 1, 1B:
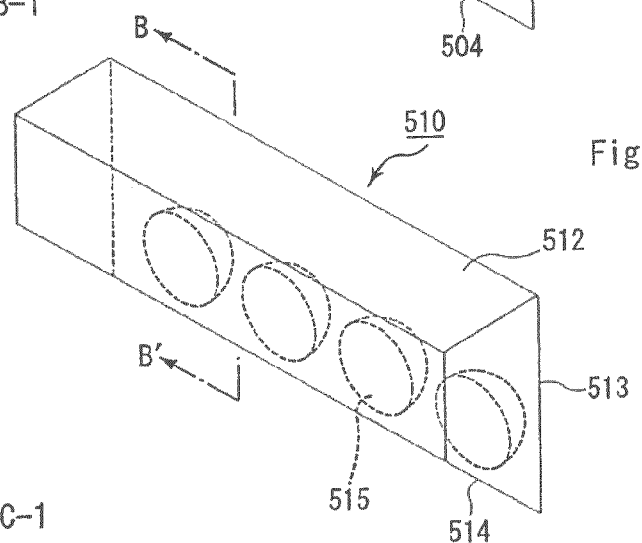
Figures 1, 1B, 2:
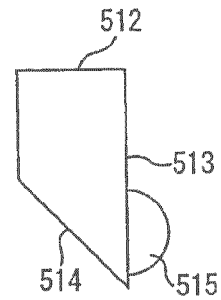

An optical path converting member 510 shown in FIGS. 1B-1 and 1B-2 has the same structure as optical path converting member 500, except that the positions of lenses 515 are different.

That is, in the optical path converting member 510, four pieces of the lens 515 are directly provided on an exit surface 513, instead of an entrance surface 512.

Here, FIG. 1B-2 is a cross sectional view of the optical path converting member along the line B-B' shown in FIG. 1B-1.

Figures 1, 1C:
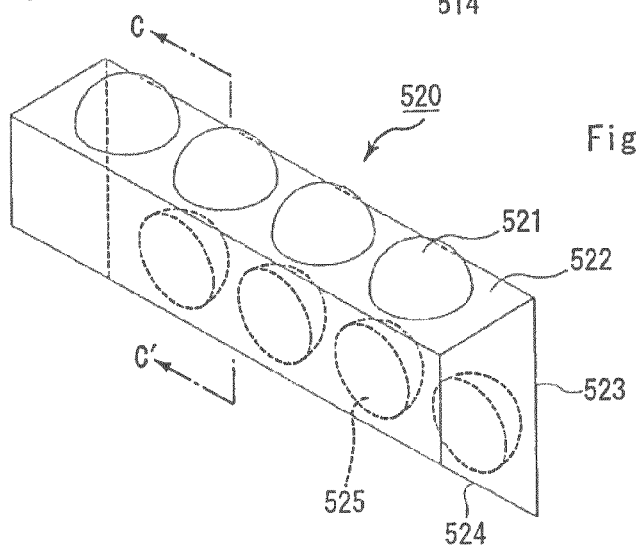
Figures 1, 1C, 2:
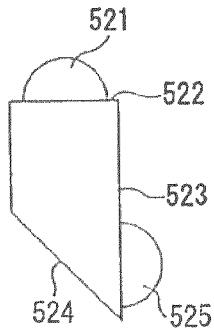

An optical path converting member 520 shown in FIGS. 1C-1 and 1C-2 has the same structure as the optical path converting member 500, except that the positions of lenses are different.

That is, in the optical path converting member 520, four pieces of the lens 521 are directly provided on the entrance surface 512, and another four pieces of the lens 525 are also directly provided on the exit surface 523.

Here, FIG. 1C-2 is a cross sectional view of the optical path converting member along the line C-C' shown in FIG. 1C-1.

In the embodiments of the optical path converting member having lenses provided at positions shown in FIGS. 1A-1, 1A-2, 1B-1, 1B-2, 1C-1 and 1C-2, the bottom shape of the optical path conversion mirror is not limited to the shape shown in the figures, and may be formed, for example, in a pentagonal shape as shown in FIGS. 3G-1 and 3G-2 described below.

Figures 1, 2D:
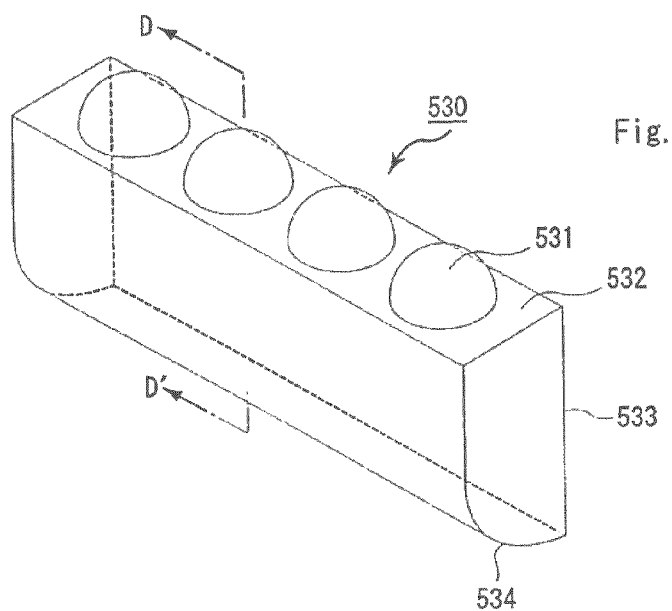
Figures 2, 2D:
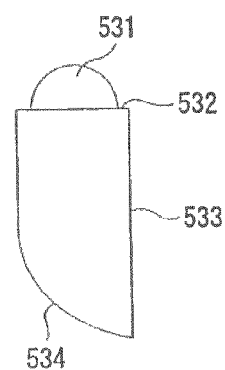

An optical path converting member 530 shown in FIGS. 2D-1 and 2D-2 has almost the same structure as the optical path converting member 500, except that the shape of a reflection surface 534 is different.

That is, the optical path converting member 530 has, instead of a flat reflection surface, a reflection surface 534 having an outward convex curve and having an arc-shaped cross section.

In other words, the optical path conversion mirror 530 has a pillar shape and comprises a top surface and a bottom surface each having a shape formed by combining three straight lines and one curved line, a flat side surface 532 functioning as an entrance surface, a flat side surface 533 functioning as an exit surface, and a convex curved side surface 534 functioning as a reflection surface.

FIG. 2D-2 is a cross sectional view of the optical path converting member along the line D-D' shown in FIG. 2D-1.

Here, the reflection surface may be formed by a combination of a curved surface and a flat surface.

Moreover, lenses may be provided at the entrance surface or may be provided at both the entrance surface and the exit surface.

Figures 1, 2E:
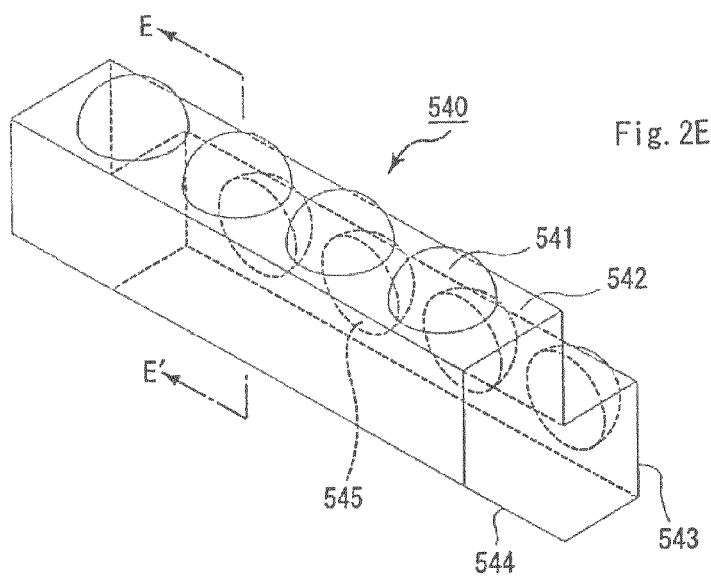
Figures 2, 2E:
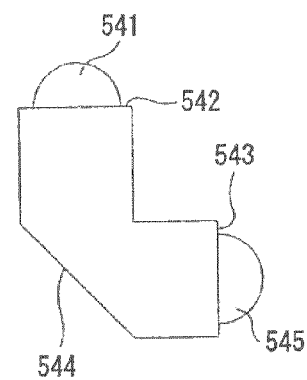

An optical path converting member 540 shown in FIGS. 2E-1 and 2E-2 comprises: an optical path conversion mirror having a heptagonal pillar shape with a heptagonal bottom surface formed by combining a triangular pillar having a right triangular bottom surface, and two rectangular pillars each attached to one of the two side surfaces forming the right angle of the triangular pillar, and having a side surface functioning as an entrance surface 542, a side surface functioning as an exit surface 543 and a side surface functioning as reflection surface 544; and a lens 541 and a lens 545, each having a flat surface on one side and a convex surface on the other side, and in the optical path converting member 540, four pieces of the lens 541 and four pieces of the lens 545 are directly provided on the entrance surface 542 and the exit surface 543, respectively. The angle formed by the entrance surface 542 and the reflection surface 544, and the angle formed by the exit surface 543 and the reflection surface 544 are both about 45 degrees.

Here, FIG. 2E-2 is a cross sectional view of the optical path converting member along the line E-E' shown in FIG. 2E-1.

Having such shape, by adjusting the distance between the reflection surface and the lenses, the focal length may be adjusted more easily.

In an optical path converting member 550 shown in FIGS. 3F-1 and 3F-2, the shapes of the lenses and the optical path conversion mirror are the same as those in FIGS. 2C-1 and 2C-2, and further a plate-like flange member 556 is disposed at a lower part of the reflection surface 554 by way of a mounting member 556a.

When such a flange member 556 is provided, the optical path converting member according to the embodiment of the present invention may be more easily mounted on a device for optical communication and the like.

Here, FIG. 3F-2 is a cross sectional view of the optical path converting member along the line F-F' shown in FIG. 3F-1.

An optical path converting member 560 shown in FIGS. 3G-1 and 3G-2 comprises: an optical path conversion mirror having a pentagonal pillar shape with a side face functioning as an entrance surface 562, a side face functioning as an exit surface 563 and a side face functioning as a reflection surface 564; and a lens 565 having a flat surface on one side and a convex surface on the other side, and in the optical path converting member 560, four pieces of the lens 565 are directly provided on the exit surface 563. Moreover, at the plane between the reflection surface 564 and the exit surface 563, a plate-like flange member 566 is disposed by way of a mounting member 566a. This flange member 566 has a through hole 567 for inserting a guide pin (not shown) and the like.

When provided with such flange member 566 and through hole 567, the optical path converting member of the present invention may be more easily disposed (fixed and positioned) in the device for optical communication and the like.

Here, FIG. 3G-2 is a cross sectional view of the optical path converting member along the line G-G' shown in FIG. 3G-1.

Figures 1, 4H:
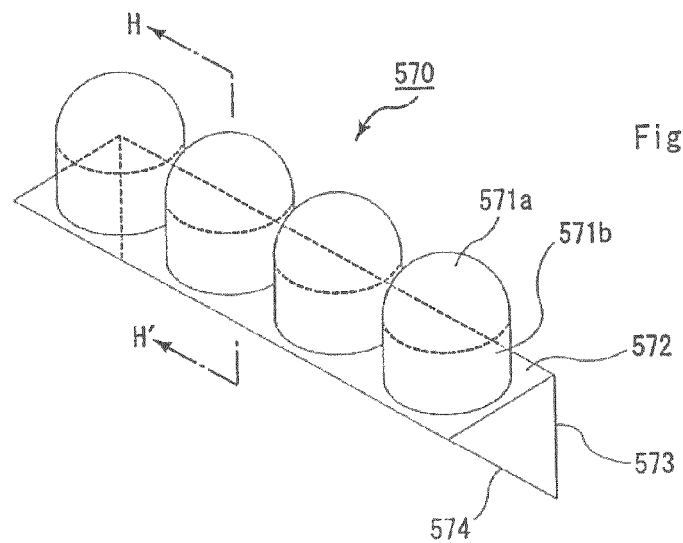
Figures 2, 4H:
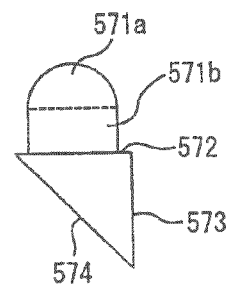

An optical path converting member 570 shown in FIGS. 4H-1 and 4H-2 comprises: an optical path conversion mirror having a triangular pillar shape with a triangular bottom surface, a side surface functioning as an entrance surface 572, a side surface functioning as an exit surface 573 and a side surface functioning as a reflection surface 574; and a lens 571 formed by combining a pillar body 571b and a convex body 571a, and in the optical path converting member 570, the lens 571 is directly provided on the entrance surface 572.

Here, FIG. 4H-2 is a cross sectional view of the optical path converting member along the line H-H' shown in FIG. 4H-1.

Figures 1, 4I:
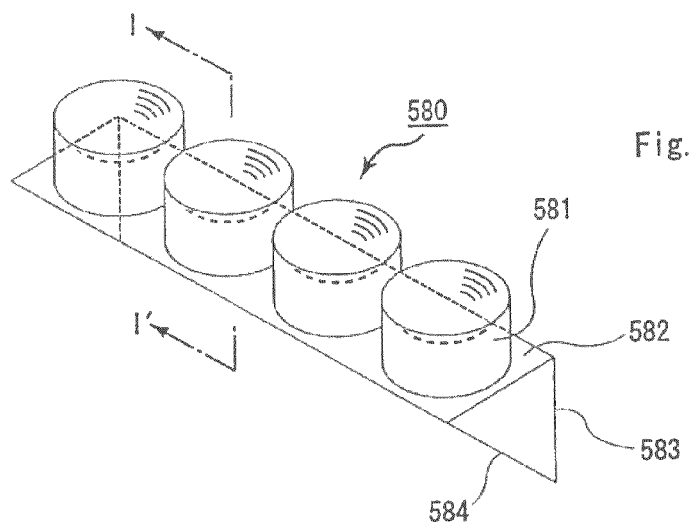
Figures 2, 4I:
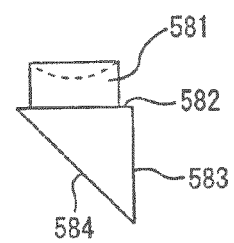

In an optical path converting member 580 shown in FIGS. 4I-1 and 4I-2, the shape of an optical path conversion mirror is identical to the shape of the optical path conversion mirror shown in FIGS. 4H-1 and 4H-2, and on the entrance surface of the optical path conversion mirror, a lens 581 having a flat surface on one side and a concave surface on the other side. Here, FIG. 4I-2 is a cross sectional view of the optical path converting member along the line I-I' shown in FIG. 4I-1.

Figures 1, 5J:
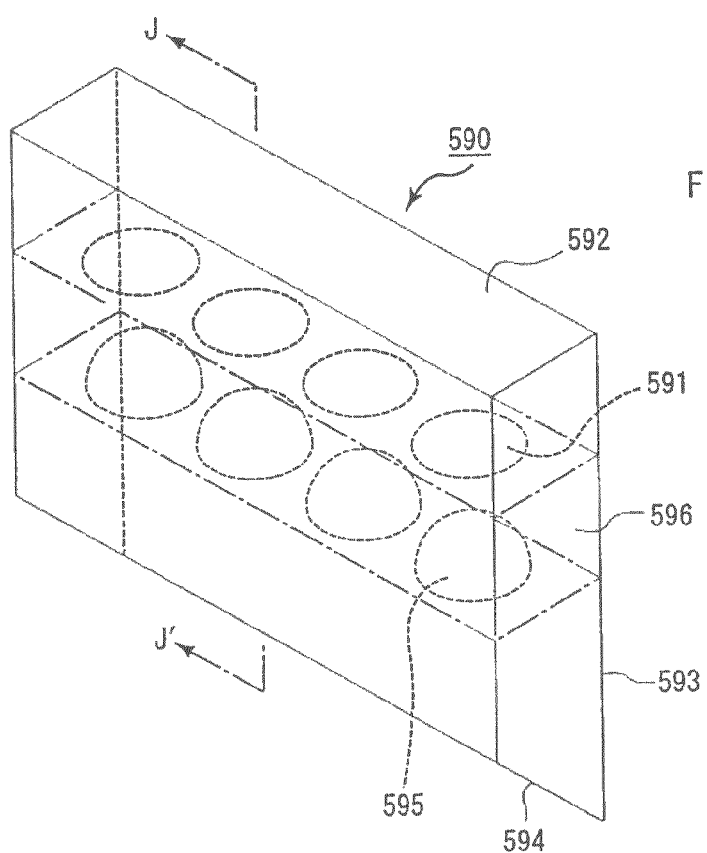
Figures 2, 5J:
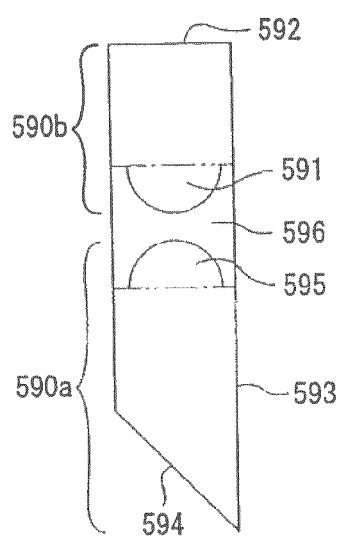

FIGS. 5J-1 and 5J-2 show an optical path conversion member 590 in which a lens is provided inside an optical path converting member. In the optical path converting member 590, a first optical path member 590a having almost the same shape as the optical path converting member shown in FIGS. 1A-1 and 1A-2, and a second optical path member 590b in which a lens 591 having a convex body is disposed on one surface of the rectangular pillar shaped body, are formed integrally by interposing an adhesive layer 596. In the figures, the portion 591 shows a lens, the surface 592 shows an entrance surface, the surface 593 shows an exit surface and the surface 594 shows a reflection surface.

This kind of optical path converting member in which a lens is provided inside an optical path converting mirror is also one of the embodiments of the optical path converting member of the present invention. Here, FIG. 5J-2 is a cross sectional view of the optical path converting member along the line J-J' shown in FIG. 5J-1.

In the optical path converting member 590 having this kind of structure, the refractive index of the adhesive layer 596 for integrating the optical path members 590a and 590b is desirably smaller than the refractive index of the optical path members 590a and 590b.

This is because, collimated light transmission between optical path members may become possible.

Besides, when lenses are provided inside the optical path conversion mirror, the number of the lenses is not particularly limited, and may be two, one, or three or more as shown in the figures.

In the above-mentioned optical path converting member shown in FIGS. 1A-1, 1A-2 to 5J-1, 5J-2, an entrance surface and an exit surface are defined, however, depending on the needs, the entrance surface and the exit surface are interchangeable.

Specific shapes of the optical path converting member according to the embodiments of the present invention are not limited to those shapes shown in FIGS. 1A-1, 1A-2 to 5J-1, 5J-2. For example, although the optical path converting members disclosed in the drawings have four optical paths each, the number of optical paths in the optical path converting member of the present invention is not limited to four, and may be one to three, or may be five or more. Moreover, the number of lenses provided in each optical path is also not particularly limited.

Next, a method for manufacturing the above-mentioned optical path converting member according to the embodiments of the present invention will be described.

The optical path converting member can be manufactured, for example, by a known injection molding method and the like.

Specifically, for example, when the material is an optical glass used in an optical application (softening point temperature: about 400° C. to about 800° C.), or a low melting point glass (softening point temperature: about 200° C. to about 500° C.), the glass material is fused by heating to a higher temperature than the softening point temperature by about 150° C. to about 250° C.

Then, the fused glass is poured into a die (the upper die and the lower die are in combined state), and then cooled so that the optical path converting member can be manufactured.

Out of the two glass materials, the low melting point glass having a lower processing temperature is preferred.

Moreover, when the material of the optical path converting member is a thermoplastic resin used in an optical application such as polycarbonate resin (softening point temperature: about 130° C. to about 140° C.) or acrylic resin (softening point temperature: about 70° C. to about 100° C.), the thermoplastic resin is fused by heating to a higher temperature than the softening point temperature by about 150 to about 250° C.

Then, the fused resin is poured into a die (the upper die and the lower die are in combined state), and then cooled so that the optical path converting member can be manufactured.

The optical path converting member can also be manufactured by heating press and the like.

Specifically, for example, when the material of the optical path converting member is an optical glass used in an optical application (softening point temperature: about 400° C. to about 800° C.), or a low melting point glass (softening point temperature: about 200° C. to about 500° C.), the glass material is heated almost to the softening point temperature, and pressed between the upper die and the lower die, and then cooled so that the optical path converting member can be manufactured.

Moreover, when the material of the optical path converting member is a thermoplastic resin used in an optical application such as polycarbonate resin (softening point temperature: about 130° C. to about 140° C.) or acrylic resin (softening point temperature: about 70° C. to about 100° C.), the thermoplastic resin is heated almost to the softening point temperature, and pressed between the upper die and the lower die, and then cooled so that the optical path converting member can be manufactured.

Further, when the material of the optical path converting member is a thermosetting resin such as epoxy resin (thermal deformation temperature: about 50° C. to about 290° C.) or phenol resin (thermal deformation temperature: about 75° C. to about 125° C.), by heating to a temperature within a thermal deformation temperature range, and pressing between the upper die and the lower die, the optical path converting member can be manufactured.

The optical path converting member can also be manufactured by a stamping forming process in which the die is pressed to the softened glass or resin so as to transfer the die pattern.

The material of the die is not particularly limited as long as the specified conditions are satisfied, such as capable of processing at high surface precision, no deformation at a forming temperature, and the like, and specifically, the materials which may be used include WC as cemented carbide, SiC especially suited to use in high temperature conditions, and the like. Moreover, various types of SUS may be used depending on the pressing conditions or products to be formed.

As the WC, for example, WC with Co, Ni, Cr or the like as a binder, or in consideration of corrosion resistance, those in which a small amount of TiC, TaC or the like is further added and sintered, may be used.

When a die made of SiC is used, only the surface may be ground after sintering, or the surface pores may be filled by a CVD method or the like after sintering to further enhance the surface precision.

Here, other materials for the die include metals such as cemented carbide, Ni, Al, Ni alloy and Al alloy, ceramics such as GC (glassy carbon), and the like.

When a die is used, depending on the kind of the glass used as a material of the optical path converging member, a problem of fusing and sticking of the die and the glass may occur after carrying out forming processes one or plural times. In the event of such fusing and sticking of glass, the surface precision of the die declines, and the optical path converting member may not be manufactured exactly as designed, or production of the optical path converting member itself may become impossible.

To prevent fusing and sticking of glass to the die, it is desirable that the surface of the die be covered with a parting film. Materials of such parting film may include pure metals such as Cr, Ni, W, Pt, Ir, Au, or their alloys, carbide, carbon, TiCN, TiAlN, TiN, BN and the like.

Also, in the case where the optical path converting member is manufactured by using a thermoplastic resin or a thermosetting resin, such die coated with the parting film can be used. In this case, as the parting film, silicone may be applied on the die surface.

The optical path converting member may be manufactured by first manufacturing the lens and the optical path conversion mirror separately, and then bonding the two with an adhesive or the like, or by first manufacturing the reflection mirror, and then forming the lens portion directly on the reflection mirror by ink jet, a dispensing method or the like; however, it is particularly desirable to form the lens and the optical path conversion mirror integrally by injection molding or other methods.

By manufacturing the optical path converting member by injection molding and the like, deviation of positional accuracy of the lens and the optical path conversion mirror can be easily controlled to about 5 μm or less, and the transmission loss of the optical path converting member may be easily reduced, and moreover the bonding loss may be easily reduced when connecting the optical path converting member with other optical components such as optical waveguide.

The optical path converting member can also be manufactured by cutting out in a specified shape by machining.

The embodiments of the manufacturing method of the optical path converting member explained so far in the above relate to a method of manufacturing an optical path converting member having lenses provided on the entrance surface or the reflection surface of the optical path conversion mirror, and an optical path converting member having lenses provided inside the optical path conversion mirror is desirably manufactured in the following method.

For example, when the optical path converting member is manufactured in a shape as shown in FIG. 5J-1, the optical path members 590a, 590b forming the optical path converting member are manufactured individually by injection molding, die molding, press heating and the like as described above, and the both optical path members 590a, 590b are put in a box jig and, after matching the optical axes of the two members, the spacing of the two members is filled with an adhesive, and by curing the adhesive, the optical path members 590a, 590b are fixed by way of the adhesive, and the excess adhesive is removed by grinding so that the optical path converting member having the lenses provided inside the optical path conversion mirror is manufactured.

When the optical path converting member is manufactured in this method, the optical axes of the optical path members 590a, 590b can be matched by placing the light source so as to face the entrance surface of the optical path converting member, and disposing the light receiving device so as to face the exit surface of the optical path converting member, and the position can be matched by detecting the quantity of light.

The adhesive for bonding and fixing the optical path members 590a, 590b is, for example, the same adhesive as the adhesive for filling in the optical path for transmitting an optical signal in the multilayer print circuit board of the present invention described below. The adhesive preferred has a smaller refractive index than the optical path members.

The reflection surface of the optical path conversion mirror may be vapor-deposited with a metal such as aluminum, gold, silver, copper, titanium, and chromium/gold.

The metal deposition layer may be formed not only on the reflection surface, but also on other surfaces except the entrance surface and the exit surface.

When the optical path converting member is manufactured, a refractive index thereof is adjusted to a specified value.

In a specific method for adjusting the refractive index, for example, when the optical path converting member comprises a glass material, glass materials having different refractive indexes are mixed at a predetermined blending ratio and fused so that the refractive index can be adjusted. When the optical path converting member comprises a resin material, the same method as that used for adjusting the refractive index of the adhesive as mentioned below and the like can be used.

Next, the multilayer print circuit board according to embodiments of the present invention is described below.

In the multilayer print circuit board according to the embodiments of the present invention, usually, a solder resist layer is formed as the outermost layer of the substrate on which a conductor circuit and an insulating layer are formed and laminated on both sides.

Therefore, the following explanation relates to a multilayer print circuit board according to an embodiment in which a conductor circuit and an insulating layer are formed and laminated on both sides of a substrate, and a solder resist layer is formed as the outermost layer.

The conductor circuit and the insulating layer need not to be always formed and laminated on both sides, and the solder resist lay needs not to be always formed.

In the multilayer print circuit board according to the above-mentioned embodiment, the optical path converting member according to the embodiments of the present invention is disposed in the optical path for transmitting an optical signal.

Moreover, the optical path converting member is desirably disposed at the optical path for transmitting an optical signal with an adhesive transparent to transmission light. Here, being transparent to transmission light means having a transmittance of about 60%/mm or more.

It is desirable that other portion than the part where the optical path converting member is disposed in the optical path for transmitting an optical signal be filled with an adhesive.

The resin component of the adhesive is not particularly limited as long as the absorption in the communication wavelength band is small, and a thermosetting resin, a thermoplastic resin, a photosensitive resin such as a UV curing resin, and the like may be used, and among which a resin having thermosetting property and photosensitive property are desirably used. For example, when a UV curing resin is used, upon fixing the optical path converting member, some portion may not be exposed to UV light, and thus fixing may become insufficient, or when a thermosetting resin is used, upon trying to fix while adjusting the optical axis of the optical path converting member, it is hard to heat and fix while adjusting the optical axis, and thus fixing of the optical path converting member may become insufficient; whereas in the case of using a resin having thermosetting property and light setting property, after temporarily fixing by light (UV or the like) and then curing in an oven or the like, the optical path converting member may be securely fixed to a specified position more easily.

Specific examples of the resin composition include those including epoxy resin or acrylic resin as a main component.

Other resin components include polymers manufactured from polyolefin resin, polyimide resin, silicone resin, benzocyclobutene, and the like.

The adhesive desirably has a larger refractive index than the optical path converting member, and a commercially available adhesive which is adjusted to have a desired refractive index may be used. The refractive index may be adjusted, for example, by blending particles. The refractive index of the adhesive may also be adjusted, for example, by changing the ratio of H (hydrogen atom), D (deuterium atom), F (fluorine atom) or the like bonded to a functional group of an adhesive material, or by changing the blending ratio of the material of the same kind of which refractive index has been adjusted by changing the blending ratio of H, D, F or the like.

Examples of the commercially available adhesive products include Opto Dyne series manufactured by Daikin Industries, and an optical path bonding adhesive manufactured by NTT Advance Co.

The adhesive may contain, aside from the resin components, resin particles, inorganic particles, metal particles, and the like. By containing these particles, it is possible to match in the coefficient of thermal expansion among the optical path for transmitting an optical signal, the substrate, the insulating layer, the solder resist layer, etc.

Specifically, the coefficient of thermal expansion (CTE) of an epoxy resin substrate is at least about 10 ppm and at most about 20 ppm, the CTE of an optical path converting member containing a glass material is at least about 5 ppm and at most about 20 ppm, and the CTE of an optical path converting member containing a resin material is about 50 ppm or more (for example, at least about 60 ppm and at most about 80 ppm), and due to difference in the coefficient of thermal expansion of these materials, the adhesive may be cracked when fixing the optical path converting member, but occurrence of cracks may be more easily suppressed by blending particles in the adhesive, and matching the coefficient of thermal expansion with the other component members.

The particles are, for example, same particles as mixed in the lens mentioned above.

The particle size of the particles to be mixed in the adhesive is desirably (1) shorter than the communication wavelength light (for example, 0.85 μm), more desirably at least about 0.1 μm and at most about 0.8 μm, and most desirably in the range of about 0.2 to about 0.6 μm. In this range, transmission loss caused by the particles tends to be reduced, and the purpose of blending the particles is securely achieved more easily.

The particle size may be (2) about 0.2 μm in the lower limit and about 50 μm in the upper limit. However, if there are many particles having a small particle size, the viscosity tends to vary, making it difficult to prepare an adhesive at high repeatability; or if there are many particles having a large particle size, the fluidity is not sufficient, and the inside of the optical path for transmitting an optical signal may not be filled sufficiently, and hence the lower limit is preferably about 1 μm, and the upper limit is preferably about 20 μm.

When using a particle having a particle diameter within a range of (2), particles having a particle size larger than the communication wavelength may be contained, but the problem may be solved by using particles transparent to communication light and having substantially the same refractive index as the resin component.

Moreover, when disposing the optical path converting member, an adhesive having no particles may be used in the portion to become the optical path, and an adhesive containing particles (either transparent or not) may be used in other portions not becoming the optical path.

The lower limit of the content of the particles in the resin composition is desirably about 10% by weight, and the upper limit is desirably about 50% by weight. If the content of the particles is about 10% by weight or more, the particles may be more easily mixed, or if the content of the particles is about 50% by weight or less, it may become easier to be filled in the optical path for transmitting an optical signal. More desirably, the lower limit of the content of the particles in the resin composition is about 20% by weight, and the upper limit is about 40% by weight.

By adjusting the refractive index, viscosity, particle size property and the like of the adhesive in consideration of number, shape, fixing position of the optical path converting member to be disposed, the adhesive surely fixes the optical path converting member more easily, and furthermore it may become easier to be surely filled in the optical path for transmitting an optical signal.

In the case where the optical path converting member comprises a glass material, the ratio of the refractive index of the optical path converting member and the refractive index of the adhesive is desirably at least about 1.10 and at most about 1.35.

In the case where the optical path converting member comprises a resin material, the ratio of the refractive index of the optical path converting member and the refractive index of the adhesive is desirably at least about 1.10 and at most about 1.18.

Within the above mentioned ranges, it becomes easier to deal with high-speed transmission of an optical signal, or signal transmission through a relatively long optical circuit.

Specifically, for example, it may become easier to carry out an optical signal transmission at the transmission speed of 2.5 Gbs (signal wavelength 0.85 μm) with an optical transmission distance of about 20 cm or more.

When the ratio of the refractive index is 1.14 or more, optical transmission tends to be easily carried out even if the transmission speed is increased to 5 Gbs or 10 Gbs, or the transmission distance is further extended to about 50 cm to about 100 cm.

In the multilayer print circuit board formed with the optical circuit and the optical path for transmitting an optical signal, in optical signal transmission from the light emitting device to the light receiving device (light emitting device→optical path for transmitting an optical signal→optical circuit→optical path for transmitting an optical signal→light receiving device), the transmission loss tends to become large at the following positions. That is, (1) transmission loss in the optical circuit (usually about 0.5 dB/cm or less), (2) transmission loss in the optical path converting unit, and (3) optical coupling loss in the light emitting device or the light receiving device, and the optical path for transmitting an optical signal. For the optical circuit, an organic optical waveguide is often used from the viewpoint of easy production, low cost and the like, but in the organic optical waveguide, it tends to be difficult to improve the transmission loss of the optical waveguide itself.

In contrast, in the multilayer print circuit board according to the embodiments of the present invention, the desirable ratio of the refractive index of the optical path converting member and the adhesive for fixing the optical path converting member is defined in the above-mentioned range, within which the coupling loss of the above (2) and (3) should be reduced when the optical path converting member is disposed in the multilayer print circuit board.

When the ratio of the refractive index of the optical path converting member and the refractive index of the adhesive is about 1.10 or more, regardless of whether the optical path converting member comprises a glass material or a resin material, it is presumed that, when an optical path of about 20 cm or more (distance from the light emitting element and the light receiving element) is formed in the multilayer print circuit board, an optical signal may not be surely transferred in some cases. This is disadvantageous in the future when optical signal transmission will faster and longer.

On the other hand, the upper limit of the refractive index ratio depends on an ordinary refractive index of a glass material or a resin material.

That is, as the glass material for the optical path converting member, a glass material with a refractive index of about 1.5 to about 2.0 is usually available, and as the resin material for the optical path converting member, a resin material with a refractive index of about 1.4 to about 1.6 is usually available, and as the adhesive material for fixing the optical path converting member, an adhesive material with a refractive index of about 1.4 to about 1.6 is available, and therefore the upper limit of the refractive index ratio is defined as the desirable upper limit.

Of course, as the material for the optical path converting member, it is possible to use a glass material with the refractive index ratio of more than about 1.35, or a resin material with the refractive index ratio more than about 1.18; however, those materials are hardly available and, if available, those materials are disadvantageous from the viewpoint of cost.

If a resin material with the refractive index ratio of more than about 1.18 is used, the resin material is presumed to have a high viscosity and a low fluidity, and it is expected to be inconvenient when manufacturing an optical path converting member (the yield is low, the dimensional variations are large, and the like).

However, as the material for the optical path converting member, superiority of the glass material and the resin material cannot be simply compared, but when a glass material is used, the optical path converting member that can be manufactured has a wider range of a refractive index and thus the range of the above-mentioned refractive index ratio becomes larger, and therefore the degree of freedom in optical design of the multilayer print circuit board may be more easily widened. Moreover, since high precision manufacturing is possible by die molding, an optical path converting member excellent in dimensional precision may be more easily manufactured, dimensional variations may be more easily suppressed, and the transmission loss may be more easily decreased. On the other hand, when a resin material is used, as compared with the case of a glass material, the degree of freedom in optical design tends to be smaller, however it is easier to match the coefficient of thermal expansion among a substrate, an insulating layer (mainly made of resin material) and an adhesive for fixing the optical path converting member, and thus cracks due to difference in the coefficient of thermal expansion tend not to occur.

Therefore, as the material for the optical path converting member, a glass material or a resin material may be properly selected depending on the design of the multilayer print circuit board.

When the optical path converting member comprises a resin material, its refractive index is desirably set to at least about 1.38 and at most about 1.64.

If the refractive index of the resin material is about 1.38 or more, the resin material is soft even after curing treatment, and thus the optical path converting member tends not to get scratched, whereas if the refractive index is about 1.64 or less, it is not necessary to increase the content of silica particles and the like to increase the refractive index, and therefore, the content of particles may not be too high, the viscosity tends not to be high, the fluidity of the resin composition may not increase too much, and moldability of the optical path converting member tends not to be reduced.

The optical path converting member disposed in the multilayer print circuit board according to the embodiment of the present invention may be coated with a coupling agent on the surface of the optical path converting member, or may be plasma processing may be applied on the surface of the optical path converting member to enhance the adhesion with the adhesive.

In the optical path for transmitting an optical signal, in addition to the optical path converting member, an optical path member not having a reflection surface may be separately disposed.

Specific examples of the optical path member are briefly described below with reference to the drawings.

Figures 1, 6A:
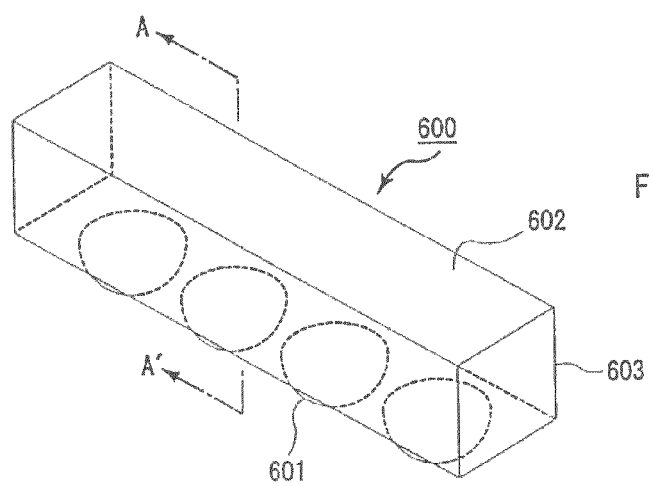
Figures 2, 6A:
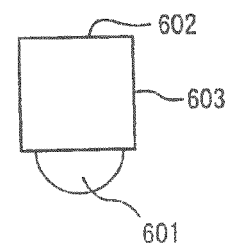

FIG. 6A-1 is a perspective view schematically showing an optical path member according to one embodiment of the present invention, and FIG. 6A-2 is a cross-sectional view of the optical path member according to the embodiment of the present invention.

Figures 1, 6B:
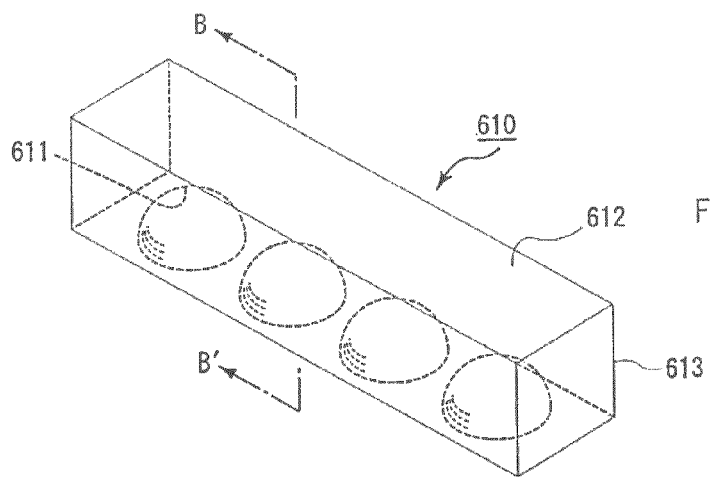
Figures 2, 6B:
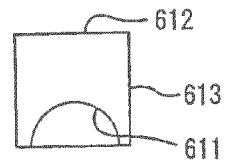

FIG. 6B-1 is a perspective view schematically showing an optical path member according to one embodiment of the present invention, and FIG. 6B-2 is a cross-sectional view of the optical path member according to the embodiment of the present invention.

In an optical path member 600 shown in FIGS. 6A-1 and 6A-2, four pieces of convex lens 601 are provided on one side of the rectangular pillar. In this optical path member 600, a side surface 602 opposite to the side surface where the lenses 601 are provided on the rectangular pillar body functions as an entrance surface or a reflection surface of an optical signal.

FIG. 6A-2 is a cross sectional view of FIG. 6A-1 along the line A-A'.

This optical path member 600 has a structure similar to the optical path member 590b forming the optical path converting member 590 shown in FIGS. 5J-1 and 5J-2.

The lenses to be provided on one side of the rectangular pillar body may be provided either on a side surface opposite to the optical path converting member, or on a side opposite to the side facing the optical path converting member when the optical path member is disposed in the multilayer print circuit board.

In an optical path member 610 shown in FIGS. 6B-1 and 6B-2, one side of a rectangular pillar is processed to have four pieces of concave lenses 611. In this optical path member 610, a side surface 612 opposite to the side surface where the lenses 611 are provided on the rectangular pillar functions as an entrance surface or a reflection surface of an optical signal. Here, FIG. 6B-2 is a cross sectional view of FIG. 6B-1 along the line A-A'.

The lenses to be provided on side of the rectangular pillar body.

The lenses to be provided on one side of the rectangular pillar body may be disposed either on a side surface opposite to the optical path converting member, or on a side opposite to the side facing the optical path converting member when the optical path member is disposed in the multilayer print circuit board.

The optical path member usable in the multilayer print circuit board according to the embodiments of the present invention is not limited to the examples shown in FIGS. 6A-1 and 6A-2 and FIGS. 6B-1 and 6B-2.

A conductor layer may be formed on the wall surface of the optical path for transmitting an optical signal.

By forming the conductor layer, irregular reflection of light on the wall surface of the optical path for transmitting an optical signal may be more easily reduced, and the transmissivity of the optical signal may be more easily enhanced. Moreover, the conductor layer may be more easily function as a through hole.

The multilayer print circuit board according to the embodiments of the present invention is described with reference to the drawings.

Figure 7:
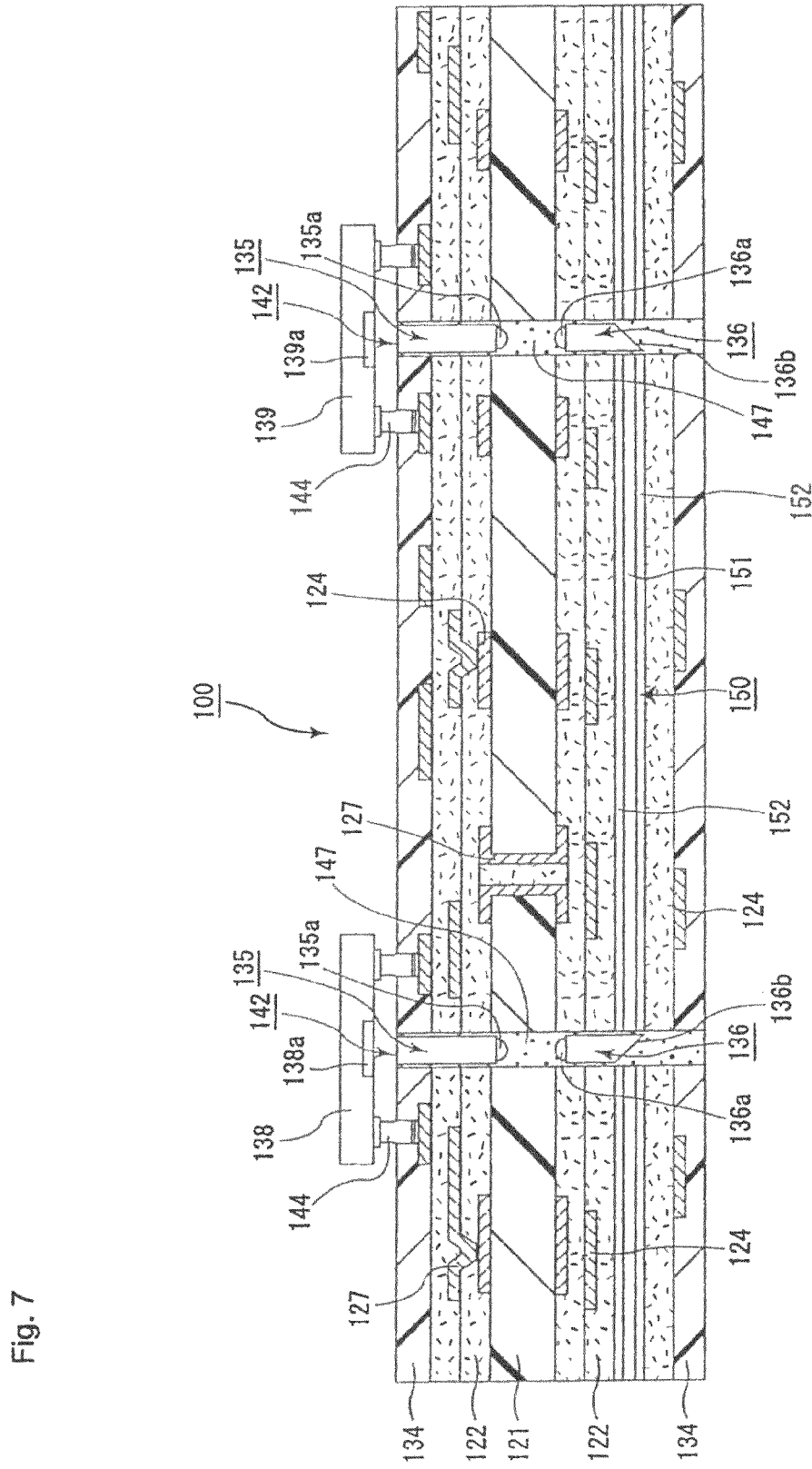
FIG. 7 is a cross-sectional view schematically showing one example of a multilayer print circuit board (device for optical communication) according to one embodiment of the present invention.

FIG. 7 is a cross-sectional view schematically showing one example of a multilayer print circuit board according to one embodiment of the present invention. Here, FIG. 7 shows the multilayer print circuit board in a state in which the optical elements are already mounted (in a state ready to function as device for optical communication).

As shown in FIG. 7, in the multilayer print circuit board 100 of the present invention, a conductor circuit 124 and a insulating layer 122 are formed and laminated on both sides of a substrate 121, and conductor circuits having the substrate 121 in between, and conductor circuits having the insulating layer 122 in between are electrically connected by non-penetrating via holes 127. Also, a solder resist layer 134 is formed as the outermost layer.

Moreover, an optical waveguide 150 including a core 151 and a clad 152 is formed between the insulating layers 122 at one side of the substrate.

In the multilayer print circuit board 100, an optical path for transmitting an optical signal 142 is provided so as to penetrate through the substrate 121, the insulating layer 122, the optical waveguide 150, and the solder resist layer 134.

In the optical path for transmitting an optical signal 142, an optical path converting member 136 and an optical path member 135 are disposed, and they are fixed by an adhesive filled in the optical path for transmitting an optical signal 142.

The optical path converting member 136 has a lens 136a and an optical path conversion mirror (reflection surface) 136b, and the optical path member 135 has a lens 135a.

Moreover, the optical path converting member 136 and the optical path member 135 are provided in the optical path for transmitting an optical signal so that the lenses may face each other, and further the optical path conversion mirror 136b of the optical path converting member 136 is mounted at a position so that an optical signal can be transmitted between the optical path for transmitting an optical signal 142 and an optical element 138.

In the optical path converting member 136, the side surface facing the optical waveguide 150 composes either the entrance surface or the exit surface, and the surface where the lens is provided composes the other one of the entrance surface and the exit surface.

Thus, in the multilayer print circuit board according to the embodiment of the present invention, the optical path converting member has the lenses provided either on the entrance surface or the exit surface, that is a side different from the side facing the optical circuit (optical waveguide), and further, in such a manner as to face these lenses, an optical path member having other lenses is desirably provided.

With this kind of configuration, transmission between the optical path converting member and the optical path member can be carried out by collimated light, and spread of transmission light may be more easily suppressed, and thus an excellent transmissivity of the optical signal is achieved, and by the design for transferring between the two members by collimated light, the allowance of position deviation between the optical path converting member and the optical path member is widened.

The optical path for transmitting an optical signal 142 is formed in a size capable of transmitting optical signals from the four-channel optical element, and the optical path for transmitting an optical signal 142 is formed in a collective through hole structure. Therefore, the optical path converting member 136 disposed in the optical path for transmitting an optical signal 142 has a structure capable of transmitting optical signals of four channels as shown in FIGS. 1A-1 and 1A-2. The optical path member 135 has a structure capable of transmitting optical signals of four channels as shown in FIGS. 6A-1 and 6A-2.

In the multilayer print circuit board having the structure shown in FIG. 7, the optical path converting member may be the optical path converting member shown in FIGS. 1C-1, 1C-2, 2D-1, 2D-2, 2E-1, 2E-2, 3F-1, 3F-2, 4H-1, 4H-2, 4I-1 and 4I-2, instead of the optical path converting member 500 shown in FIGS. 1A-1 and 1A-2. The optical path member may be the optical path member shown in FIGS. 6B-1 and 6B-2, instead of the optical path member 600 shown in FIGS. 6A-1 and 6A-2.

When disposing the optical path converting member as shown in FIG. 7, an optical path converging member integrally formed from an optical path member having a reflection surface and an optical path member not having a reflection surface, as shown in FIGS. 5J-1 and 5J-2 may be disposed.

On one side of the multilayer print circuit board 100, a four-channel light emitting device 138 and a four-channel light receiving device 139 are disposed via a solder connection portion 144 in such a manner that a light emitting unit 138a and a light receiving unit 139a each faces the optical path for transmitting an optical signal 142. On one side, an IC chip may be also mounted via the solder connection portion. In the multilayer print circuit board 100, solder bumps 137 may be formed on the solder resist layer on the side opposite to the side where the light receiving element and the light emitting element are mounted.

The shape of the optical path for transmitting an optical signal is not particularly limited as long as it is possible to dispose the optical path converting member, and examples of the shape include, a round pillar, a rectangular pillar, an cylindroid pillar, a plurality of round pillars arranged in parallel and connecting with adjacent round pillars at a part of the sides, a pillar-shaped body having a top surface and a bottom surface enclosed with a straight line and an arc, and the like.

When the shape of the optical path for transmitting an optical signal is designed to allow the transmission of optical signals with the optical elements of multiple channels, one optical path converting member capable of transmitting optical signals of multiple channels may be disposed, or plural optical path converting members may be disposed, or an optical path converting member may be disposed in each channel.

Moreover, the optical path for transmitting an optical signal may also have a collective through hole structure linking the channels, or may have an individual through hole structure independent for each channel, depending on the shape of the optical path converting member.

In the multilayer print circuit board according to the embodiment shown in FIG. 7, the optical path for transmitting an optical signal penetrating through the whole multilayer print circuit board (substrate, insulating layer, optical waveguide, and solder resist layer) is formed, but the optical path for transmitting an optical signal is not always required to penetrate through the whole multilayer print circuit board. However, considering the necessity of forming the optical path converting member and the optical path member, it is preferable that a through hole penetrating through the whole multilayer print circuit board be formed, for reasons of easier positioning and the like.

Figure 8:
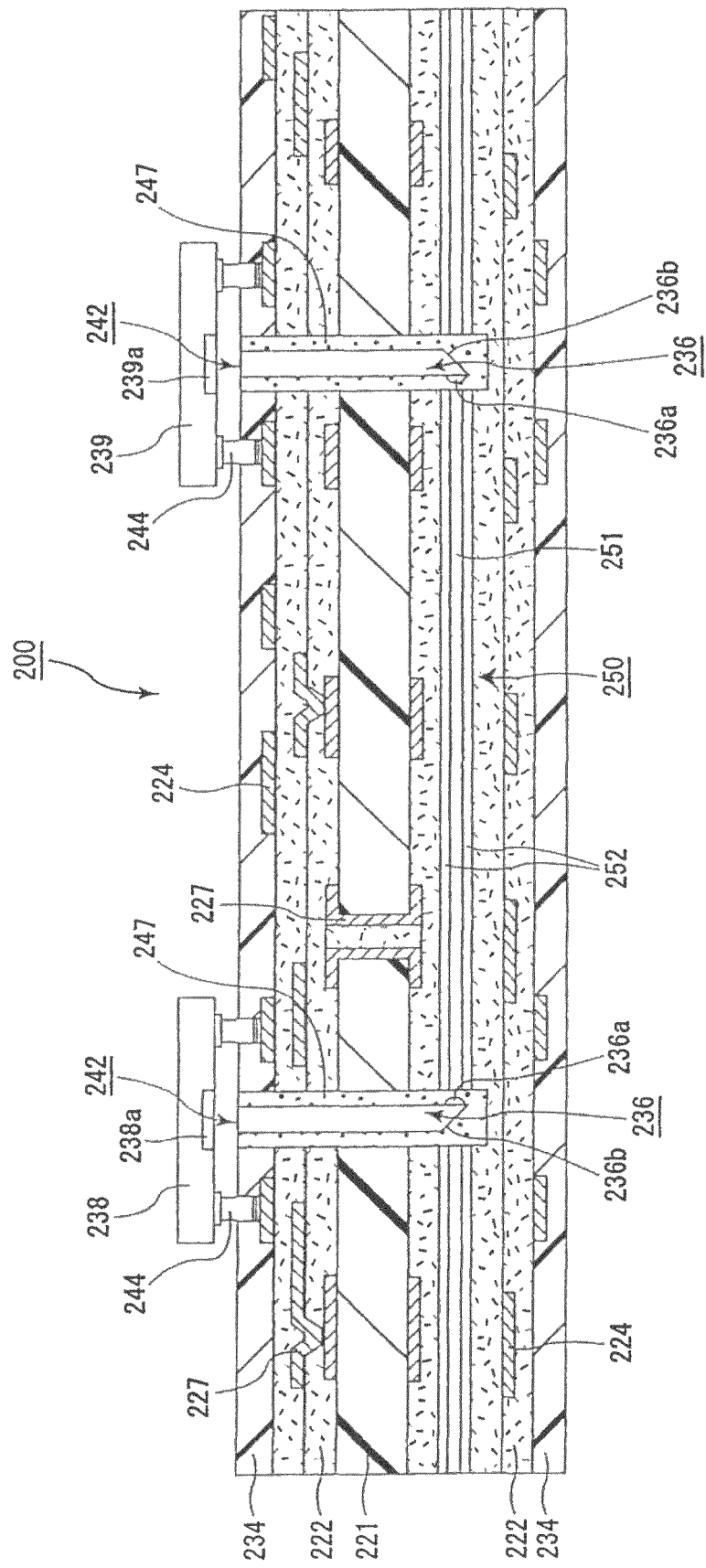
FIG. 8 is a cross-sectional view schematically showing one example of a multilayer print circuit board (device for optical communication) according to one embodiment of the present invention.

FIG. 8 is a sectional view schematically showing another embodiment of the multilayer print circuit board of the present invention which can be used as a package substrate. FIG. 8 shows the multilayer print circuit board in a state in which optical elements are already mounted (in a state ready to function as device for optical communication).

As shown in FIG. 8, in the multilayer print circuit board 200 of the present invention, a conductor circuit 224 and a insulating layer 222 are formed and laminated on both sides of a substrate 221, and conductor circuits having the substrate 221 in between, and conductor circuits having the insulating layer 222 in between are electrically connected by non-penetrating via holes 227. Also, a solder resist layer 234 is formed as the outermost layer.

Moreover, an optical waveguide 250 including a core 251 and a clad 252 is formed between the insulating layers 222 at one side of the substrate.

In this multilayer print circuit board 200, an optical path for transmitting an optical signal 242 is provided so as to penetrate through the substrate 221, part of the insulating layer 222, the optical waveguide 250, and the solder resist layer 234.

Moreover, optical path converting members 236 are disposed in the optical path for transmitting an optical signal 242, and they are fixed by an adhesive filled in the optical path for transmitting an optical signal 242.

The optical path converting member 236 is provided with a lens 236*a* and an optical path conversion mirror (reflection surface) 236*b*.

The optical path converting member 236 is mounted at a position capable of transmitting an optical signal between the optical path for transmitting an optical signal and the optical element by way of the optical path conversion mirror 236*b*.

Here, in the optical path converting member 236, the side surface facing the optical waveguide 250 composes either the entrance surface or the exit surface, and the side surface where the lens is provided forms the other one of the entrance surface and the exit surface.

Thus, in the multilayer print circuit board according to the embodiments of the present invention, desirably, the optical path converting member has the lenses provided either on the entrance surface or the exit surface which corresponds to the surface facing the optical circuit (optical waveguide).

In such configuration, as compared with the multilayer print circuit board comprising the optical path converting member and the optical path member shown in FIG. 7, the number of required parts is curtailed, and thus the manufacturing cost may be more easily reduced. Moreover, since positioning between the optical path converting member and the optical path member is not necessary, it becomes easier to perform positioning of the optical path converting member.

Furthermore, as described above, the optical path for transmitting an optical signal 242 is formed to penetrate through the substrate 221, part of the insulating layer 222, the optical waveguide 250, and one solder resist layer 234, not to penetrate through the whole multilayer print circuit board. When an optical path having this kind of structure is formed, a conductor circuit may be more easily formed in the insulating layer at a portion not penetrated by the optical path for transmitting an optical signal. Hence, the degree of freedom of design is high, which is advantageous for high-density wiring.

However, when comparing the optical path for transmitting an optical signal which penetrates through the whole multilayer print circuit board with the optical path for transmitting an optical signal which does not penetrate, from the viewpoint of filling property of the adhesive for fixing the optical path converting member, the optical path for transmitting an optical signal penetrating through the whole multilayer print circuit board is more preferable.

In the multilayer print circuit board shown in FIG. 8, the optical path for transmitting an optical signal does not penetrate through the whole multilayer print circuit board; however as mentioned above, the optical path for transmitting an optical signal may also penetrate through the whole multilayer print circuit board.

The optical path for transmitting an optical signal 242 is formed in a size capable of transmitting optical signals from a four-channel optical element, and the optical path for transmitting an optical signal having a collective through hole structure 242 is formed therein. Therefore, the optical path converting member 236 disposed in the optical path for transmitting an optical signal 242 has a structure capable of transmitting optical signals of four channels as shown in FIGS. 1B-1 and 1B-2.

In the multilayer print circuit board having the structure shown in FIG. 8, as the optical path converting member, the optical path converting member shown in FIGS. 1C-1, 1C-2, 2D-1, 2D-2, 2E-1, 2E-2, 3F-1, 3F-2, 3G-1 and 3G-2 may be used, instead of the optical path converting member 510 shown in FIGS. 1B-1 and 1B-2.

On one side of the multilayer print circuit board 200, a four-channel light emitting device 238 and a four-channel light receiving device 239 are disposed on the surface by interposing a solder connection portion 244 in such a manner that a light emitting unit 238*a* and a light receiving unit 239*a* each faces the optical path for transmitting an optical signal 242. Moreover, an IC chip may also be mounted by interposing the solder connection portion on one side. In the multilayer print circuit board 200, solder bumps 237 may also be formed on a solder resist layer located at a side opposite to the side where the light receiving device and the light emitting device are mounted.

FIGS. 7 and 8 show the multilayer print circuit board on which optical waveguides are formed as optical circuits; however, in the multilayer print circuit board according to the embodiment of the present invention, an optical fiber sheet may be formed as optical circuit.

Moreover, the optical path converting member disposed on the multilayer print circuit board according to the embodiments of the present invention is not limited to those shown in FIGS. 1A-1, 1A-2, 1B-1 and 1B-2, but may include the optical path converting member shown in FIGS. 1C-1, 1C-2, 2D-1, 2D-2, 2E-1, 2E-2, 3F-1, 3F-2, 3G-1, 3G-2, 4H-1, 4H-2, 4I-1 and 4I-2, and these optical path converting members may be combined with the optical path member 135 shown in FIG. 7, and may also include an optical path converting member having a form in which optical path members as shown in FIGS. 5J-1 and 5J-2 are combined together and lenses are provided inside.

Furthermore, in the embodiment of the multilayer print circuit board, one optical path converting member of an array shape, which corresponds to multiple channels capable of transmitting optical signals of plural channels, may be disposed, or one or a plurality of optical path converting member which corresponds to an optical signal of a single channel or one or a plurality of optical path converting member of an array shape may be disposed.

The multilayer print circuit boards according to the embodiments shown in FIGS. 7 and 8 are capable of transmitting signals within the multilayer print circuit board by using optical signals; however, the multilayer print circuit board according to the embodiment of the present invention may also have a configuration which can transmit signals between an optical element mounted on the multilayer print circuit board and other external substrate by using optical signals. In this case, for example, an end portion of the optical circuit is exposed to the side surface of the multilayer print circuit board, and the optical path converting member may be attached so that the optical signal may be transmitted toward the side surface of the multilayer print circuit board.

Next, a manufacturing method of a multilayer print circuit board of the present invention is explained step by step.

In the method for manufacturing the multilayer print circuit board according to the embodiment of the present invention, first, a multilayer circuit board where conductor circuits and insulating layers are formed and laminated on one side or both sides of a substrate is manufactured. The above-described multilayer circuit board may be manufactured in accordance with a semi-additive method, a full-additive method, a subtractive method, a collect layering method, a conformal method and the like. Here, an example of a manufacturing method for a multilayer circuit board using a semi-additive method is described.

(1) An insulating substrate is prepared as a starting material, and first, conductor circuits are formed on this insulating substrate. The insulating substrate is not particularly limited, and a glass epoxy substrate, a bismaleimide-triazine (BT) resin substrate, a copper covered multilayer board, a resin substrate such as an RCC substrate, a ceramic substrate such as an aluminum nitride substrate, a silicon substrate, and the like can be cited as examples.

The above-described conductor circuits can be formed by forming a solid conductor layer on the surface of the above-described insulating substrate in accordance with, for example, an electroless plating process, and after that, carrying out an etching process, and the like.

In addition, non-penetrating via holes for connecting the conductor circuits which sandwich the insulating substrate may be formed. In addition, a coarse surface may be formed on the surface of the conductor circuits in accordance with an etching process or the like, if necessary, after the formation of the conductor circuits.

(2) Next, an insulating layer having openings for via holes is formed on the substrate on which the conductor circuit is formed.

The insulating layer may be formed of a thermosetting resin, a photosensitive resin, a resin where a photosensitive group is added to a portion of a thermosetting resin, a resin compound including any of these and a thermoplastic resin or the like.

Specifically, for example, first, an uncured resin is applied using a roll coater, a curtain coater and the like, or a resin film is bonded through thermocompression so that a resin layer is formed, and after that a curing process is carried out if necessary, and openings for via holes are formed in accordance with a laser process, an exposure and development process or the like, and accordingly, an insulating layer can be formed.

In addition, it is possible to form a resin layer comprising the above-described thermoplastic resin by, for example, thermocompression bonding a resin mold in film form.

Examples of the thermosetting resin include an epoxy resin, a phenolic resin, a polyimide resin, a polyester resin, a bismaleimide resin, a polyolefin based resin, a polyphenylene ether resin, a polyphenylene resin, a fluorine resin and the like.

An acryl resin and the like can be cited as an example of the above-described photosensitive resin.

In addition, as for the resin where a photosensitive group is added to a portion of the above-described thermosetting resin, a resin gained by making the thermosetting group of any of the above-described thermosetting resins, methacrylic acid or acrylic acid react with each other in order to bring about acrylic conversion and the like can be cited as an example.

As for the above-described thermoplastic resin, a phenoxy resin, polyether sulfone (PES), polysulfone (PSF), polyphenylene sulfone (PPS), polyphenylene sulfide (PPES), polyphenylene ether (PPE) and polyether imide (PI) and the like can be cited as examples.

Moreover, the insulating layer may be formed by using a resin composite for the formation of a coarse surface.

As the resin composite for the formation of a coarse surface, those prepared by dispersing a substance which is soluble in a coarsening liquid comprising at least one member selected from acid, alkali and an oxidant, in an uncured, heat resistant resin matrix which is insoluble in a coarsening liquid comprising at least one member selected from acid, alkali and an oxidant can be cited as an example.

Here, with regard to the words "insoluble" and "soluble," for the sake of convenience, substances having a relatively high dissolution rate is referred to as "soluble," whereas those having a relatively low dissolution rate is referred to a "insoluble" in the case where those substances are immersed in the same coarsening liquid for the same period of time.

The heat-resistant resin matrix is not particularly limited as long as the shape of a rough surface is maintained when forming the rough surface on the insulating layer by using the roughening solution, and examples thereof include, for example, thermosetting resin, photosensitive resin, thermoplastic resin, a complex body of those examples, and the like.

The soluble substance is desirably at least one kind selected from inorganic particles, resin particles, and metal particles.

As the laser that is used in the laser process, a gas carbonate laser, an ultraviolet ray laser, an excimer laser and the like can be cited as examples. After the formation of openings for via holes, a desmearing treatment may be carried out if necessary.

In addition, in this process, penetrating holes for through holes may be formed, if necessary.

(3) Next, a conductor circuit is formed on the surface of the insulating layer including the inner walls of the openings for via holes.

That is, first, a thin film conductor layer is formed on the surface of the insulating layer through electroless plating, sputtering or the like, and then, a plating resist is formed on part of the surface, and after that, an electrolytic plating layer is formed in the portion where the plating resist is not formed. Next, the plating resist and the thin film conductor layer beneath this plating resist are removed, so that a conductor circuit (including a non-penetrating via hole) is formed.

As the material for the thin film conductor layer, examples thereof include: copper, nickel, tin, zinc, cobalt, thallium, lead and the like.

The desirable material is copper or those comprised of copper and nickel, in order to obtain excellent electrical properties and from an economical point of view.

Moreover, a coarse surface may be formed on the surface of the insulating layer before formation of the above-described thin film conductor layer.

The plating resist can be formed through exposure to light and development after a photosensitive dry film is attached, and the like.

The plating resist may be removed by using, for example, an alkaline solution and the like, and the thin film conductor layer may be removed using an etchant, such as a mixed liquid of sulfuric acid and hydrogen peroxide, sodium persulfate, ammonium persulfate, ferric chloride, cupric chloride or the like.

(4) Further, if necessary, the insulating layer and the conductor circuit may be formed and laminated by repeating the processes (2) and (3).

By conducting processes (1) to (4), a multilayer circuit board on which the conductor circuit and the insulating layer are formed and laminated at least on one side of the substrate can be manufactured.

When forming an optical circuit between insulating layers, after forming an insulating layer, the conductor circuit may be formed in accordance with the following method, and further an insulating layers may be formed and laminated.

First, a method of forming an optical waveguide as the optical circuit is explained.

The optical waveguide may be formed, when using an inorganic material such as silica glass as the material, by attaching the optical waveguide preliminarily formed in a predetermined shape by using an adhesive.

The optical waveguide comprising an inorganic material can be manufactured by forming a film of an inorganic material such as $LiNbO_3$ and $LiTaO_3$, by a liquid phase epitaxial method, a chemical vapor deposition (CVD) method, a molecular line epitaxial method or the like.

Examples of the method for forming an optical waveguide comprising a polymer material include (1) a method of forming an optical waveguide forming film preliminarily formed in a film-like shape on a parting film, and attaching the film on the insulating layer, (2) a method of sequentially forming and laminating a lower clad, a core and an upper clad on the insulating layer to form the optical waveguide directly on the insulating layer, and the like.

In the method for forming the optical waveguide, a same method may be applied when forming the optical waveguide on the parting film, or when forming the optical waveguide on the insulating layer or the like.

Specifically, a method using reactive ion etching, a process including exposure to light and development, a mold forming method, a resist forming method or a method combining these methods is used.

In the method using the reactive ion etching, (i) first, a lower clad is formed on a parting film, an insulating layer or the like (hereinafter, simply referred to as a parting film or the like), and (ii) next, a resin composite for a core is applied to the top of this lower clad, and furthermore, a curing process is carried out, if necessary, to provide a resin layer for forming a core. After that, (iii) a resin layer for forming a mask is formed on the resin layer for forming a core, and then a process including exposure to light and development is carried out on the resin layer for forming a mask, and thereby, a mask (etching resist) is formed on the resin layer for forming a core.

Next, (iv) reactive ion etching is carried out on the resin layer for forming a core to remove the resin layer for forming a core on the mask non-forming portion so that a core is formed on the lower clad. Finally, (v) an upper clad is formed on the lower clad so as to cover the core, and thus, an optical waveguide is provided.

This method using reactive ion etching provides easy forming of an optical waveguide having excellent dimensional reliability. In addition, this method is also excellent in reproducibility.

In the exposing and developing method, (i) first, a lower clad is formed on a parting film or the like, and (ii) a resin for forming a core composition is applied on the lower clad, and a half-curing process is carried out, if necessary, so that a layer of resin for forming a core composition is formed.

(iii) Next, a mask on which a pattern corresponding to the core forming portion is drawn is placed on the layer of resin composition for forming a core, and by carrying out an exposing and developing treatment, a core is formed on the lower clad. Lastly, (iv) an upper clad is formed on the lower clad so as to cover the core, and thereby an optical waveguide is manufactured.

Since the number of processes is small, this exposing and developing method may be preferably used for mass production of optical waveguides. In addition, due to few heating steps, stress hardly occurs in the optical waveguide.

In the die forming method, (i) first, a lower clad is formed on a parting film or the like, and (ii) a core forming groove is formed in the lower clad by die forming. (iii) The groove is filled in with the resin for forming a core composition by printing, and thereafter, a curing treatment is carried out so that a core is formed. Lastly, (iv) an upper clad is formed on the lower clad so as to cover the core, and thereby an optical waveguide is manufactured.

This die forming method is desirably applicable to mass production of optical waveguides, and optical waveguides with an excellent dimensional reliability may be more easily obtained. Also, this method is excellent in reproductivity.

In the resist forming method, (i) first, a lower clad is formed on a parting film or the like, and (ii) a resist forming resin composition is applied on the lower clad, and then an exposing and developing treatment is carried out so that a core forming resist is formed in the core non-forming portion on the lower clad.

(iii) Next, a resin for forming a core composition is applied on the resist non-forming portion on the lower clad, and (iv), after curing the resin for forming a core composition, the core forming resist is stripped to form a core on the lower clad. Lastly, (iv) an upper clad is formed on the lower clad so as to cover the core, and thereby an optical waveguide is manufactured.

This resist forming method is desirably applicable to mass production of optical waveguides, and optical waveguides with an excellent dimensional reliability may be more easily obtained. Also, this method is excellent in reproductivity.

In the case where an optical waveguide comprising a polymer material is formed using these methods, and an optical waveguide where particles are mixed into the core is formed, a mold forming method is desirable in comparison with a process including exposure to light and development. The reason for this is as follows.

That is to say, in the case where a trench for forming a core is formed in the lower clad through mold formation, and then a core is formed within this trench in accordance with a mold forming method for forming a core, it becomes possible for all of the particles mixed into the core to be contained in the core more easily, and as a result, the surface of the core becomes flat, providing excellent transmissivity of an optical signal. On the other hand, when the core is formed in a process including exposure to light and development, in the core after the development process, part of the particles may extrude from the surface of the core, or a recess may be formed in the surface of the core due to coming off of the particles, making the surface of the core uneven, and this unevenness may make it difficult for light to be reflected in a desired direction, and as a result of this, there may be a case where the transmission property of an optical signal is lowered.

When the conductor circuit is formed on the insulating layer forming the optical waveguide, desirably, an optical waveguide comprising a polymer material is directly formed on the insulating layer, and the thickness of the lower clad is desirably set to be thicker than the thickness of the conductor circuit.

This is because undulation due to presence of the conductor layer does not occur in the optical waveguide, and the signal transmissivity in the optical waveguide is excellent.

Furthermore, in the case where a resin composite for a clad is applied using a spin coater at the time of formation of the lower clad, a lower clad having a flat surface may be more easily formed by applying a large amount and adjusting the rotational speed so that a sufficient amount of the resin composite can be supplied into the space between the conductor circuits.

In addition, at the time of formation of the lower clad, a flattening process may be carried out, in such a manner that after the application of the resin composite for a clad, a film is mounted, and pressure is applied using a flat plate.

Here, the resin composite for an optical waveguide (resin composite for a clad, resin composite for a core) can be applied using a roll coater, a bar coater, a curtain coater and the like, in addition to a spin coater.

In the case where an optical fiber sheet is formed as optical waveguides, an optical fiber sheet that has been manufactured in advance may be attached to a predetermined location by interposing an adhesive material and the like.

Moreover, the optical fiber sheet can be formed by wiring a required number of optical fibers on a base film (cover resin layer) comprising a polyimide resin and the like using an optical fiber wiring apparatus, and after that, coating the surroundings of the optical fibers with a protective film (cover resin layer) comprising a polyimide resin and the like.
Here, a commercially available optical fiber sheet can also be used.

(5) Next, a solder resist layer is formed, if necessary. When forming the solder resist layer, an opening for forming a solder bump may be at the same time formed in the solder resist layer (an opening for mounting IC chip or optical element).

Specifically, for example, the solder resist layer can be formed by carrying out the following processes (a) and (b).

(a) First, a layer of a solder resist composition is formed as the outermost layer of the multilayer circuit board.

The layer of the solder resist composition can formed by using, a solder resist composition comprising, for example, polyphenylene ether resin, polyolefin resin, fluorine resin, thermoplastic elastomer, epoxy resin, polyimide resin, and the like. Besides, a commercially available solder resist composition may also be used.

The layer of the solder resist composition is also formed by compression bonding a film comprising the solder resist composition.

(b) Next, an opening for forming a solder bump is formed in the layer of the solder resist composition.

Specifically, for example, it can be formed by the exposing and developing process, laser processing, and the like.

By the processes (a) and (b), a solder resist layer having an opening for forming a solder bump can be formed.

When forming the solder resist layer, preliminarily, a resin film having an opening at a desired position is manufactured, and by attaching the resin film, a solder resist layer having an opening for forming a solder bump can be formed, or at process (a), a layer of a solder resist composition may be formed only in the portion other than the optical path opening portion.

When the opening for forming a solder bump is formed, a solder pad may be formed in this opening for forming a solder bump.

(b) Next, an optical path for transmitting an optical signal is formed.

The above-described through holes for an optical path are formed through, for example, a drilling process, a router process, a laser process and the like.

As the laser used in the above-described laser process, the same lasers as those that can be used for the creation of openings for the above-described via holes can be cited.

It is desirable in the above-described drilling process to use an apparatus with a function for recognizing recognition marks (alignment marks) which allows for correction of the location for processing for carrying out a drilling process by recognizing recognition marks on the multilayer printed circuit board (or solder resist layer).

When forming the optical path for transmitting an optical signal is formed in this process, the optical path for transmitting an optical signal may be formed to penetrate entirely through the substrate, the insulating layer, and the solder resist layer (see FIG. 7), or to penetrate only part of the substrate, the insulating layer, and the solder resist layer (see FIG. 8).

The forming position and size of the through hole for an optical path are not particularly limited, and may be properly selected in consideration of the design of the conductor circuit, or mounting position of the IC chip, the optical element or the like.

The through hole for an optical path is desired to be formed in every optical element such as the light receiving device and the light emitting device, and may also be formed in every signal wavelength.

In addition, after the creation of through holes for an optical path, a desmearing treatment may be carried out on the wall surface of the through holes for an optical path if necessary.

The above-described desmearing treatment can be carried out using, for example, a process using a permanganic acid solution, a plasma process, a corona process and the like. Here, resin residue, burrs and the like may be more easily removed from the inside of the through holes for an optical path by carrying out a desmearing treatment as described above, and thus, transmission loss of optical signals caused by diffuse reflection of light from the wall surface may be more easily prevented from increasing in the completed optical signal transmitting regions.

After forming the through hole for an optical path, if necessary, grinding treatment may be carried out on the wall surface of the through hole for an optical path.

The grinding treatment can be carried out by using, for example, a wall surface grinding drill having an almost the same shape as the through hole for an optical path, or having a smaller size than the through hole for an optical path. When using the wall surface grinding drill having a smaller size than the through hole for an optical path, the drill may be moved properly.

The grinding treatment may be applied on the wall surface of the through hole for an optical path, only in the portion where the optical circuit is exposed, or in the entire wall surface of the through hole for an optical path.

The wall surface grinding drill is, for example, a drill with a column shape having at least one flat side, with the grinding area coated with a known abrasive material, or coated with grinding paper or grinding cloth instead of the abrasive material.

Grinding may be processed by using abrasive materials containing alumina or other fine particles, water, or the like.

In the grinding treatment, desmearing may or may not be performed.

After forming the through hole for an optical path, before forming a conductor layer, or before filling an uncured resin composition in the following process, if necessary, the wall surface of the through hole for an optical path may be roughened in a rough surface forming process. This is because, the adhesion to the conductor layer or the resin composition can be enhanced.

The rough surface may be formed by using, for example, an acid such as sulfuric acid, hydrochloric acid, nitric acid; an oxidizing agent such as chromic acid, chromium sulfate, permanganate, and the like. A plasma processing or a corona processing may also be applied.

After forming the through hole for an optical path, if necessary, a conductor layer may be formed on the wall surface of the through hole for an optical path. The conductor layer is formed, for example, by electroless plating, sputtering, vacuum deposition, and the like.

(7) Next, an optical path converting member is disposed in the optical path for transmitting an optical signal. The optical path converting member may be disposed, for example, in the following method.

That is, the optical path converting member is inserted into the optical path for transmitting an optical signal using a suction jig, and then positioned and fixed with an adhesive to be disposed. When fixing with an adhesive, it is desirable to be fixed first temporarily and then fixed firmly.

The optical path converting member can be mounted by using a high-precision flip chip mounting apparatus in such a manner that the optical path converting member is attached using an alignment mark (recognizing mark) for mounting an optical element while positioning, and then fixed with an adhesive. In the case where the optical path converting member of the present invention is formed by die molding so that the lens and the optical path conversion mirror are formed integrally, since the distance from the center to the outline of the lens is precisely finished, the optical path converting member can be mounted while positioning by passive alignment.

Moreover, as in the case of the multilayer print circuit board according to the embodiment shown in FIG. 7, when mounting the optical path member together with the optical path converting member, desirably, the optical path converting member and the optical path member be preliminarily formed integrally by interposing an adhesive.

This is because, if the optical path converting member and the optical path member are mounted separately, it takes time in mounting. Or when fixing (or temporarily fixing) one member is fixed and then the other member is fixed, if an adhesive is applied between the two members, air may get in between the two members because one member is already fixed, and due to difference in the refractive index between air and the adhesive, in this case, the light may diffract in an undesired direction, and the transmission loss of the optical signal may be increased.

When integrally forming the optical path converting member and the optical member, for example, they may be integrally formed by first putting the optical path converting member and the optical path member in a box jig, filling in an adhesive between the two, curing the adhesive while adjusting the optical axis, and then an excess portion is removed by grinding.

From the viewpoint of enhancing the positioning precision of the optical path converting member, it is preferable to use an optical path converting member having a flange member as shown in FIGS. 3F-1, 3F-2, 3G-1 and 3G-2.

(8) Lastly, by printing a solder paste and performing a reflow process, solder bumps are formed. Here, the solder bumps may be formed before disposing the optical path converting member.

By carrying out those processes, the multilayer print circuit board of the present invention can be manufactured.

When manufacturing a multilayer print circuit board in an embodiment having an optical circuit formed between the substrate and the insulating layer or between the insulating layers as the multilayer print circuit board according to the embodiments of the present invention, for example, it can also be manufactured in the following manner.

That is, component members of the multilayer print circuit board such as a substrate on which a conductor circuit is formed, an insulating layer on which a conductor circuit is formed, and an optical circuit are separately manufactured and prepared, and these members are laminated through prepreg, then forming of the solder resist layer, followed by forming of the optical path for transmitting an optical signal, disposing of the optical path converting member and the like so that the multilayer print circuit board can be manufactured.

Instead of the insulating layer provided with a conductor circuit, a copper-clad prepreg may be laminated, and then etched to form a conductor circuit.

The multilayer print circuit board of the present invention has been described in the above; however, the multilayer print circuit board or the package substrate mounted on the multilayer print circuit board of the present invention may not necessarily comprise a substrate, and a conductor circuit and an insulating layer formed and laminated on both sides of the substrate, and may comprise a laminated body formed only by a conductor circuit and an insulating layer which are formed and laminated, or may comprise a substrate, and an a conductor circuit and an insulating layer formed and laminated on only one side of the substrate.

In other words, the above-mentioned multilayer print circuit board and package substrate may be formed to have an embodiment in which a substrate is present or not present (core less structure).

Next, the device for optical communication according to embodiments of the present invention is described.

In the device for optical communication according to the embodiments of the present invention, an optical element mounting package substrate or the like is mounted on the multilayer print circuit board according to the embodiments of the present invention. Here, the multilayer print circuit board according to the embodiments has been described above, and therefore its description is omitted here.

A light receiving element, a light emitting element and the like can be cited as examples of the above-described optical element.

They can be properly selected, taking the configuration and required properties of the above-described device for optical communication into consideration. Si, Ge, InGaAs or the like can be cited as the material of the above-described light receiving element. From among these, InGaAs is desirable from the viewpoint of having excellent photosensitivity.

A PD (photodiode), an APD (avalanche photodiode) and the like can be cited as examples of the above-described light receiving element.

An LD (laser diode), a DFB-LD (distributed-feedback laser diode), an LED (light emitting diode), an infrastructure or oxide-confinement VCSEL (vertical cavity surface emitting laser) and the like can be cited as examples of the light emitting element.

Taking the structure of the device for optical communication; or the demand characteristics, the light emitting element may be properly used.

With regard to the material of the above-described light emitting element, a compound of gallium, arsenic and phosphorous (GaAsP), a compound of gallium, aluminum and arsenic (GaAlAs), a compound of gallium and arsenic (GaAs), a compound of indium, gallium and arsenic (InGaAs), a compound of indium, gallium, arsenic and phosphorous (InGaAsP) or the like can be cited.

These may be used in different applications, taking the wavelength for communication into consideration, and in the case where the wavelength for communication is, for example, a band of 0.85 μm, it becomes possible to use GaAlAs, and in the case where the wavelength for communication is a band of 1.3 μm or a band of 1.55 μm, it becomes possible to use InGaAs.

In the device for optical communication of the present invention, it is intended to realize optical signal transmission in the substrate or optical signal transmission in a relatively long distance (as compared with distance within substrate, about 100 cm or less) between the substrates, in a simple structure and at low cost, and hence the transmission light to be used is desirably a transmission light of a communication wavelength in 0.85 μm band so as to be easy in positioning between optical coupling parts.

The optical element according to the embodiments of the present invention such as a light receiving element or a light emitting element may be a multi-channel optical element, and the number of channels thereof is not particularly limited.

Moreover, the above-described optical elements may be mounted through flip chip bonding or wire bonding.

In addition, upon taking the surface of the optical element where external electrodes are formed (hereinafter, referred to as the external electrode formed surface) in a plan view, the external electrodes may be locally formed in one of the two regions formed by equally dividing the planar shape with a center line.

In the case where the external electrodes are unevenly distributed in this manner, the above-described optical element may be more easily connected to a driving IC or an IC chip such as an amplifier IC that is mounted on the optical element, the package substrate and the substrate for a mother board via linear conductor circuits having the same length, and as a result, the system becomes excellent in the freedom of design, and skew (shifting of a signal) may be more easily suppressed, and thus, the system becomes excellent in its reliability in terms of the transmission of an optical signal.

In addition, in the case where the external electrodes are unevenly distributed, it is desirable for level maintaining members to be formed in the other region on the opposite side of the region where the external electrodes are formed with the center line in between on the above-described external electrode formed surface.

In particular, in the case where the above-described optical element is a kind that is mounted with the face facing downwards through flip chip bonding, it is desirable for dummy electrodes or level maintaining members to be formed. This is because the optical element inclines at the time of mounting, and the optical signal sometimes fails to be transmitted in the case where the level maintaining members or the like are not formed.

Here, the above-described dummy electrodes have the same configuration as the above-described external electrodes, except that no current flows through them due to the design of the optical element.

An embodiment of the device for optical communication of the present invention will be described below with reference to the drawings.

Here, the explanation will be given with reference to FIG. 7 and FIG. 8 used for describing the embodiment of the multilayer print circuit board of the present invention. FIG. 7 and FIG. 8 show the embodiment of a multilayer print circuit board on which an optical element is mounted (that is, the device for optical communication).

The structure of the embodiment of the multilayer print circuit board shown in FIG. 7 and FIG. 8 has been already described above, and thus its description is omitted here.

In the multilayer print circuit board on which the four-channel light emitting device 138 and the four-channel light receiving device 139 of four channels shown in FIG. 2 are mounted (device for optical communication), it may become possible to transmit optical signals from the light emitting device 138 to the optical receiving device 139 through an optical path for transmitting an optical signal 142 (including optical path converting member 136 and the optical path member 135) and the optical waveguide 150. Here, since the optical path converting member is disposed in the optical path for transmitting an optical signal, it becomes possible to surely transmit the optical signal from the light emitting device to the light receiving device.

In the device for optical communication of this kind on which a multichannel array element is mounted, the diameter of the optical path converting member disposed in the optical path for transmitting an optical signal may be determined properly depending on a pitch between channels of the array element and, for example, when using an array element with a pitch of 250 μm, the above-mentioned diameter is desirably at least about 100 μm and at most about 240 μm, and more desirably at least about 180 μm and at most about 230 μm. In the case of an array device with a pitch of 500 μm, for example, the diameter is desirably at least about 100 μm and at most about 490 μm, and more desirably at least about 180 μm and at most about 480 μm.

In the multilayer print circuit board shown in FIG. 8 on which the four channel light emitting device 238 and the four channel light receiving device 239 are mounted (device for optical communication), similarly, optical signals from the light emitting device 238 may be transmitted to the optical receiving device 239 through the optical path for transmitting an optical signal 242 (including optical path converting member 236) and the optical waveguide 250. Here, since the optical path converting member is disposed in the optical path for transmitting an optical signal, it becomes possible to surely transmit the optical signals from the light emitting device to the light receiving device.

The desired lens diameter of the optical path converting member disposed in the device for optical communication according to the embodiment in FIG. 8 is the same as the described above.

In the device for optical communication according to the embodiment of the present invention, optical and electrical signal conversion may be more easily carried out in the light emitting element mounted at a position close to the IC chip, and therefore, due to the short transmission distance of the electrical signal, reliability of signal transmission becomes excellent, and it may become easier to deal with a high speed communication.

In the device for optical communication, when the solder bump 144 is formed at the solder resist layer 134 by interposing a metal plating layer, it becomes possible to be connected to another external substrate electrically by interposing this solder bump.

In the device for optical communication according to the embodiment of the present invention, optical and electrical signal conversion may be more easily carried out in the light emitting element mounted at a position close to the IC chip, and therefore, due to the short transmission distance of the electrical signal, reliability of signal transmission becomes excellent, and it may become easier to deal with a high speed communication.

In the device for optical communication according to the embodiments of the present invention which has been described with reference to FIG. 7 and FIG. 8, the optical elements are mounted on the multilayer print circuit board according to the embodiment of the present invention; however, the device for optical communication according to the embodiment of the present invention may also have a configuration in which a package substrate having an optical element mounted thereon is mounted on the multilayer print circuit board.

Figure 9:
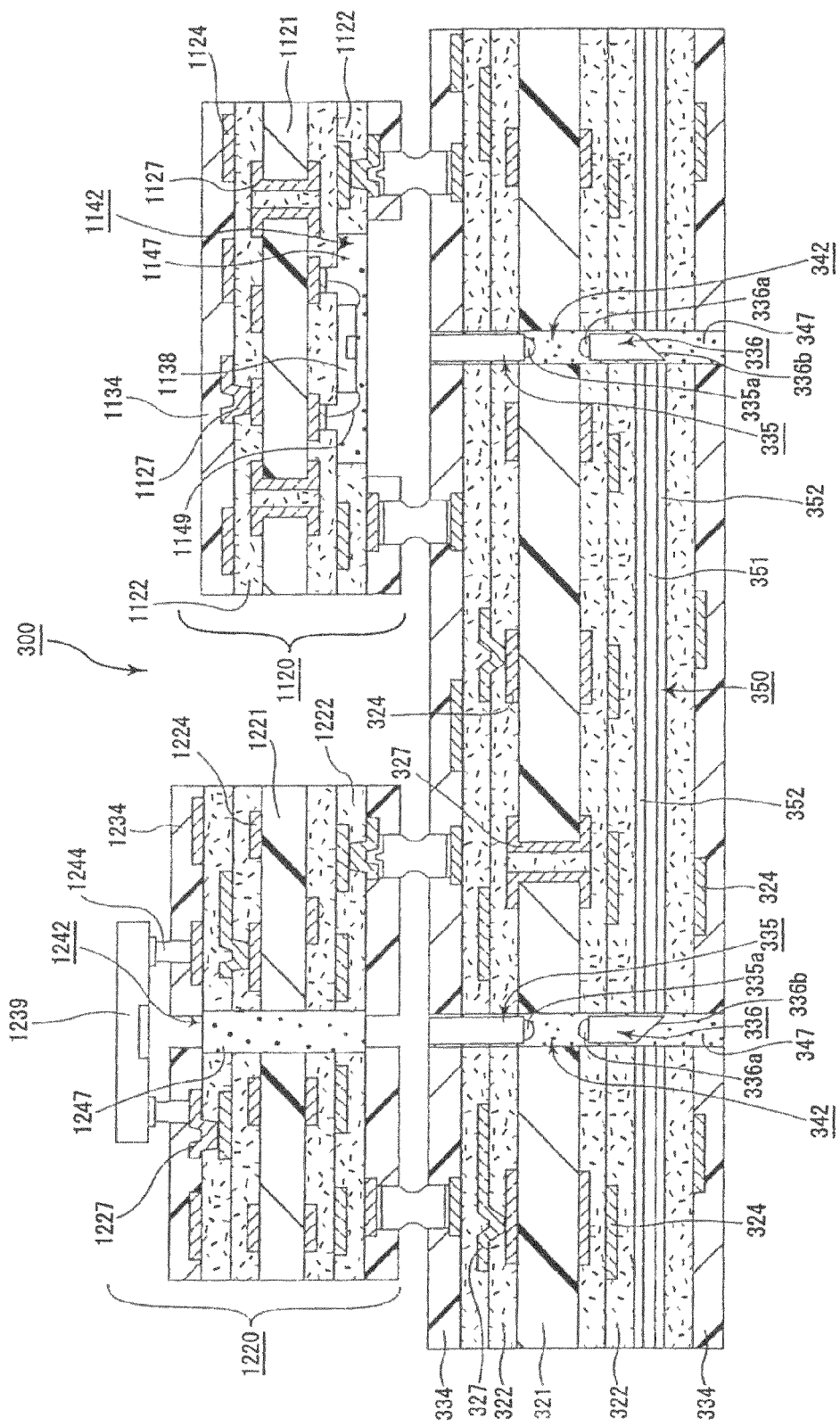
FIG. 9 is a cross-sectional view schematically showing one example of the device for optical communication according to one embodiment of the present invention.

Specifically, for example, an embodiment shown in FIG. 9 may be exemplified.

FIG. 9 is a cross-sectional view schematically showing one example of the device for optical communication according to the embodiment of the present invention.

The device for optical communication in FIG. 9 has almost the same structure as the device for optical communication in FIG. 7, except that a package substrates having an optical element mounted thereon is mounted instead of the optical elements.

That is, instead of the light emitting device 138, a package substrate 1120 having a light emitting device 1138 mounted thereon is mounted, and instead of the light receiving device 139, a package substrate 1220 having a light receiving device 1239 mounted thereon is mounted.

The package substrate 1120 comprises a substrate 1121; a conductor circuit 1124 and an insulating layer 1122 laminated on both sides of the substrate 1121; and a solder resist layer 1134 formed as an outermost layer, and in part of the insulating layer and the solder resist layer, an optical path for transmitting an optical signal 1142 having a concave shape is formed. Moreover, the light emitting element 1138 is mounted inside the optical path for transmitting an optical signal 1142 by wire bonding.

Further, the package substrate 1220 comprises a substrate 1221; a conductor circuit 1224 and an insulating layer 1222 laminated on both sides of the substrate 1221; a solder resist layer 1234 formed as an outermost layer, an optical path for transmitting an optical signal 1242 penetrating through the substrate, the insulating layer and the solder resist layer, and the light receiving device 1239 mounted thereon. Moreover, part of the optical path for transmitting an optical signal 1242 is filled in with a resin composition 1247.

In the device for optical communication shown in FIG. 9, a package substrate having an optical path for transmitting an optical signal in a concave shape is mounted as a package substrate for mounting a light receiving document, and a package substrate having an optical path for transmitting an optical signal penetrating through the whole multilayer print circuit board is mounted as a package substrate for mounting a light emitting element; however, the package substrates which may be mounted on the device for optical communication of the present invention are not limited to the above-mentioned combination, and both of the light receiving element and the light emitting element may be mounted on the package substrate having an optical path for transmitting an optical signal in a concave shape, or both of the light receiving element and the light emitting element may be mounted on the package substrate having an optical path for transmitting an optical signal penetrating through the whole multilayer print circuit board.

Furthermore, the package substrate is not limited to the one shown in FIG. 9, and may be any package substrate as long as it has a configuration capable of transmitting a desired optical signal to the multilayer print circuit board.

Figure 10:
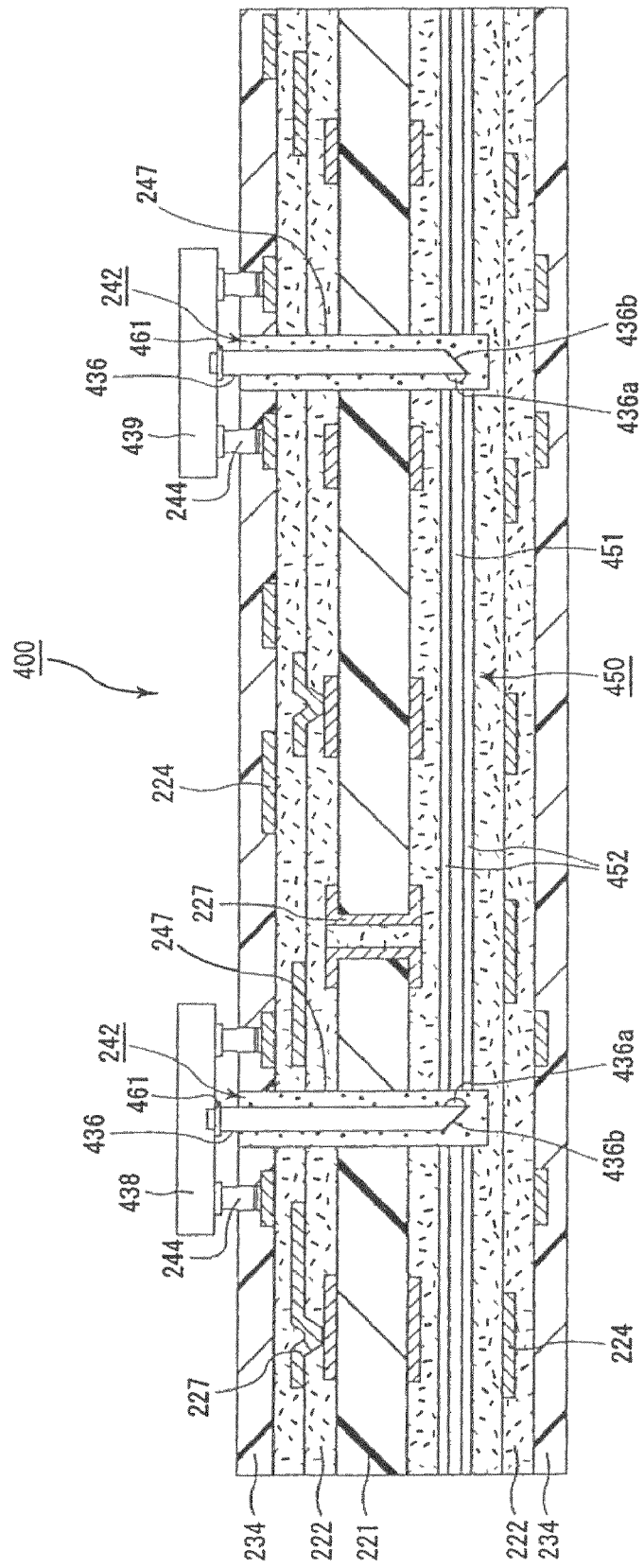
FIG. 10 is a cross-sectional view schematically showing one example of the device for optical communication according to one embodiment of the present invention.
Figure 11A:
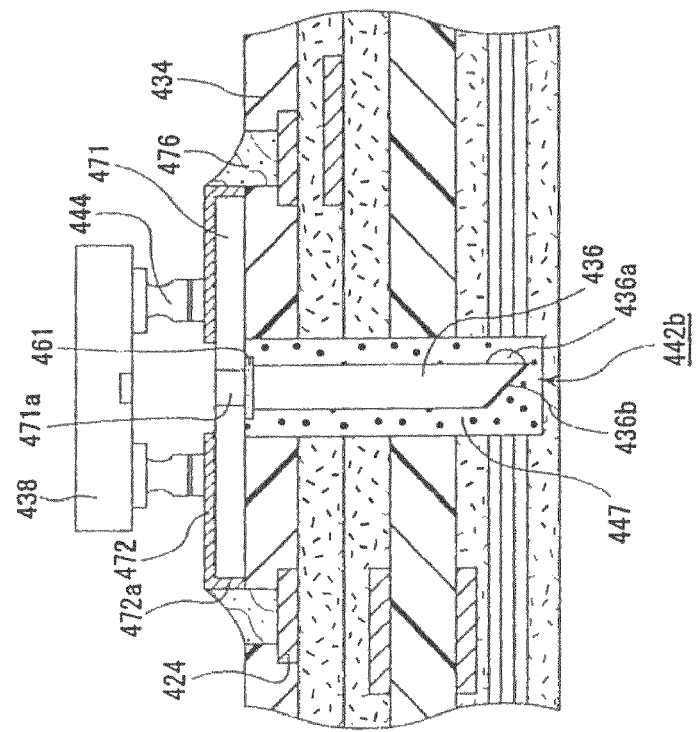
FIG. 11A is a partial cross-sectional view schematically showing one example of the device for optical communication according to one embodiment of the present invention.
Figure 11B:
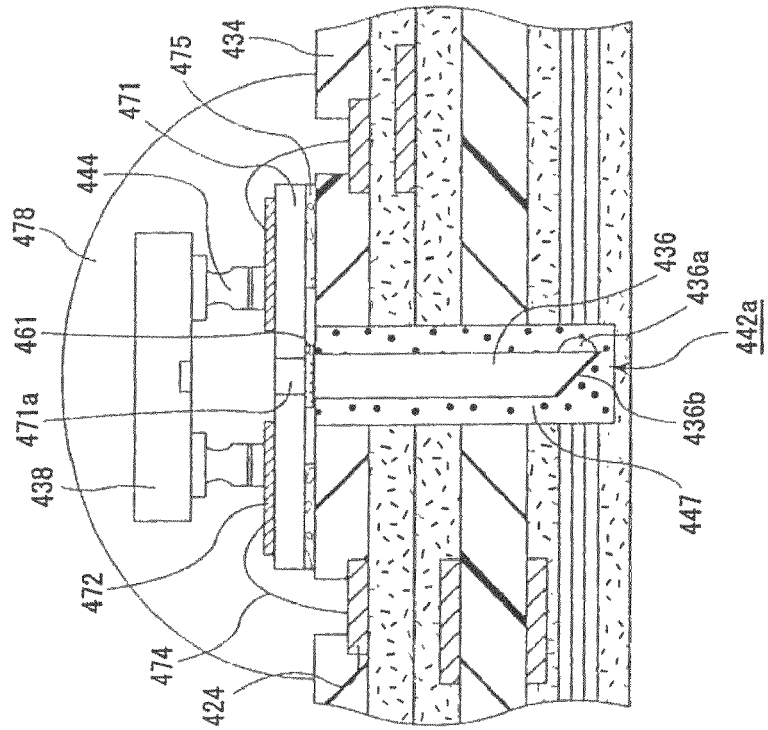
FIG. 11B is a partial cross-sectional view schematically showing one example of the device for optical communication according to one embodiment of the present invention.

The device for optical communication according to the embodiment of the present invention has a configuration in which an optical path converting member is disposed in the optical path for transmitting an optical signal, and FIGS. 10, 11A and 11B show the devices for optical communication each in an embodiment in which, upon mounting an optical path converting member, the optical path converting member is fixed to the optical path for transmitting an optical signal with an adhesive.

However, in the device for optical communication according to the embodiments of the present invention, upon mounting the optical path conversion member, the optical path conversion member may be fixed to the optical element or the sub-mount substrate.

The device for optical communication having this kind of configuration will be described below with reference to the drawings.

FIG. 10 is a cross-sectional view schematically showing the device for optical communication according to one embodiment of the present invention, and FIG. 11A and FIG. 11B each is a partial cross-sectional view schematically showing the device for optical communication according to one embodiment of the present invention.

In the device for optical communication 400 shown in FIG. 10, a light receiving device 439 and a light emitting device 438 are mounted on the multilayer print circuit board 200 shown in FIG. 8 via solder connection portion 244, and also an optical path converting member 436 having an almost the same shape as the optical path converting member shown in FIG. 8 is disposed.

The optical path converting member 436 is fixed to the optical elements (light receiving device 439 and light emitting device 438) with an adhesive 461 which is transparent to transmission light. At the opposite side of the optical path converting member 436 fixed to the optical elements, an optical path conversion mirror 436b is formed, and further a lens 436a is formed at the side facing an optical waveguide 450 of the optical path converting member 436.

Also, in this device for optical communication 400, it becomes possible to transmit an optical signal between the light emitting device 438 and the light receiving device.

Here, the portion of the optical path converting member 462 inserted in the multilayer print circuit board may also be fixed to the wall surface of the optical path for transmitting an optical signal with an adhesive.

The adhesive used here may be the same as that used in disposing the optical path converting member in the optical path for transmitting an optical signal.

In the device for optical communication according to the embodiments of the present invention, as shown in FIG. 9, when mounting the package substrate having the optical elements mounted thereon, the optical path converting member may be fixed to the package substrate with an adhesive, and more specifically, in the package substrate having the optical path for transmitting an optical signal in a concave shape (c.f. package substrate 1120 in FIG. 9), the optical path converting member may be fixed to an externally extruded portion of the optical path for transmitting an optical signal, or in the case of the package substrate having the optical path for transmitting an optical signal penetrating through the whole package substrate (package substrate 1220 in FIG. 9), the optical path converting member may be fixed to one end of the optical path for transmitting an optical element on the side opposite to the side where the optical element is mounted.

In addition, in providing an optical path conversion member in the device for optical communication according to the embodiments of the present invention, the optical path conversion member may be provided by interposing a submount substrate, as shown in FIGS. 11A and 11B.

In an example shown in FIG. 11A, a submount substrate 471 is fixed on a solder resist layer 434 by interposing an adhesive 475, and a light emitting element 429 is mounted on a solder 444 by interposing a pad 472 formed on this submount substrate 471. Then, the pad 472 is connected with a conductor circuit 424 in a multilayer print circuit board by a wire bonding 474.

In addition, a through hole for an optical path 471a is formed in the submount substrate 471, and an optical path conversion member 436 is fixed by interposing an adhesive 461 on the side opposite to the side where the light emitting element 438 is mounted on the submount substrate 471.

In addition, a portion is sealed with a resin material 478 transparent to a transmission light so as to cover the submount substrate 471, the light emitting element 438, and the wire bonding 474.

As thus described, in the device for optical communication according to the embodiments of the present invention, the optical path conversion member may be provided by interposing the submount substrate.

Here, a portion where the optical path conversion member 436 is inserted in the multilayer print circuit board may be fixed on the wall surface of an optical path transmitting region by interposing an adhesive.

In addition, in an example shown in FIG. 11B, a submount substrate 471 is mounted on a solder resist layer 434, and a light emitting element 438 is mounted on a solder 444 by interposing a pad formed on this submount substrate 471. Then, a pad is extended also on the side face of the submount substrate, and this pad 472 on the side face is connected with a conductor circuit 424 in the multilayer print circuit board by a solder 476. Here, the submount substrate 471 itself is fixed by the solder 476.

In addition, a through hole for an optical path 471a is formed in the submount substrate 471, and an optical path conversion member 436 is formed by interposing an adhesive 461 on the side opposite to the side where the light emitting element 438 is mounted on the submount substrate 471 is fixed.

In the device for optical communication of the present invention, the configuration in which the optical path conversion member is provided by interposing the submount substrate may be a configuration shown in FIG. 11B.

The above-described submount substrate is not particularly limited, and examples thereof include a glass substrate, a ceramic substrate, a resin substrate, and the like.

In addition, a through hole for an optical path is formed in a submount substrate illustrated, but this through hole for an optical path may not be formed in the case where the submount substrate itself is transparent to a transmission light. In addition, the through hole for an optical path may be filled in with a resin composite.

In addition, in FIGS. 11A and 11B, conduction between an optical element and a multilayer print circuit board is adjusted by wire bonding, and soldering that has been carried out on the side face of a submount substrate. In the case where the submount substrate is attached to the multilayer print circuit board, a pad for mounting the optical element and a pad connected via a through hole may be formed beforehand on the side opposite to the side where an optical element is mounted in the submount substrate, the multilayer print circuit board may be connected by interposing solder by using this pad using a soldering technique such as EGA and CSP, and the conduction between the optical element and the multilayer print circuit board may be adjusted.

Next, a manufacturing method of the device for optical communication according to embodiments of the present invention is explained.

The device for optical communication according to the embodiment of the present invention can be manufactured by manufacturing the multilayer print circuit board according to the embodiment of the present invention, and then mounting an optical element or a package substrate mounting an optical elements on this multilayer print circuit board via solder or the like.

Specifically, the optical element or the package substrate, and a substrate for a mother board on which solder bumps are disposed at predetermined positions and at predetermined directions so as to face one another, and then the both are connected by reflow.

After mounting the optical elements or the package substrates, if necessary, underfill may also be formed.

The device for optical communication of the present invention has been described in the above, and as the same with the multilayer print circuit board of the present invention, the multilayer print circuit board forming the device for optical communication of the present invention and the package substrate mounted on the multilayer print circuit board may not necessarily comprise a substrate, and a conductor circuit and an insulating layer formed and laminated on both sides of the substrate, and may comprise a laminated body formed only by a conductor circuit and an insulating layer which are formed and laminated, or may comprise a substrate, and an a conductor circuit and an insulating layer formed and laminated on only one side of the substrate.

In other words, the above-mentioned multilayer print circuit board and package substrate may be formed to have an embodiment in which a substrate is present or not present (core less structure).

EXAMPLES

In the following, the present invention is described in further detail.

Example 1

A. Manufacture of Optical Path Converting Member and Optical Path Member

Using optical glass having a transmittance of 99%/10 mm for light having a wavelength of 850 nm, a refractive index of 1.89 and a softening point temperature of 498° C., an optical path converting member and an optical path member were manufactured by an injection molding machine.

Specifically, the optical glass was melted at 650° C., and the molten glass was injected at an injection speed of 100 mm/sec into a mold made of SiC which is in a state of an upper die and a lower die joining together, and cooled to room temperature after injection was completed. The optical glass was taken out of the patterns, extra portions were ground off so that an optical path converting member 136 and an optical path member 135 were manufactured (see FIG. 7).

B. Manufacture of Resin Film for Insulating Layer

A bisphenol A type epoxy resin (equivalent of epoxy 469, Epikote 1001, made by Yuka Shell Epoxy K.K.) (30 parts by weight), cresol novolac type epoxy resin (equivalent of epoxy 215, Epiclon N-673, made by Dainippon Ink & Chemicals, Inc.) (40 parts by weight) and phenol novolac resin containing triazine structure (equivalent of phenolic hydroxy group 120, Phenolite KA-7052, made by Dainippon Ink & Chemicals, Inc.) (30 parts by weight) were heated and melted in 20 parts by weight of ethyl diglycol acetate and 20 parts by weight of a naphtha solvent while stirring, and 15 parts by weight of polybutadiene rubber with a terminal converted to epoxy (DENAREX R-45EPT, made by Nagase Chemicals Ltd.), 1.5 parts by weight of pulverized 2-phenyl-4,5-bis(hydroxymethyl) imidazole, 2 parts by weight of finely pulverized silica and 0.5 part by weight of a silicone based antifoaming agent were added thereto to prepare an epoxy resin composition.

The obtained epoxy resin composition was applied to the top of a PET film having a thickness of 38 μm using a roll coater, so that the thickness after drying became 50 μm, and then dried for ten minutes at 80° C. to 120° C. and thereby, a resin film for an insulating layer was manufactured.

C. Preparation of Resin Composition for Filling Through Holes

A bisphenol F type epoxy monomer (molecular weight: 310, YL983U, made by Yuka Shell Epoxy K.K.) (100 parts by weight), $SiO_2$ particles in spherical form (CRS 1101-CE, made by ADTEC Corp.) (170 parts by weight) of which the surface is coated with a silane coupling agent, the average particle diameter is 1.6 μm and the diameter of the largest particles is 15 μm or less, and a leveling agent (Perenol S4, made by San Nopco Co., Ltd.) (1.5 parts by weight) were put in a container and mixed through stirring, and thereby, a resin filling of which the viscosity is 45 Pa·s to 49 Pa·s at 23±1° C. was prepared. Here, 6.5 parts by weight of an imidazole curing agent (2E4MZ-CN, made by Shikoku Corp.) was used as a curing agent.

D. Manufacture of Device for Optical Communication (1) A copper pasted multilayer plate where copper foil 28 having a thickness of 18 μm is laminated on both sides of an insulating substrate 21 made of a glass epoxy resin or a BT (bismaleimide triazine) resin having a thickness of 0.4 mm was used as a starting material (see FIG. 12A). First, holes were drilled in this copper pasted multilayer plate, an electroless plating process was carried out, and etching was carried out so as to form a pattern, and thus, conductor circuits 24 and a non-penetrating via hole 27 were formed on both sides of the substrate 21.

(2) The substrate where the non-penetrating via hole 27 and the conductor circuits 24 were formed was washed with water and dried, and thereafter, a blackening process using a solution including NaOH (10 g/L), $NaClO_2$ (40 g/L) and $Na_3PO_4$ (6 g/L) for a blackening bath (oxidation bath) and a reduction process using a solution including NaOH (10 g/L) and $NaBH_4$ (6 g/L) for a reduction bath were carried out, and a coarse surface (not shown) was formed on the surface of the conductor circuits 24 including the non-penetrating via hole 27 (see FIG. 12B).

(3) After the preparation of the resin filling described in the above B, and within 24 hours after preparation thereof, a layer of a resin filling 30' was formed in a conductor circuits non-forming portion within the non-penetrating via hole 27 and on one side of the substrate 21, and also formed on the outer periphery portion of the conductor circuits 24, using the method described below.

That is to say, first, a squeegee was used to push the resin filling into the through hole, and after that, the resin filling was dried under conditions of 100° C. for 20 minutes. Next, a mask having openings in portions corresponding to the conductor circuits non-forming portion was placed on the substrate and the conductor circuits non-forming portions in a recess shape were formed were filled in with a resin filling using a squeegee, and the resin filling was dried under conditions of 100° C. for 20 minutes, and thereby, a layer of resin filling 30' was formed (see FIG. 12C).

(4) One side of the substrate after the above-described process (3) was ground through belt sander grinding using belt grinding paper #600 (made by Sankyo Rikagaku Co., Ltd.), so that no resin filling 30' was left on the surface of the conductor circuits 24 nor the land surface of the non-penetrating via hole 27, and then, buff grinding was carried out in order to remove scratches created as a result of the above-described belt sander grinding. This grinding sequence was carried out in the same manner on the opposite side of the substrate.

Next, heat treatment was carried out for one hour at 100° C., three hours at 120° C., one hour at 150° C. and seven hours at 180° C., and thereby, a resin filling layer 30 was formed.

In this manner, an insulating substrate was gained, where the surface layer portion of the resin filling material 30 formed in the non-penetrating via hole 27 and in the conductor circuits non-forming portions, and the surface of the conductor circuits 24 were flattened, the resin filling material 30 and the side surfaces of the conductor circuits 24 adhered firmly to each other via the coarse surface (not shown), and the inner wall surface of the non-penetrating via hole 27 and the resin filling material 30 adhered firmly to each other via the coarse surface (not shown) (see FIG. 12D). In this process, the surface of the resin filling material 30 and the surface of the conductor circuits 24 were made in the same plane.

(5) The above-described substrate was washed with water, and after acid degreasing, soft etching was carried out, and then, an etchant was sprayed onto both sides of the substrate so that the surface of the conductor circuit 24, and the land surface and inner wall of the non-penetrating via hole 27 were etched, and thereby, a coarse surface (not shown) was formed on the entirety of the surface of the conductor circuit 24. As the etchant, an etchant (MECetchBOND, made by MEC Co., Ltd.) including 10 parts by weight of a imidazole copper (II) complex, 7 parts by weight of glycolic acid and 5 parts by weight of potassium chloride was used.

(6) Next, a resin film for an insulating layer which is a little larger than the substrate manufactured in the above-described A was placed on the substrate, temporarily pressure-bonded thereto under such conditions that the pressure was 0.4 MPa, the temperature was 80° C. and the press-bonding time was 10 seconds, and the edges were trimmed, and after that, the film was pasted using a vacuum laminating apparatus in accordance with the following method, and thereby, an insulating layer 22 was formed (see FIG. 12E).

That is to say, the resin film for an insulating layer was permanently pressure-bonded to the substrate under such conditions that the degree of vacuum was 65 Pa, the pressure was 0.4 MPa, the temperature was 80° C. and the press-bonding time was 60 seconds, and after that, thermosetting was carried out at 170° C. for 30 minutes.

(7) Next, openings 26 for via holes having a diameter of 80 µm were formed in the insulating layer 22 through a mask having a thickness of 1.2 mm with through holes corresponding to the openings placed on the insulating layers 22, and using a $CO_2$ gas laser having a wavelength of 10.4 µm, under such conditions that the beam diameter was 4.0 mm, the laser was in a top hat mode, a pulse width was 8.0 the diameter of through holes in the mask was 1.0 mm, and the laser was shot once for each opening (see FIG. 13A).

(8) The substrate where the openings 26 for via holes were formed was immersed in a solution including 60 g/L of permanganic acid at 80° C. for 10 minutes, so that the epoxy resin particles on the surface of the insulating layers 22 were dissolved and removed, and thereby, a coarse surface (not shown) was formed on the surface of the substrate, including the inner wall surface of the openings 26 for via holes.

(9) Next, the substrate after the above-described process was immersed in a neutral solution (made by Shipley Co., Ltd.) and then washed with water.

Furthermore, a palladium catalyst was provided on the surface of this substrate on which a surface roughening treatment (depth of coarseness: 3 µm) was carried out, and thus, catalyst nuclei were attached to the surface of the insulating layers 22 (including the inner wall surface of the openings 26 for via holes) (not shown). That is to say, the substrate was immersed in a catalyst solution including palladium chloride ($PdCl_2$) and stannous chloride ($SnCl_2$) so that a palladium metal was deposited, and thus, a catalyst was provided.

(10) Next, the substrate was immersed in an electroless copper plating solution having the following composition, and thin film conductor layers (electroless copper plating films) 32 having a thickness of 0.6 µm to 3.0 µm were formed on the surface of the insulating layers 22 (including the inner wall surface of the openings 26 for via holes) (see FIG. 13B).

[Electroless Plating Solution]

| | |
|---|---|
| $NiSO_4$ | 0.003 mol/L |
| Tartaric acid | 0.200 mol/L |
| Copper sulfate | 0.030 mol/L |
| HCHO | 0.050 mol/L |
| NaOH | 0.100 mol/L |
| α,α'-bipyridyl | 100 mg/L |
| Polyethylene glycol (PEG) | 0.10 g/L |

[Conditions for Electroless Plating]

Solution temperature of 30° C. for 40 minutes

(11) Next, commercially available photosensitive dry films were pasted to the substrate on which thin film conductor layers (electroless copper plating films) 32 were formed, and the substrate was exposed to light of 100 mJ/cm² with a mask placed thereon, and then, a development process was carried out in a solution of 0.8% sodium carbonate, and thereby, plating resists 23 were provided (see FIG. 13C).

(12) Subsequently, the substrate was washed with water at 50° C. to carry out degreasing thereon, and then washed with water at 25° C., further washed with sulfuric acid, followed by electrolytic plating under the following conditions, and thereby electrolytic copper plating films 33 were formed in the plating resists 23 non-forming portions (see FIG. 13D).

[Electrolytic Plating Solution]

| | |
|---|---|
| Sulfuric acid | 2.24 mol/L |
| Copper sulfate | 0.26 mol/L |
| Additive | 19.5 ml/L |
| (Copperacid HL, made by Atotech Japan K.K.) | |

[Conditions for Electrolytic Plating]

| | |
|---|---|
| Current density | 1 A/dm² |
| Time | 65 minutes |
| Temperature | 22 ± 2° C. |

Figure 14A:
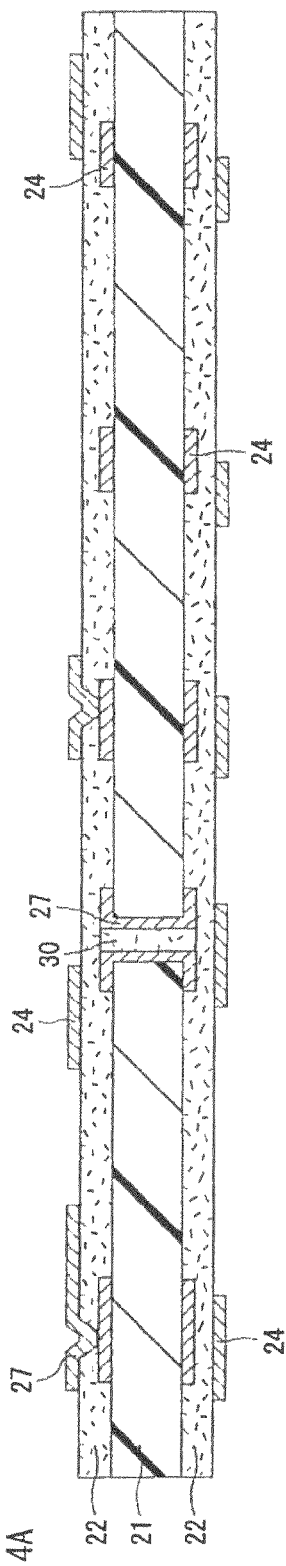
FIGS. 14A to 14C are cross-sectional views schematically showing a part of the method for manufacturing a multilayer print circuit board according to one embodiment of the present invention.

(13) Furthermore, the plating resists 23 were removed through peeling with 5% NaOH, and after that, the thin film conductor layers beneath these plating resists 23 were dissolved and removed through an etching process using a mixed solution of sulfuric acid and hydrogen peroxide, and thus, conductor circuits 24 (including non-penetrating via holes 27) formed of thin film conductor layers (electroless copper plating films) and electrolytic copper plating films were formed (see FIG. 14A). Here, the conductor circuits formed of thin film conductor layers and electrolytic copper plating films are shown in a form of one layer.

Figure 14B:
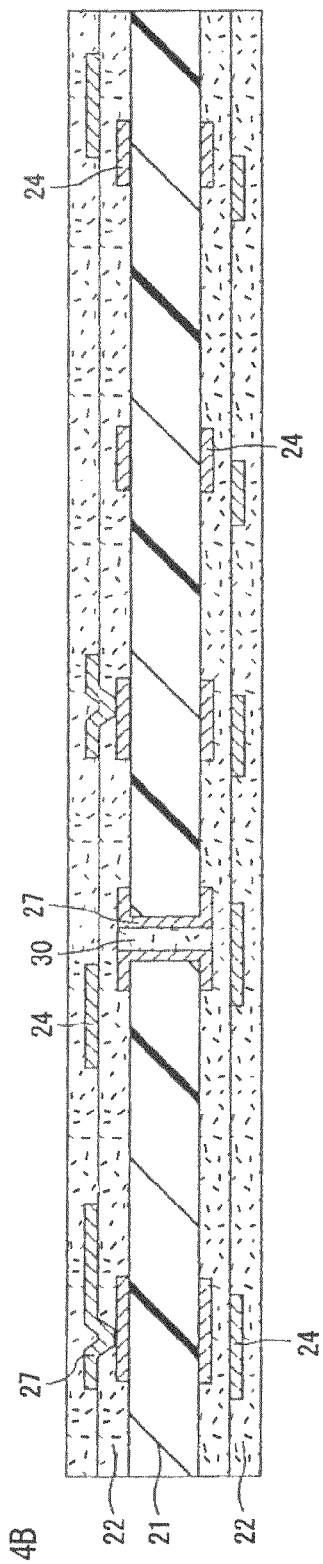

(14) Next, using the same etching solution as used in the above process (5), a rough surface (not shown) was formed on the surface of the conductor circuit 24, and in the same manner as in the above processes (6) and (7), an insulating layer 22 having an opening for a via hole (not shown) was laminated (see FIG. 14B).

Figure 14C:
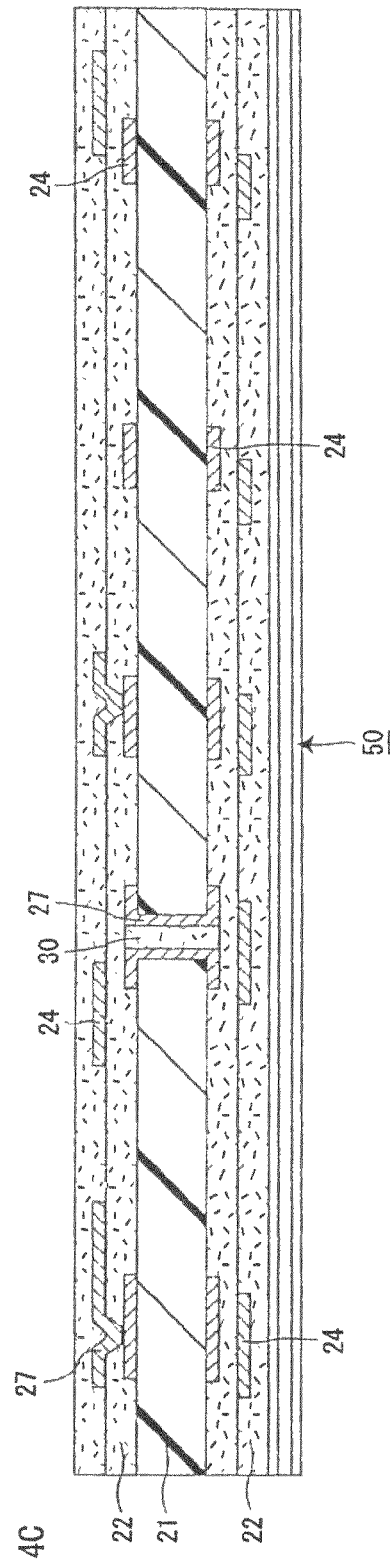

(15) Next, an optical waveguide 50 having four cores in parallel on one side (lower side in the figure) of the insulating layer was formed in the following method (see FIG. 14C).

First, an acrylic resin (refractive index 1.52, transmittance 91%/mm) as the resin for forming a core, and an acrylic resin as the resin for forming a clad (refractive index 1.50, transmittance 91%/mm) were prepared.

Next, the resin for forming a clad was applied onto one side face of the substrate by using a spin coater (10 seconds at 300 rpm and 2 seconds at 3000 rpm), prebaked for 10 minutes at 100° C., exposed at 2000 mJ, and postbaked for 1 hour at 150° C., and thus a lower clad 52 of 75 µm in thickness was formed.

Next, on the lower clad, the resin for forming a core was applied using a spin coater (10 seconds at 300 rpm and 2 seconds at 3000 rpm), prebaked for 10 minutes at 100° C., exposed at 1000 mJ, developed in a 1% TMAH aqueous solution, and postbaked for 1 hour at 150° C. and thus cores 51 of a width of 75 µm and a thickness of 75 µm were formed in four rows.

Further, the resin for forming a clad was applied by using a spin coater (10 seconds at 300 rpm and 2 seconds at 3000 rpm), prebaked for 10 minutes at 100° C., exposed at 2000 mJ, and postbaked for 1 hour at 150° C. so that an upper clad 52 of 50 µm in thickness was formed on the core so that the optical waveguides 50 comprising the core and the clad having a total thickness of 175 µm was prepared.

(16) By the same method as in the processes of (6) to (13), the insulating layer 22, the conductor circuit 24, and the via hole (not shown) were formed and laminated (see FIGS. 15A, 15B, 15C and 16A).

Further, in the same method as in the above process (5), oxidation and reduction treatment was carried out so that the conductor circuit 24 had a rough surface (not shown).

Figure 16A:
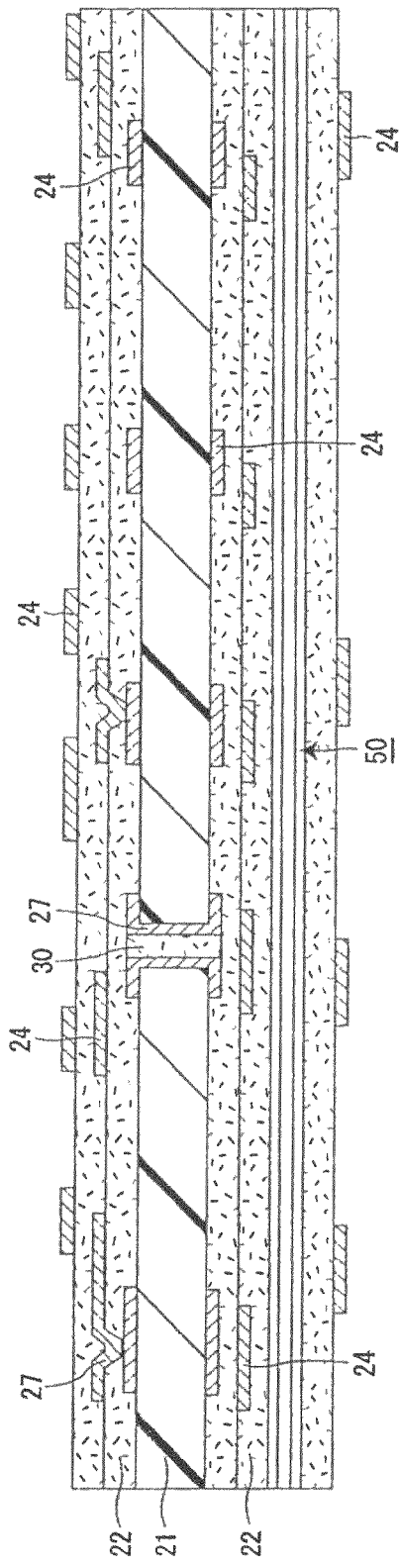
FIGS. 16A and 16B are cross-sectional views schematically showing a part of the method for manufacturing a multilayer print circuit board according to one embodiment of the present invention.
Figure 16B:
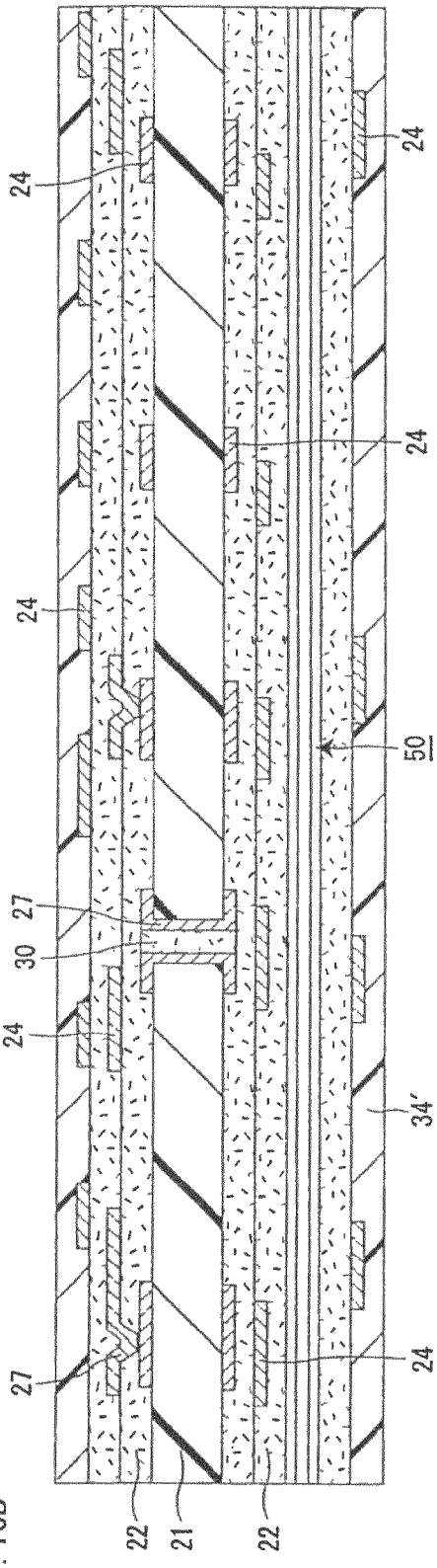

(17) Next, a solder resist composition (RPZ-1 manufactured by Hitachi Kasei Co.) was applied on the insulating layers at both sides of the substrate, and dried in the condition of 70° C. for 20 minutes and 70° C. for 30 minutes, and a solder resist composition layer 34' was formed (see FIG. 16B).

(18) Next, a photo mask having a thickness of 5 mm where patterns of openings for forming solder bumps were drawn was made to make contact with the layer 34' of a transparent solder resist composition on the IC chip mounted side, and then exposed to ultraviolet rays of 1000 mJ/cm$^2$, and a development process was carried out using a DMTG solution so that the openings were formed.

Furthermore, heat treatment was carried out under conditions of 80° C. for one hour, 100° C. for one hour, 120° C. for one hour and 150° C. for three hours, respectively, so that the layers of a solder resist composition cured, and thus, solder resist layers 34 having optical paths for transmitting an optical signal 42 and openings for forming solder bumps 48 having a predetermined shape were formed.

Figure 17A:
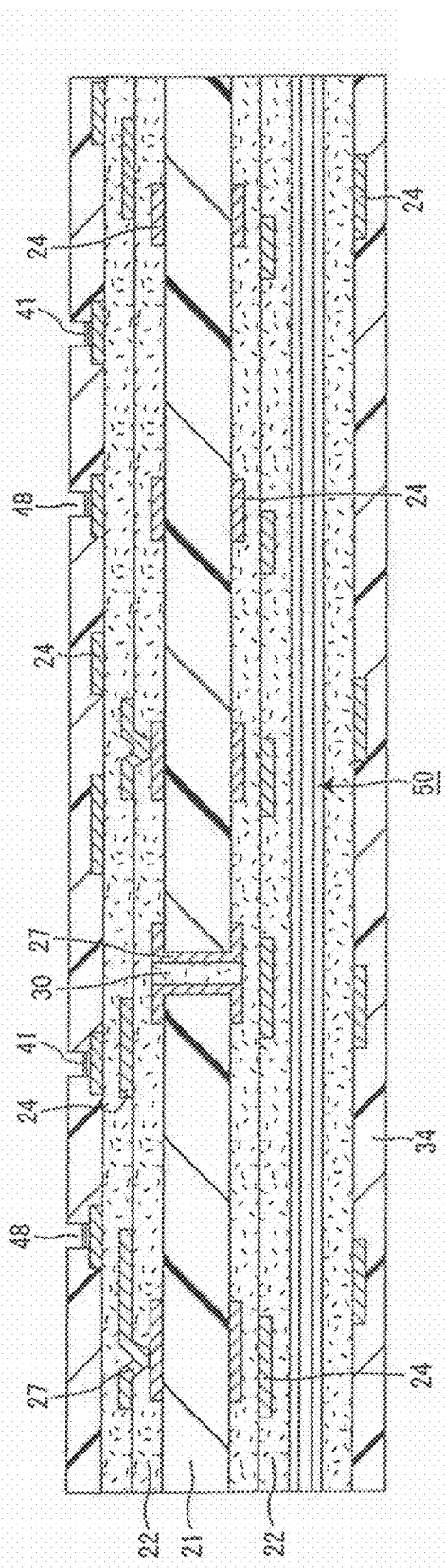
FIGS. 17A and 17B are cross-sectional views schematically showing a part of the method for manufacturing a multilayer print circuit board according to one embodiment of the present invention.

(19) After that, the substrate was immersed in an electroless nickel plating solution having a pH of 4.5 and including nickel chloride ($2.3 \times 10^{-1}$ mol/L), sodium hypophosphite ($2.8 \times 10^{-1}$ mol/L) and sodium citrate ($1.6 \times 10^{-1}$ mol/L) for 20 minutes, and thus, nickel plating layers having a thickness of 5 μm were formed in the openings for forming solder bumps 48. Furthermore, this substrate was immersed in an electroless gold plating solution including gold potassium cyanide ($7.6 \times 10^{-3}$ mol/L), ammonium chloride ($1.9 \times 10^{-1}$ mol/L), sodium citrate ($1.2 \times 10^{-1}$ mol/L) and sodium hypophosphite ($1.7 \times 10^{-1}$ mol/L) under conditions of 80° C. for 7.5 minutes, and thus, gold plating layers having a thickness of 0.03 μm were formed on the nickel plating layers for the formation of solder pads 41 (see FIG. 17A).

Figure 17B:
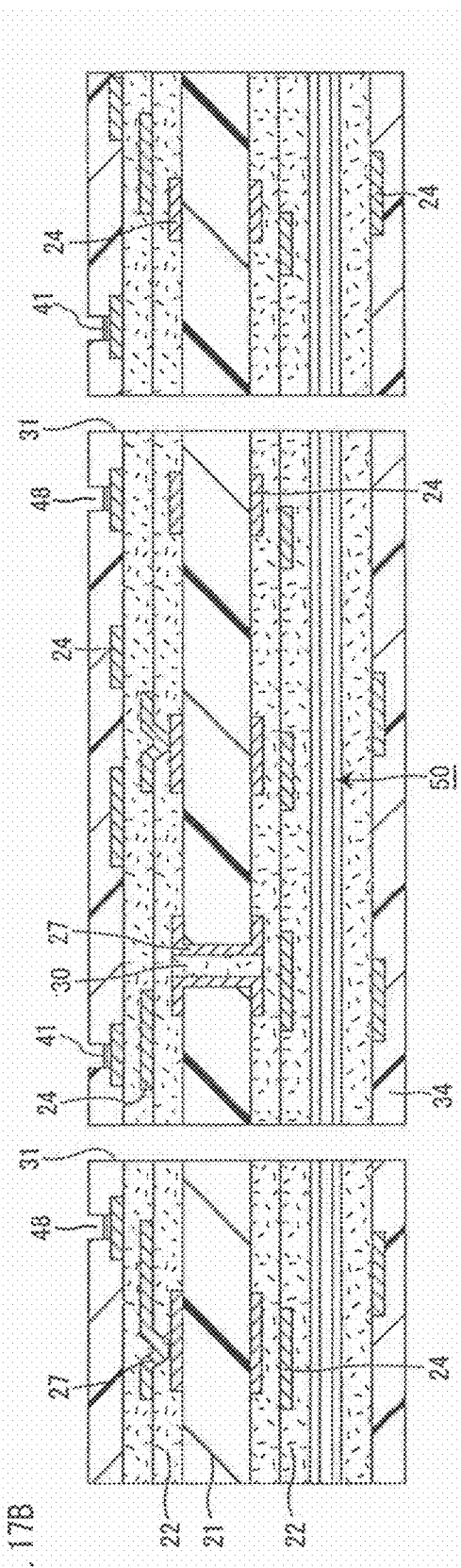

(20) Next, by drilling, a through hole for an optical path 31 (rectangular form (220 μm×1200 μm) with round corners in a plan view), substrate 21, the insulating layer 22, and the solder resist layer 34 was formed, and a desmearing treatment was carried out on the wall surface of the through hole for an optical path 31 (see FIG. 17B). In this case, the through hole for an optical path 31 having a collective through hole structure is formed.

(21) Next, while performing positioning, the optical path converting member 36 was installed in the through hole for an optical path 31 by using a suction jig, and then temporarily fixed by applying a UV curing type epoxy resin adhesive (refractive index 1.43, transmittance 90%/mm) on its periphery and irradiating UV light.

Positioning was performed in the following method in each through hole for an optical path (a through hole for an optical path on the side where the VCSEL is mounted in a later process, and a through hole for an optical path on the side where PD is mounted).

That is, first, in the through hole for an optical path at VCSEL side, an optical path converting member was inserted on the basis of the position of the pad for mounting the VCSEL, and light was irradiated to this optical path converting member and the light coming out through the optical waveguide was received by a light receiving device attached to the through hole for an optical path at the PD side so that the optical path converting member to be provided in the through hole for an optical path on the VCSEL side was positioned. Thereafter, an optical path converting member was inserted in the through hole for an optical path on the VCSEL side, and again light was irradiated from the VCSEL side, and by receiving the light through the optical path converting member inserted in the through hole for an optical path on the PD side, positioning of the optical path converting member provided in the through hole for an optical path at the PD side was performed.

In the same manner as above, the optical path member 35 was temporarily fixed in the through hole for an optical path 31, and thereafter the entire through hole for an optical path 31 was filled with the epoxy resin adhesive, and further heated for 1 hour at 150° C. so that the adhesive was completely cured (see FIG. 18A).

(22) Next, a solder paste was printed in an opening for forming a solder bump 48 formed in the solder resist layer 34 (see FIG. 18B), and a light emitting unit of the light emitting device was mounted while positioning and reflowing at 200° C. was performed so that the light emitting device and the light receiving device were mounted, and at the same time a solder bump 37 was formed in an opening for forming a solder bump 48.

Through those processes, a device for optical communication was obtained (see FIG. 7).

The light emitting device used herein was a four-channel VCSEL with a pitch of 250 μm which can be driven at 3.125 Gbps, and the light receiving device used herein was a four-channel PD with a pitch of 250 μm which can be driven at 3.125 Gbps.

The thickness of the whole multilayer print circuit board was 0.73 mm, and the distance from the surface side mounting the optical element of the multilayer print circuit board to the core was 0.6 mm.

Example 2

A. Manufacture of Optical Path Converting Member and Optical Path Member

A glass piece comprising optical glass having a transmittance of 99%/10 mm for light having a wavelength of 850 nm, a refractive index of 1.89 and a softening point temperature of 498° C. was prepared, and by pressing this glass piece using a die press, an optical path converting member and an optical path member in the same shape as in Example 1 were manufactured.

Specifically, the optical glass piece was heated to 500° C., and pressed by an upper die and a lower die made of SiC (pressure: 12 kN), and cooled to room temperature. Next, the glass piece was taken out of the patterns, and extra portions were ground off so that an optical path converting member and an optical path member were manufactured.

B. Manufacture of Device for Optical Communication

A device for optical communication was manufactured in the same manner as in the process D of Example 1, except that the optical path converting member and the optical path member manufactured in the above process A were used.

Example 3

A device for optical communication was manufactured in the same manner as in Example 1, except that, upon mounting the optical path converting member and the optical path member in the process corresponding to the process D (21) of Example 1, an adhesive was applied only to the side surfaces of the optical path converting member and the optical path member for mounting them.

In the device for optical communication manufactured in this example, the gap between the optical path converting member and the optical path member is filled in with air (refractive index: 1.0, difference in refractive index from optical path converting member: 0.89).

Example 4

A device for optical communication was manufactured in the same manner as in Example 1, except that, in the process corresponding to the process A of Example 1, the optical path converting member and the optical path member were manufactured by using optical glass having a transmittance of 99%/10 mm for light having a wavelength of 850 nm, a refractive index of 1.63 and a softening point temperature of 343° C., at a melting temperature of 550° C., and that, upon mounting the optical path converting member and the optical path member in the process corresponding to the process D (21) of Example 1, an adhesive was applied only to the side surfaces of the optical path converting member and the optical path member for mounting them.

In the device for optical communication manufactured in this example, the gap between the optical path converting member and the optical path member is filled in with air (refractive index: 1.0, difference in refractive index from optical path converting member: 0.63).

Example 5

A device for optical communication was manufactured in the same manner as in Example 1, except that, in the process corresponding to the process D (21) of Example 1, an adhesive having a refractive index of 1.38 and a transmittance of 90%/mm was used.

In the device for optical communication manufactured in this example, the difference in refractive index between the adhesive applied in the gap between the optical path converting member and the optical path member, and the optical path converting member was 0.51.

Example 6

A device for optical communication was manufactured in the same manner as in Example 1, except that, in the process corresponding to the process D (21) of Example 1, an adhesive having a refractive index of 1.44 and a transmittance of 90%/mm was used.

In the device for optical communication manufactured in this example, the difference in refractive index between the adhesive applied in the gap between the optical path converting member and the optical path member, and the optical path converting member was 0.45.

Example 7

A device for optical communication was manufactured in the same manner as in Example 1, except that, in the process corresponding to the process D (21) of Example 1, an adhesive having a refractive index of 1.38 and a transmittance of 90%/mm was used.

In the device for optical communication manufactured in this example, the difference in refractive index between the adhesive applied in the gap between the optical path converting member and the optical path member, and the optical path converting member was 0.32.

Example 8

A device for optical communication was manufactured in the same manner as in Example 1, except that, in the process corresponding to the process A of Example 1, the optical path converting member and the optical path member were manufactured by using optical glass having a transmittance of 99%/10 mm for light having a wavelength of 850 nm, a refractive index of 1.63 and a softening point temperature of 343° C., at a melting temperature of 550° C., and that, in the process corresponding to the process D (21) of Example 1, an adhesive having a refractive index of 1.42 and a transmittance of 90%/mm was used.

In the device for optical communication manufactured in this example, the difference in refractive index between the adhesive applied in the gap between the optical path converting member and the optical path member, and the optical path converting member was 0.21.

Example 9

A device for optical communication was manufactured in the same manner as in Example 8, except that an adhesive having a refractive index of 1.43 and a transmittance of 90%/mm was used.

In the device for optical communication manufactured in this example, the difference in refractive index between the adhesive applied in the gap between the optical path converting member and the optical path member, and the optical path converting member was 0.20.

Example 10

A device for optical communication was manufactured in the same manner as in Example 8, except that an adhesive having a refractive index of 1.44 and a transmittance of 90%/mm was used.

In the device for optical communication manufactured in this example, the difference in refractive index between the adhesive applied in the gap between the optical path converting member and the optical path member, and the optical path converting member was 0.19.

Example 11

A device for optical communication was manufactured in the same manner as in Example 8, except that an adhesive having a refractive index of 1.45 and a transmittance of 90%/mm was used.

In the device for optical communication manufactured in this example, the difference in refractive index between the adhesive applied in the gap between the optical path converting member and the optical path member, and the optical path converting member was 0.18.

Example 12

A device for optical communication was manufactured in the same manner as in Example 1, except that, in the process corresponding to the process A of Example 1, the optical path converting member and the optical path member were manufactured by using optical glass having a transmittance of 99%/10 mm for light having a wavelength of 850 nm, a refractive index of 1.57 and a softening point temperature of 343° C., at a melting temperature of 550° C., and that, in the process corresponding to the process D (21) of Example 1, an adhesive having a refractive index of 1.40 and a transmittance of 90%/mm was used.

In the device for optical communication manufactured in this example, the difference in refractive index between the adhesive applied in the gap between the optical path converting member and the optical path member, and the optical path converting member was 0.17.

Example 13

A device for optical communication was manufactured in the same manner as in Example 8, except that an adhesive having a refractive index of 1.47 and a transmittance of 90%/mm was used.

In the device for optical communication manufactured in this example, the difference in refractive index between the adhesive applied in the gap between the optical path converting member and the optical path member, and the optical path converting member was 0.16.

Example 14

A device for optical communication was manufactured in the same manner as in Example 1, except that, in the process corresponding to the process A of Example 1, the optical path converting member and the optical path member were manufactured by using optical glass having a transmittance of 99%/10 mm for light having a wavelength of 850 nm, a refractive index of 1.53 and a softening point temperature of 285° C., at a melting temperature of 500° C., and that, in the process corresponding to the process D (21) of Example 1, an adhesive having a refractive index of 1.38 and a transmittance of 90%/mm was used.

In the device for optical communication manufactured in this example, the difference in refractive index between the adhesive applied in the gap between the optical path converting member and the optical path member, and the optical path converting member was 0.15.

Example 15

A device for optical communication was manufactured in the same manner as in Example 12, except that an adhesive having a refractive index of 1.43 and a transmittance of 90%/mm was used.

In the device for optical communication manufactured in this example, the difference in refractive index between the adhesive applied in the gap between the optical path converting member and the optical path member, and the optical path converting member was 0.14.

Example 16

A device for optical communication was manufactured in the same manner as in Example 14, except that an adhesive having a refractive index of 1.40 and a transmittance of 90%/mm was used.

In the device for optical communication manufactured in this example, the difference in refractive index between the adhesive applied in the gap between the optical path converting member and the optical path member, and the optical path converting member was 0.13.

Example 17

A device for optical communication was manufactured in the same manner as in Example 14, except that an adhesive having a refractive index of 1.45 and a transmittance of 90%/mm was used.

In the device for optical communication manufactured in this example, the difference in refractive index between the adhesive applied in the gap between the optical path converting member and the optical path member, and the optical path converting member was 0.08.

Example 18

A. Manufacture of Optical Path Converting Member and Optical Path Member

A resin piece comprising thermosetting epoxy resin having a transmittance of 93%/mm for light having a wavelength of 850 nm, a refractive index of 1.64 and a thermal deformation temperature of 50 to 290° C. was used, and by using a glass element molding machine, an optical path converting member and an optical path member having the shape as in Example 1 were manufactured.

Specifically, the resin piece was heated to 220° C., and pressed by an upper die and a lower die made of SiC (pressure: 17 kN), and cooled to room temperature. Next, the resin piece was taken out of the patterns, and extra portions were ground off so that an optical path converting member and an optical path member were manufactured.

B. Manufacture of Device for Optical Communication

A device for optical communication was manufactured in the same manner as the process D of Example 1, except that the optical path converting member and the optical path member manufactured in the above process A were used, and that an adhesive having a refractive index of 1.38 and a transmittance of 90%/mm was used for fixing them.

Example 19

A. Manufacture of Optical Path Converting Member and Optical Path Member

Thermoplastic acrylic resin having a transmittance of 91%/mm for light having a wavelength of 850 nm, a refractive index of 1.61 and a softening point temperature of 80° C. was used, and by using an injection molding machine, an optical path converting member and an optical path member having the same shape as in Example 1 were manufactured.

Specifically, the acrylic resin was melted at 170° C., and the molten resin was injected at an injection speed of 150 mm/sec into a mold made of SiC which is in a state of an upper die and a lower die joining together, and cooled to room temperature after injection was completed. Next, the resin piece was taken out of the patterns, and extra portions were ground off so that an optical path converting member and an optical path member were manufactured.

B. Manufacture of Device for Optical Communication

A device for optical communication was manufactured in the same manner as the process D of Example 1, except that the optical path converting member and the optical path member manufactured in the above process A were used, and that an adhesive having a refractive index of 1.39 and a transmittance of 90%/mm was used for fixing them.

Example 20

A device for optical communication was manufactured in the same manner as in Example 18, except that an adhesive having a refractive index of 1.43 and a transmittance of 90%/mm was used.

In the device for optical communication manufactured in this example, the difference in refractive index between the adhesive applied in the gap between the optical path converting member and the optical path member, and the optical path converting member was 0.21.

Example 21

A device for optical communication was manufactured in the same manner as in Example 18, except that an adhesive having a refractive index of 1.44 and a transmittance of 90%/mm was used.

In the device for optical communication manufactured in this example, the difference in refractive index between the adhesive applied in the gap between the optical path converting member and the optical path member, and the optical path converting member was 0.20.

Example 22

A device for optical communication was manufactured in the same manner as in Example 18, except that an adhesive having a refractive index of 1.45 and a transmittance of 90%/mm was used.

In the device for optical communication manufactured in this example, the difference in refractive index between the adhesive applied in the gap between the optical path converting member and the optical path member, and the optical path converting member was 0.19.

Example 23

A. Manufacture of Optical Path Converting Member and Optical Path Member

A resin piece comprising thermosetting epoxy resin having a transmittance of 93%/mm for light having a wavelength of 850 nm, a refractive index of 1.57 and a thermal deformation temperature of 50 to 290° C. was used, and by using a glass element molding machine, an optical path converting member and an optical path member having the shape as in Example 1 were manufactured.

Specifically, the resin piece was heated to 220° C., and pressed by an upper die and a lower die made of SiC (pressure: 17 kN), and cooled to room temperature. Next, the resin piece was taken out of the patterns, and extra portions were ground off so that an optical path converting member and an optical path member were manufactured.

B. Manufacture of Device for Optical Communication

A device for optical communication was manufactured in the same manner as the process D of Example 1, except that the optical path converting member and the optical path member manufactured in the above process A were used, and that an adhesive having a refractive index of 1.39 and a transmittance of 90%/mm was used for fixing them.

Example 24

A device for optical communication was manufactured in the same manner as in Example 19, except that an adhesive having a refractive index of 1.44 and a transmittance of 90%/mm was used.

In the device for optical communication manufactured in this example, the difference in refractive index between the adhesive applied in the gap between the optical path converting member and the optical path member, and the optical path converting member was 0.17.

Example 25

A device for optical communication was manufactured in the same manner as in Example 23, except that an adhesive having a refractive index of 1.40 and a transmittance of 90%/mm was used.

In the device for optical communication manufactured in this example, the difference in refractive index between the adhesive applied in the gap between the optical path converting member and the optical path member, and the optical path converting member was 0.17.

Example 26

A device for optical communication was manufactured in the same manner as in Example 23, except that an adhesive having a refractive index of 1.41 and a transmittance of 90%/mm was used.

In the device for optical communication manufactured in this example, the difference in refractive index between the adhesive applied in the gap between the optical path converting member and the optical path member, and the optical path converting member was 0.16.

Example 27

A device for optical communication was manufactured in the same manner as in Example 23, except that an adhesive having a refractive index of 1.42 and a transmittance of 90%/mm was used.

In the device for optical communication manufactured in this example, the difference in refractive index between the adhesive applied in the gap between the optical path converting member and the optical path member, and the optical path converting member was 0.15.

Example 28

A device for optical communication was manufactured in the same manner as in Example 23, except that an adhesive having a refractive index of 1.43 and a transmittance of 90%/mm was used.

In the device for optical communication manufactured in this example, the difference in refractive index between the adhesive applied in the gap between the optical path converting member and the optical path member, and the optical path converting member was 0.14.

Example 29

A device for optical communication was manufactured in the same manner as in Example 23, except that an adhesive having a refractive index of 1.44 and a transmittance of 90%/mm was used.

In the device for optical communication manufactured in this example, the difference in refractive index between the adhesive applied in the gap between the optical path converting member and the optical path member, and the optical path converting member was 0.13.

Example 30

A. Manufacture of Optical Path Converting Member and Optical Path Member

A resin piece comprising thermosetting epoxy resin having a transmittance of 93%/mm for light having a wavelength of 850 nm, a refractive index of 1.52 and a thermal deformation temperature of 50 to 290° C. was used, and by using a glass element molding machine, an optical path converting member and an optical path member having the shape as in Example 1 were manufactured.

Specifically, the resin piece was heated to 220° C., and pressed by an upper die and a lower die made of SiC (pressure: 17 kN), and cooled to room temperature. Next, the resin piece was taken out of the patterns, and extra portions were ground off so that an optical path converting member and an optical path member were manufactured.

B. Manufacture of Device for Optical Communication

A device for optical communication was manufactured in the same manner as the process D of Example 1, except that the optical path converting member and the optical path member manufactured in the above process A were used, and that an adhesive having a refractive index of 1.40 and a transmittance of 90%/mm was used for fixing them.

Example 31

A device for optical communication was manufactured in the same manner as in Example 30, except that an adhesive having a refractive index of 1.45 and a transmittance of 90%/mm was used.

In the device for optical communication manufactured in this example, the difference in refractive index between the adhesive applied in the gap between the optical path converting member and the optical path member, and the optical path converting member was 0.07.

Example 32

A. Manufacture of Optical Path Converting Member

Using optical glass having a transmittance of 99%/10 mm for light having a wavelength of 850 nm, a refractive index of 1.63 and a softening point temperature of 343° C., an optical path converting member was manufactured by an injection molding machine.

Specifically, the optical glass was melted at 550° C., and the molten glass was injected at an injection speed of 100 mm/sec into a mold made of SiC which is in a state of an upper die and a lower die joining together, and cooled to room temperature after injection was completed. The optical glass was taken out of the patterns, extra portions were ground off so that an optical path converting member was manufactured (see FIG. 8).

B. Manufacture of Resin Film for Insulating Layer

A resin film for insulating layer was manufactured in the same manner as in Example 1.

C. Manufacture of Resin Composition for Filling Through Holes

A resin composition for filling through holes was manufactured in the same manner as in Example 1.

Figure 19A:
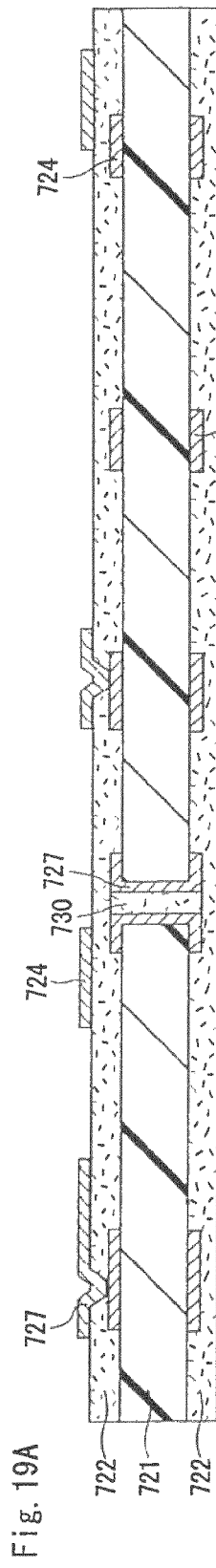
FIGS. 19A to 19C are cross-sectional views schematically showing a part of the method for manufacturing a multilayer print circuit board according to one embodiment of the present invention.

D. Manufacture of Device for Optical Communication (1) Using a copper pasted multilayer plate where copper foil having a thickness of 18 μm is laminated on both sides of an insulating substrate 721 made of a glass epoxy resin or a BT (bismaleimide triazine) resin having a thickness of 0.4 mm was used as a starting material, a conductor circuit 724 and an insulating layer 722 were formed and laminated on both sides of the substrate in the same manner as in the processes (1) to (13) of Example 1 (see FIG. 19A). Here, on one side of the substrate (upper side in the drawings), two layers of conductor circuits were formed, and on the other side (lower side in the drawings), one layer of a conductor circuit was formed.

Figure 19B:
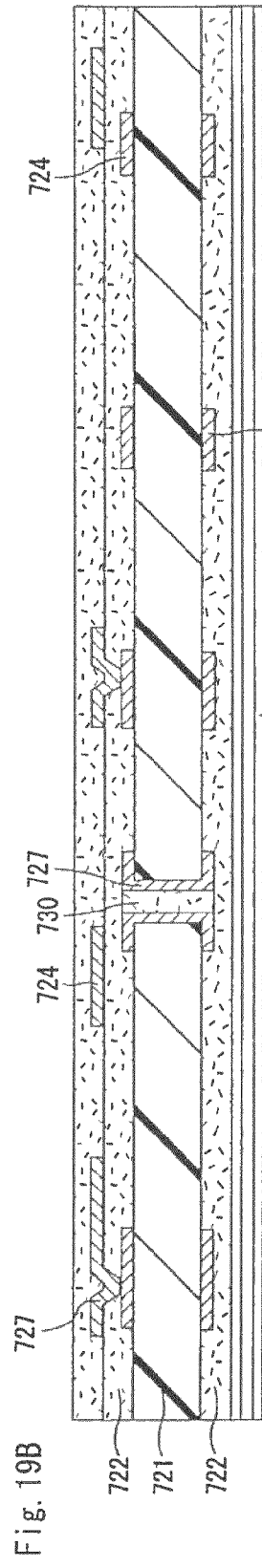

(2) An optical waveguide 750 was formed on the insulating layer on one side (lower side in the drawings), and further an insulating layer 722 was formed on the other side. Here, the optical waveguide was formed in the same manner as in the process (15) of Example 1 (see FIG. 19B).

Figure 19C:
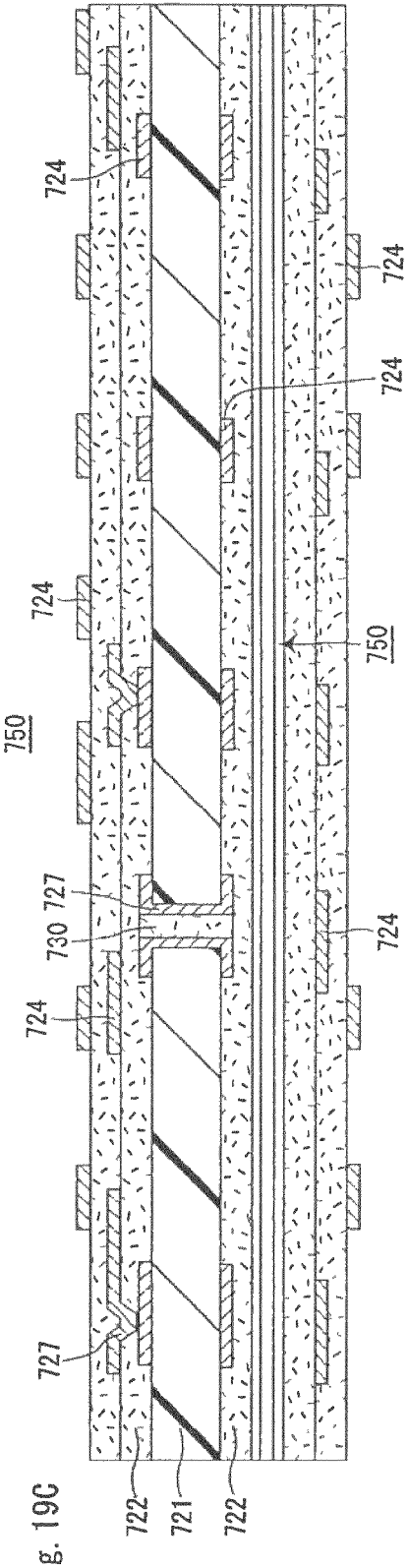

(3) Next, by repeating the same processes as the processes (6) to (13) of Example 1, the insulating layer 722 and the conductor circuit 724 (including non-penetrating via hole 727) were formed and laminated, and in the same manner as in the process (2) in Example 1, a rough surface was formed on the surface of the conductor circuit (see FIG. 19C).

(4) In the same manner as in the processes (17), (18) of Example 1, a solder resist layer 734 was formed, and further in the same manner as in the process (19) of example 1, a solder pad 741 was formed (see FIG. 20A).

(5) After that, a bottomed hole for an optical path 731 which penetrates through the substrate 721, the insulating layers 722 and the solder resist layer 734 (the form in a plan view was a rectangle with rounded corners (220 μm in length×1200 μm in width)) was formed through a drilling process, and furthermore, a desmear process was carried out on the wall surface of the bottomed hole for an optical path 731 (see FIG. 20B). In this case, the bottomed hole for an optical path 731 having a collective through hole structure was formed.

(6) Next, while performing positioning, the optical path converting member 736 was installed in the bottomed hole for an optical path 731 by using a suction jig, and then temporarily fixed by applying a UV curing type epoxy resin adhesive (refractive index 1.42, transmittance 90%/mm) on its periphery and irradiating UV light.

Positioning was performed in each bottomed hole for an optical path (a bottomed hole for an optical path on the side where the VCSEL is mounted in a later process, and a bottomed hole for an optical path on the side where PD is mounted).

Further, the entire bottomed hole for an optical path 731 was filled in with the epoxy resin adhesive, and heated for 1 hour at 150° C. so that the adhesive was completely cured (see FIG. 21A).

(7) Lastly, in the same manner as the process (22) of Example 1, a solder bump was formed, and also VCSEL and PD were mounted so that a device for optical communication was obtained (see FIG. 21B).

Here, the thickness of the whole multilayer print circuit board was 0.6 mm, and the distance from the surface side mounting the optical element of the multilayer print circuit board to the core was 0.4 mm.

Example 33

A device for optical communication was manufactured in the same manner as in Example 32, except that, in the process corresponding to the process A of Example 32, the optical path converting member in the same shape as shown in FIG. 8 was manufactured by the same method as in Example 18, and that, in the process corresponding to the process D (6) of Example 32, an adhesive having a refractive index of 1.43 and a transmittance of 90%/mm was used.

In the device for optical communication manufactured in this example, the difference in refractive index between the adhesive applied in the gap between the optical path converting member and the optical path member, and the optical path converting member was 0.21.

Example 34

An optical path converting member 550 having a shape as shown in FIGS. 3F-1 and 3F-2 was manufactured in the same manner as in the process A of Example 32.

Thereafter, a device for optical communication was manufactured in the same manner as in Example 8, except that the optical path converting member 550 was mounted.

For mounting the optical path converting member 550, a thorough hole for an optical path penetrating entirely through the substrate, the insulating layer, and the solder resist layer was formed in advance, and the optical path converting member 550 was installed in this through hole for an optical path.

Here, when the length of a mounting member is set to the predetermined length upon manufacturing, the optical path converting member having a flange member as used in this Example can be easily disposed at a predetermined position only by aligning in the XY direction, without positioning in the Z-axis direction when disposing.

Example 35

A device for optical communication was manufactured in the same manner as in Example 34, except that the optical path converting member 550 having a shape as shown in FIGS. 3F-1 and 3F-2 was manufactured by the same method as in Example 18, and that an adhesive having a refractive index of 1.43 and a transmittance of 90%/mm was used as an adhesive for fixing this optical path converting member.

Example 36

An optical path converting member 560 having a shape as shown in FIGS. 1-3G-1 and 1-3G-2 was manufactured in the same manner as in the process A of Example 32.

Here, the diameter of the guide hole was set to 0.7 mm.

Thereafter, a device for optical communication was manufactured in the same manner as in Example 8, except that the optical path converting member 560 was mounted.

For mounting the optical path converting member 560, a thorough hole for an optical path penetrating entirely through the substrate, the insulating layer, and the solder resist layer was formed in advance, and the optical path converting member 560 was installed in this through hole for an optical path. Moreover, upon forming the through hole for an optical path, a guide hole on the substrate side was also formed.

In the case where the optical path converting member can be mounted with a guide pin as in this Example, the optical path converting member can be disposed at a predetermined position by passive alignment.

Example 37

A device for optical communication was manufactured in the same manner as in Example 36, except that the optical path converting member 560 having a shape as shown in FIGS. 3G-1 and 3G-2 was manufactured by the same method as in Example 18, and that an adhesive having a refractive index of 1.43 and a transmittance of 90%/mm was used as an adhesive for fixing this optical path converting member.

Example 38

A device for optical communication was manufactured in the same manner as in Example 8, except that a package substrate mounting a VCSEL and a package substrate mounting a PD were used instead of the VCSEL and the PD.

The package substrate used here was a package substrate 1220 in which a conductor circuit 1224 and an insulating layer 1722 were laminated on both sides of the substrate 1221 shown in FIG. 9; a solder resist layer 1234 was formed as the outermost layer; and an optical path for transmitting an optical signal 1242 penetrating through the substrate, the insulating layer, and the solder resist layer was formed.

Example 39

A device for optical communication was manufactured in the same manner as in Example 20, except that a package substrate mounting a VCSEL and a package substrate mounting a PD were used instead of the VCSEL and the PD.

The package substrate used here was a package substrate 1220 in which a conductor circuit 1224 and an insulating layer 1722 were laminated on both sides of the substrate 1221 shown in FIG. 9; a solder resist layer 1234 was formed as the outermost layer; and an optical path for transmitting an optical signal 1242 penetrating through the substrate, the insulating layer, and the solder resist layer was formed.

Example 40

A device for optical communication was manufactured in the same manner as in Example 8, except that a package substrate mounting a VCSEL and a package substrate mounting a PD were used instead of the VCSEL and the PD.

The package substrate used here was a package substrate 1120 in which a conductor circuit 1124 and an insulating layer 1122 were laminated on both sides of the substrate 1221 shown in FIG. 9; a solder resist layer 1134 was formed as the outermost layer; and an optical path for transmitting an optical signal 1142 having a concave shape is formed in part of the insulating layer and the solder resist layer.

Example 41

A device for optical communication was manufactured in the same manner as in Example 20, except that a package substrate mounting a VCSEL and a package substrate mounting a PD were used instead of the VCSEL and the PD.

The package substrate used here was a package substrate 1120 in which a conductor circuit 1124 and an insulating layer 1122 were laminated on both sides of the substrate 1221 shown in FIG. 9; a solder resist layer 1134 was formed as the outermost layer; and an optical path for transmitting an optical signal 1142 having a concave shape is formed in part of the insulating layer and the solder resist layer.

In each of the devices for optical communication in Examples 1 to 41, the transmission distance of an optical signal between the VCSEL and the PD was designed to be set to 10, 20, 30, 40, and 50 cm, and three samples of each transmission distance were manufactured.

In these devices for optical communication, a signal of pulse generator was input to a test connector provided in the device for optical communication, a driver IC was driven, and the signal was electro-optically converted by the VCSEL, and then the optical signal was transferred to the PD through the optical path for transmitting an optical signal (optical path member and optical path converting member), the optical waveguide, and the optical path for transmitting an optical signal (optical path converting member and optical path member) so that the signal was photo-electrically converted in the PD, and the electrical signal was amplified by an amplifier IC, and thereafter the waveform of the signal output via the test connector was checked by an oscilloscope.

Here, the waveform output at a propagation speed of 2.5 Gbps was tested by mask inspection of the eye pattern, and the signal transmission capability was judged by checking whether the transmission was normal or not.

The specific design of each device for optical communication (dimensions necessary for transmitting signals such as thickness of substrate and insulating layer, dimensions of optical path for transmitting an optical signal, optical path converting member and optical path member, size of lens provided in the optical path converting member, radius of curvature, and the like) was determined to be the optimum values in each example by carrying out simulations using a ray tracing method.

The results are as shown in Table 1 and Table 2.

TABLE 1

| | Material of optical path converting member, etc. | Refractive index of optical path converting member, etc. | Refractive index of adhesive | Refractive index difference | Refractive index ratio of optical path converting member and adhesive | Optical signal transmission distance | | | | |
|---|---|---|---|---|---|---|---|---|---|---|
| | | | | | | 10 cm | 20 cm | 30 cm | 40 cm | 50 cm |
| Example 1 | glass | 1.89 | 1.43 | 0.46 | 1.322 | ○ | ○ | ○ | ○ | ○ |
| Example 2 | glass | 1.89 | 1.43 | 0.46 | 1.322 | ○ | ○ | ○ | ○ | ○ |
| Example 3 | glass | 1.89 | 1.00 | 0.89 | 1.890 | ○ | ○ | ○ | ○ | ○ |
| Example 4 | glass | 1.63 | 1.00 | 0.63 | 1.630 | ○ | ○ | ○ | ○ | ○ |
| Example 5 | glass | 1.89 | 1.38 | 0.51 | 1.370 | ○ | ○ | ○ | ○ | ○ |
| Example 6 | glass | 1.89 | 1.44 | 0.45 | 1.313 | ○ | ○ | ○ | ○ | ○ |
| Example 7 | glass | 1.89 | 1.57 | 0.32 | 1.204 | ○ | ○ | ○ | ○ | ○ |
| Example 8 | glass | 1.63 | 1.42 | 0.21 | 1.148 | ○ | ○ | ○ | ○ | ○ |
| Example 9 | glass | 1.63 | 1.43 | 0.20 | 1.140 | ○ | ○ | ○ | ○ | ○ |
| Example 10 | glass | 1.63 | 1.44 | 0.19 | 1.132 | ○ | ○ | ○ | Δ | x |
| Example 11 | glass | 1.63 | 1.45 | 0.18 | 1.124 | ○ | ○ | ○ | x | x |
| Example 12 | glass | 1.57 | 1.40 | 0.17 | 1.121 | ○ | ○ | ○ | x | x |
| Example 13 | glass | 1.63 | 1.47 | 0.16 | 1.109 | ○ | ○ | ○ | x | x |
| Example 14 | glass | 1.53 | 1.38 | 0.15 | 1.109 | ○ | ○ | ○ | x | x |
| Example 15 | glass | 1.57 | 1.43 | 0.14 | 1.098 | ○ | ○ | Δ | x | x |
| Example 16 | glass | 1.53 | 1.40 | 0.13 | 1.093 | ○ | Δ | x | x | x |
| Example 17 | glass | 1.53 | 1.45 | 0.08 | 1.055 | Δ | x | x | x | x |
| Example 18 | epoxy resin | 1.64 | 1.38 | 0.26 | 1.188 | ○ | ○ | ○ | ○ | ○ |
| Example 19 | acrylic resin | 1.61 | 1.39 | 0.22 | 1.158 | ○ | ○ | ○ | ○ | ○ |
| Example 20 | epoxy resin | 1.64 | 1.43 | 0.21 | 1.147 | ○ | ○ | ○ | ○ | ○ |
| Example 21 | epoxy resin | 1.64 | 1.44 | 0.20 | 1.139 | ○ | ○ | ○ | ○ | ○ |
| Example 22 | epoxy resin | 1.64 | 1.45 | 0.19 | 1.131 | ○ | ○ | ○ | Δ | x |
| Example 23 | epoxy resin | 1.57 | 1.39 | 0.18 | 1.129 | ○ | ○ | ○ | x | x |
| Example 24 | acrylic resin | 1.61 | 1.44 | 0.17 | 1.118 | ○ | ○ | ○ | x | x |
| Example 25 | epoxy resin | 1.57 | 1.40 | 0.17 | 1.121 | ○ | ○ | ○ | x | x |
| Example 26 | epoxy resin | 1.57 | 1.41 | 0.16 | 1.113 | ○ | ○ | ○ | x | x |
| Example 27 | epoxy resin | 1.57 | 1.42 | 0.15 | 1.106 | ○ | ○ | ○ | Δ | x |
| Example 28 | epoxy resin | 1.57 | 1.43 | 0.14 | 1.098 | ○ | ○ | Δ | x | x |
| Example 29 | epoxy resin | 1.57 | 1.44 | 0.13 | 1.090 | Δ | Δ | x | x | x |
| Example 30 | epoxy resin | 1.52 | 1.40 | 0.12 | 1.086 | ○ | Δ | x | x | x |
| Example 31 | epoxy resin | 1.52 | 1.45 | 0.07 | 1.048 | Δ | x | x | x | x |

TABLE 2

| | Material of optical path converting member, etc. | Refractive index of optical path converting member, etc. | Refractive index of adhesive | Refractive index difference | Refractive index ratio of optical path converting member and adhesive | Optical signal transmission distance | | | | |
|---|---|---|---|---|---|---|---|---|---|---|
| | | | | | | 10 cm | 20 cm | 30 cm | 40 cm | 50 cm |
| Example 32 | glass | 1.63 | 1.42 | 0.21 | 1.148 | ○ | ○ | ○ | ○ | ○ |
| Example 33 | epoxy resin | 1.64 | 1.43 | 0.21 | 1.147 | ○ | ○ | ○ | ○ | ○ |
| Example 34 | glass | 1.63 | 1.42 | 0.21 | 1.148 | ○ | ○ | ○ | ○ | ○ |
| Example 35 | epoxy resin | 1.64 | 1.43 | 0.21 | 1.147 | ○ | ○ | ○ | ○ | ○ |
| Example 36 | glass | 1.63 | 1.42 | 0.21 | 1.148 | ○ | ○ | ○ | ○ | ○ |
| Example 37 | epoxy resin | 1.64 | 1.43 | 0.21 | 1.147 | ○ | ○ | ○ | ○ | ○ |

TABLE 2-continued

|  | Material of optical path converting member, etc. | Refractive index of optical path converting member, etc. | Refractive index of adhesive | Refractive index difference | Refractive index ratio of optical path converting member and adhesive | Optical signal transmission distance | | | | |
| --- | --- | --- | --- | --- | --- | --- | --- | --- | --- | --- |
|  |  |  |  |  |  | 10 cm | 20 cm | 30 cm | 40 cm | 50 cm |
| Example 38 | glass | 1.63 | 1.42 | 0.21 | 1.148 | ○ | ○ | ○ | ○ | ○ |
| Example 39 | epoxy resin | 1.64 | 1.43 | 0.21 | 1.147 | ○ | ○ | ○ | ○ | ○ |
| Example 40 | glass | 1.63 | 1.42 | 0.21 | 1.148 | ○ | ○ | ○ | ○ | ○ |
| Example 41 | epoxy resin | 1.64 | 1.43 | 0.21 | 1.147 | ○ | ○ | ○ | ○ | ○ |

In the evaluation of transmission capability of an optical signal shown in Table 1 and Table 2, "○" means that an optical signal could be transferred in all samples, "Δ" means that an optical signal could not be transferred in some of the samples, and "x" means that an optical signal could be transferred in none of the samples.

As clear from the results in Table 1 and Table 2, it is presumed that, regardless of whether the optical path converting member is a glass material or a resin material, as long as the refractive index ratio is 1.06 or more, an optical signal can be transferred even if the transmission distance between the light emitting element and the light receiving element is 10 cm or more, and when the refractive index ratio is 1.10 (refractive index difference of about 0.15) or more, an optical signal can be transferred even if the transmission distance between the light emitting device and the light receiving device is 20 cm or more, or when the refractive index difference is 1.14 (refractive index difference of about 0.2) or more, an optical signal can be transferred even if the transmission distance between the light emitting device and the light receiving device is 40 cm or more.

Based on those results, it can be presumed that, even if the transmission speed is faster (for example, 5 Gbps or 10 Gbps), or the transmission distance of the optical waveguide is longer (for example, 100 cm), it is possible to perform optical transmission as long as the refractive index ratio is 1.14 or more.

Moreover, in Example 1, when an optical path converting member of integral type as shown in FIGS. 5J-1 and 5J-2 was used as the optical path converting member in place of the optical path converting member and the optical path member, the same results can presumably be obtained about the transmission capability of an optical signal.

Example 42

A multilayer print circuit board was manufactured in the same manner as in Example 32, except that the optical path converting member was manufactured in the same method as process A of Example 32; the through hole for an optical path penetrating entirely through the substrate, the insulating layer and the solder resist layer was formed in the process D (5) of Example 32; and the optical path converting member was adhered by using the following adhesive in the process (6). The optical element was not mounted.

The adhesive for fixing the optical path converting member used here was an epoxy resin (refractive index: 1.55, 850 nm light transmittance: 90%/mm, CTE: 72 ppm), with the viscosity adjusted to 200 to 1000 cps, and the adhesive was applied inside the through hole for an optical path by using a syringe, and after mounting the optical path converting member, this was fixed by curing the adhesive in the condition of 120° C. for 1 hour and 150° C. for 2 hours.

After curing, the adhesive projecting from the through hole for an optical path was ground with #3000 abrasive paper, and was further ground with alumina particles of 0.05 μm so that the end portion of the optical path for transmitting an optical signal was flattened.

The CTE of the optical path converting member disposed in this example was 12 ppm.

Examples 43 to 47

A multilayer print circuit board was manufactured in the same manner as in Example 42, except that the adhesive was prepared by blending spherical silica particles of a particle size distribution of 0.2 to 0.6 μm (mixture of SO-E1 (particle size distribution of 0.2 to 0.4 μm) and SO-E2 (particle size distribution of 0.4 to 0.6 μm) manufactured by Admatechs Co., Ltd.) by 5, 10, 20, 50, and 60% by weight. The CTE of each adhesive is as shown in Table 3.

Example 48

A multilayer print circuit board was manufactured in the same manner as in Example 42, except that pulverized silica particles of a particle size distribution of 1 to 20 μm were mixed to the adhesive by 20% by weight. The CTE of the adhesive is as shown in Table 3.

Example 49

In Example 42, aside from the adhesive prepared in Example 42, another adhesive in which pulverized silica particles of a particle size distribution of 1 to 20 μm were mixed to the adhesive by 40% by weight was prepared.

A multilayer print circuit board was manufactured in the same manner as in Example 42, except that the region of location of the lens and the reflection surface of the optical path converting member of the through hole for an optical path was filled in with an adhesive not containing the particles prepared in Example 42, and that the other region (including side surface of optical path converting member) was filled in with an adhesive containing the particles mentioned above. The CTE of each adhesive is as shown in Table 3.

Example 50

A multilayer print circuit board was manufactured in the same manner as in Example 42, except that the optical path converting member was manufactured in the following method.

The optical path converting member was manufactured in the same method as process A of Example 18, by using thermosetting epoxy resin having a transmittance 93%/mm for light having a wavelength of 850 nm, a refractive index of 1.61, and a thermal deformation temperature of 50 to 290° C. The CTE of this optical path converting member was 72 ppm.

Examples 51 to 55

A multilayer print circuit board was manufactured in the same manner as in Example 50, except that, in the Example 42, the adhesive was prepared by blending spherical silica particles of a particle size distribution of 0.2 to 0.6 μm (mixture of SO-E1 (particle size distribution of 0.2 to 0.4 μm) and SO-E2 (particle size distribution of 0.4 to 0.6 μm) manufactured by Admatechs Co., Ltd.) by 5, 10, 20, 50, and 60% by weight. The CTE of each adhesive is as shown in Table 3.

In the multilayer print circuit boards manufactured in Examples 42 to 55, the filling property of the adhesive, and presence or absence of cracks in the adhesive after temperature cycle test were observed, and the results are shown in Table 3.

Observation of the filling property of the adhesive was performed by cross-cutting the multilayer print circuit board and microscopically observing the cut section.

Presence or absence of cracks was evaluated by repeating a cycle of temperature cycle test of 3 minutes at −55° C. and 3 minutes at 125° C. for 250 cycles, 500 cycles and 1000 cycles, cross-cutting the multilayer print circuit board after finishing each cycle, and microscopically observing the cut section.

Here, three samples were used for each evaluation. When an unfilled portion or a crack was observed even in one sample, the evaluation was judged as "x."

TABLE 3

| | Blending ratio of particles (% by weight) | Transmittance of adhesive (%/mm) | CTE (ppm) | Filling property of adhesive | Presence of cracks | | |
|---|---|---|---|---|---|---|---|
| | | | | | 250 cycle | 500 cycle | 1000 cycle |
| Example 42 | 0 | 90 | 72 | ○ | ○ | x | x |
| Example 43 | 5 | 84 | 63 | ○ | ○ | x | x |
| Example 44 | 10 | 82 | 56 | ○ | ○ | ○ | ○ |
| Example 45 | 20 | 82 | 48 | ○ | ○ | ○ | ○ |
| Example 46 | 50 | 81 | 41 | ○ | ○ | ○ | ○ |
| Example 47 | 60 | 78 | 35 | x | ○ | ○ | ○ |
| Example 48 | 20 | 61 | 47 | ○ | ○ | ○ | ○ |
| Example 49 | 40 | 10 or less | 44 | ○ | ○ | ○ | ○ |
| Example 50 | 0 | 90 | 72 | ○ | x | x | x |
| Example 51 | 5 | 84 | 63 | ○ | x | x | x |
| Example 52 | 10 | 82 | 56 | ○ | ○ | ○ | ○ |
| Example 53 | 20 | 82 | 48 | ○ | ○ | ○ | ○ |
| Example 54 | 50 | 81 | 41 | ○ | ○ | ○ | ○ |
| Example 55 | 60 | 78 | 35 | x | ○ | ○ | ○ |

(Note)
Properties of the adhesive in Example 49 are the properties of an adhesive containing particles.

As clearly shown by the results in Table 3, when particles were mixed to the adhesive by 10 to 50% by weight (CTE 35 to 56 ppm), favorable results were obtained in filling property and crack resistance. This is presumably because the CTE with other component members of the multilayer print circuit board (substrate and optical path converting member) was 50 ppm or less.

It is presumed that, when the optical path converting member comprises a resin material (Examples 50 to 55), by using an adhesive of which CTE is about middle of the optical path converting member and the substrate, favorable results may be obtained.

What is claimed is:

1. A multilayer print circuit board comprising:
an insulating layer;
a conductor circuit layer formed on the insulating layer;
an optical path configured to transmit an optical signal and formed through the insulating layer and the conductor circuit layer;
an optical circuit configured to transmit the optical signal; and
an optical path converting member disposed in said optical path and comprising a lens and an optical path conversion mirror having an entrance surface, an exit surface and a reflection surface,
wherein said lens of the optical path converting member is provided at one of the entrance surface and the exit surface of the optical path conversion mirror, and said lens of the optical path converting member is facing said optical circuit.

2. The multilayer print circuit board according to claim 1, wherein said lens and said optical path conversion mirror are formed integrally.

3. The multilayer print circuit board according to claim 1, wherein a metal deposition layer is formed on said reflection surface.

4. The multilayer print circuit board according to claim 1, further comprising a flange member disposed at said optical path converting member.

5. The multilayer print circuit board according to claim 1, wherein said optical path converting member comprises a glass material, said optical path comprises an adhesive, and a ratio of a refractive index of said optical path converting member and a refractive index of said adhesive is at least about 1.10 and at most about 1.35.

6. The multilayer print circuit board according to claim 1, wherein said optical path converting member comprises a resin material, said optical path comprises an adhesive, and a ratio of a refractive index of said optical path converting member and a refractive index of said adhesive is at least about 1.10 and at most about 1.18.

7. The multilayer print circuit board according to claim 1, wherein the transmittance for light having a communication wavelength of said lens and said optical path conversion mirror is about 60%/mm or more.

8. The multilayer print circuit board according to claim 1, wherein particles are mixed in said lens and said optical path conversion mirror.

9. The multilayer print circuit board according to claim 8, wherein the diameter of said particles is shorter than a communication wavelength, or at least about 0.01 μm and at most about 0.8 μm.

10. The multilayer print circuit board according to claim 8, wherein the content of said particles is at least about 5% by weight and at most about 60% by weight.

11. The multilayer print circuit board according to claim 1, wherein a refractive index of said lens and a refractive index of said optical path conversion mirror are almost the same.

12. The multilayer print circuit board according to claim 1, wherein said optical path converting member is fixed to said optical path with an adhesive.

13. The multilayer print circuit board according to claim 12, wherein said adhesive contains a resin having a thermosetting property and a photosensitivity as a resin composition.

14. The multilayer print circuit board according to claim 12, wherein particles are mixed in said adhesive.

15. The multilayer print circuit board according to claim 14, wherein a particle diameter of said particles is shorter than a communication wavelength, or at least about 0.2 μm and at most about 50 μm.

16. The multilayer print circuit board according to claim 14, wherein the content of said particles is at least about 10% by weight and at most about 50% by weight.

17. The multilayer print circuit board according to claim 1, wherein said optical path converting member has a surface treated with application of a coupling agent or a plasma treatment.

18. The multilayer print circuit board according to claim 1, wherein said optical path is formed so as to penetrate completely through the multilayer print circuit board.

19. The multilayer print circuit board according to claim 1, wherein said optical path is formed so as not to penetrate through the multilayer print circuit board.

20. The multilayer print circuit board according to claim 1, wherein said optical path has a collective through hole structure or a individual through hole structure.

21. The multilayer print circuit board according to claim 1, wherein said optical circuit is an optical waveguide or an optical fiber sheet.

* * * * *